(12) United States Patent
Molnar

(10) Patent No.: US 8,357,286 B1
(45) Date of Patent: Jan. 22, 2013

(54) VERSATILE WORKPIECE REFINING

(75) Inventor: Charles J. Molnar, Wilmington, DE (US)

(73) Assignee: SemCon Tech, LLC, Tyler, TX (US)

( * ) Notice: Subject to any disclaimer, the term of this patent is extended or adjusted under 35 U.S.C. 154(b) by 1140 days.

(21) Appl. No.: 11/978,346

(22) Filed: Oct. 29, 2007

(51) Int. Cl.
*C25F 3/15* (2006.01)

(52) U.S. Cl. ......... 205/641; 204/228.1; 205/82; 216/84; 438/690; 451/5

(58) Field of Classification Search ............... 204/228.1; 205/82, 641; 216/84; 438/690; 451/5
See application file for complete search history.

(56) References Cited

U.S. PATENT DOCUMENTS

| | | | |
|---|---|---|---|
| 4,421,068 A | 12/1983 | Aral | 122/448 |
| 4,544,375 A | 10/1985 | Rehmat et al. | 48/197 |
| 5,023,045 A | 6/1991 | Watnabe et al. | 376/215 |
| 5,486,995 A | 1/1996 | Krist et al. | 364/149 |
| 5,521,814 A | 5/1996 | Teran et al. | 364/402 |
| 5,537,325 A | 7/1996 | Iwakiri et al. | 364/468.28 |
| 5,609,511 A | 3/1997 | Moriyama | 451/5 |
| 5,667,629 A | 9/1997 | Pan et al. | 438/13 |
| 5,682,309 A | 10/1997 | Bartusiak et al. | 700/29 |
| 5,691,895 A | 11/1997 | Kurtzberg et al. | 364/148 |
| 5,695,660 A | 12/1997 | Litvak | 216/85 |
| 5,740,033 A | 4/1998 | Wassick et al. | 364/149 |
| 5,774,633 A | 6/1998 | Baba et al. | 395/23 |
| 5,799,286 A | 8/1998 | Morgan et al. | 705/30 |
| 5,954,997 A | 9/1999 | Kaufman | 252/79.1 |
| 5,972,793 A | 10/1999 | Tseng | 438/692 |
| 5,987,398 A | 11/1999 | Halverson et al. | 702/179 |
| 6,038,540 A | 3/2000 | Krist et al. | 705/8 |
| 6,056,781 A | 5/2000 | Wassick et al. | 703/12 |
| 6,089,965 A | 7/2000 | Otawa et al. | |
| 6,128,540 A | 10/2000 | Van Der Vegt et al. | 700/36 |
| 6,157,916 A | 12/2000 | Hoffman | 705/8 |
| 6,167,360 A | 12/2000 | Erickson | 703/6 |
| 6,197,604 B1 | 3/2001 | Miller | 438/14 |
| 6,263,255 B1 | 7/2001 | Tan et al. | 700/121 |
| 6,268,641 B1 | 7/2001 | Yano et al. | 257/620 |
| 6,298,470 B1 | 10/2001 | Breiner et al. | 716/4 |
| 6,363,294 B1 | 3/2002 | Coronel et al. | 700/121 |
| 6,364,747 B1 | 4/2002 | Gagliardi | |
| 6,390,890 B1 | 5/2002 | Molnar | 451/41 |
| 6,408,227 B1 | 6/2002 | Singhvi et al. | 700/266 |
| 6,428,388 B2 | 8/2002 | Molnar | 451/8 |

(Continued)

OTHER PUBLICATIONS

"Understanding and Using Cost of Ownership", Wright Williams & Kelly, Dublin, CA, rev 0595-1.

(Continued)

*Primary Examiner* — Nicholas A. Smith
(74) *Attorney, Agent, or Firm* — Tarek N. Fahmi

(57) ABSTRACT

Versatile methods of refining a first and a second layer of a workpiece are discussed. New refining methods and refining apparatus are disclosed. The new refining methods can help improve yield and appreciably change the cost of manufacture for refining of workpieces. The methods can be applied to workpieces having extremely close tolerances such as semiconductor wafers. New methods of control are also discussed. Methods use controllers, processors, computers, and processor readable memory devices are discussed. Use of stored information is to make changes in process control are discussed. Use of process models are discussed for refining. Determining a changed process control with stored information from first and second layers of a workpiece is disclosed. A changed process control can make an appreciable changes to the cost of manufacture of a workpiece.

25 Claims, 27 Drawing Sheets

U.S. PATENT DOCUMENTS

| | | | |
|---|---|---|---|
| 6,435,948 B1 | 8/2002 | Molnar | 451/41 |
| 6,526,547 B2 | 2/2003 | Breiner et al. | 716/4 |
| 6,551,933 B1 | 4/2003 | Molnar | 438/690 |
| 6,567,718 B1 | 5/2003 | Campbell | 700/121 |
| 6,568,989 B1 | 5/2003 | Molnar | 451/5 |
| 6,709,981 B2 | 3/2004 | Grabbe et al. | |
| 6,719,615 B1 | 4/2004 | Molnar | 451/41 |
| 6,739,947 B1 | 5/2004 | Molnar | 451/8 |
| 6,834,212 B1 | 12/2004 | Patel et al. | 700/121 |
| 6,847,854 B2 | 1/2005 | Discenzo | 700/99 |
| 6,904,328 B2 | 6/2005 | Rietman et al. | 700/97 |
| 6,970,857 B2 | 11/2005 | Card et al. | 706/19 |
| 6,986,698 B1 | 1/2006 | Molnar | 451/5 |
| 7,008,300 B1 | 3/2006 | Molnar | 451/41 |
| 7,020,569 B2 | 3/2006 | Cao et al. | 702/108 |
| 7,037,172 B1 | 5/2006 | Molnar | 451/5 |
| 7,040,966 B2 | 5/2006 | Salfelder et al. | |
| 7,050,863 B2 | 5/2006 | Mehta et al. | 700/29 |
| 7,050,873 B1 | 5/2006 | Discenzo et al. | 700/99 |
| 7,063,597 B2 | 6/2006 | Prabhu et al. | |
| 7,131,890 B1 | 11/2006 | Molnar | 451/8 |
| 7,143,016 B1 | 11/2006 | Discenzo et al. | 703/3 |
| 7,156,717 B2 | 1/2007 | Molnar | 451/5 |
| 7,191,419 B2 | 3/2007 | Soreff et al. | |
| 7,194,682 B2 | 3/2007 | Warrington | |
| 7,194,693 B2 | 3/2007 | Cragun et al. | |
| 7,194,730 B2 | 3/2007 | Pramberger | |
| 7,197,420 B2 | 3/2007 | Johns et al. | |
| 7,197,654 B2 | 3/2007 | Olsen | |
| 7,206,646 B2 | 4/2007 | Nixon et al. | 700/83 |
| 7,220,164 B1 | 5/2007 | Molnar | 451/8 |
| 7,402,521 B2 | 7/2008 | Matsui et al. | |
| 7,422,677 B2 | 9/2008 | Mazur et al. | |
| 7,452,819 B2 | 11/2008 | Matsui et al. | |
| 7,566,385 B2 | 7/2009 | Mazur et al. | |
| 7,704,125 B2 | 4/2010 | Roy et al. | |
| 7,892,071 B2 | 2/2011 | Ernsberger | |
| 7,908,025 B2 | 3/2011 | Miwa et al. | |
| 7,937,179 B2 | 5/2011 | Shimshi et al. | |
| 7,938,583 B2 | 5/2011 | Tanaka et al. | |
| 7,962,864 B2 | 6/2011 | Nehmadi et al. | |
| 7,970,588 B2 | 6/2011 | Kokotov et al. | |
| 7,974,723 B2 | 7/2011 | Moyne et al. | |
| 2002/0010563 A1 | 1/2002 | Ratteree et al. | 703/2 |
| 2002/0032499 A1* | 3/2002 | Wilson et al. | 700/159 |
| 2002/0072296 A1 | 6/2002 | Muilenburg et al. | |
| 2002/0123818 A1 | 9/2002 | Yamada et al. | 700/121 |
| 2002/0199082 A1 | 12/2002 | Shanmugasundram et al. | 712/208 |
| 2003/0046130 A1 | 3/2003 | Golightly et al. | 705/7 |
| 2003/0061004 A1 | 3/2003 | Discenzo | 702/182 |
| 2003/0083757 A1 | 5/2003 | Card et al. | 700/28 |
| 2003/0093762 A1 | 5/2003 | Rietman et al. | 716/2 |
| 2003/0144932 A1 | 7/2003 | Martin et al. | |
| 2004/0267395 A1 | 12/2004 | Discenzo | 700/99 |
| 2009/0204234 A1 | 8/2009 | Sustaeta et al. | |
| 2009/0204237 A1 | 8/2009 | Sustaeta et al. | |
| 2009/0204245 A1 | 8/2009 | Sustaeta et al. | |
| 2009/0204267 A1 | 8/2009 | Sustaeta et al. | |
| 2009/0210081 A1 | 8/2009 | Sustaeta et al. | |
| 2009/0216348 A1 | 8/2009 | Moyne et al. | |
| 2009/0218314 A1 | 9/2009 | Davis et al. | |
| 2009/0228129 A1 | 9/2009 | Moyne et al. | |
| 2011/0166684 A1 | 7/2011 | Moyne et al. | |

OTHER PUBLICATIONS

Adaptive Virtual Metrology Applied to CVD Process, Olson et al., 978-1-4244-6519-7/10/$26.00 @ 2010 IEEE.

Yield Management Enhanced Advanced process Control System (YMeAPC)—Part 1: Description and Case Study of Feedback for Optimized Multiprocess Control, Moyne et al., 0894-6507/$20.00 @ 2010 IEEE.

An Approach for Factory-Wide Control Utilizing Virtual Metrology, Khan et al., 0894-6507/$25/00 @ 2007 IEEE.

Anderson, et al.; Using COO to Select Nitride PECVD Clean Cycle-As suggested by the SEMATECH cost of ownership model, selecting the best -plasma clean requires looking at many parameters, not the least of which is the load factor on the PECVD system; Semiconductor International; Oct. 1993; 3 pages.

Burghard et al.; Reducing Ion-Implant Equipment Cost of Ownership Through in Situ Contamination Prevention and Reduction (Third in a series); Microcontamination; Exclusive: SEMATECH Cost of Ownership Model; Sep. 1992; 4 pages.

Burghard et al.; Reducing Tungsten Deposition Equipment Cost of Ownership Through In Situ Contamination and Prevention and Reduction (Last in a series); Microcontamination; Exclusive: SEMATECH Cost of Ownership Model; Oct. 1992; 3 pages.

D. Dance and P. Bryson; Cost of Ownership for Inspection Equipment; 8 pages.

Berman et al.; Review of In Situ & in-Line Detection for CMP Applications; Semiconductor Fabtech- 8th Edition; 8 pages.

Bibby et al.; Endpoint Detection for CMP; Journal of Electronic Materials, vol. 27, No. 10, 1998; 9 pages.

Burghard et al.; Reducing Tungsten-Etch Equipment Cost of Ownership Through In Situ Contamination Prevention and Reduction (Second in series); Microcontamination; Exclusive: SEMATECH Cost of Ownership Model; Jun. 1992; 4 pages.

C.B Case and C.J. Case; Intermetal Dielectric Cost-of-Ownership: A qualitative comparison of IMD planarization approaches; Semiconductor International; Jun. 1995; 4 pages.

Dance et al.; Reducing Process Equipment Cost of Ownership Through In Situ Contamination Prevention and Reduction (First in a series); Microcontamination; Exclusive: SEMATECH Cost of Ownership Model; May 1992; 4 pages.

Jimenez et al.; The Application of Cost of Ownership Simulation to Wafer Sort and Final Test; First Presented and SEMI's Manufacturing Test Conference; Jul. 1993; 9 pages.

Bunkofske, Raymond; The Real-Time Process Control System; Micronews from IBM, Second Quarter 2000, vol. 6, No. 2; 3 pages.

Edgar, Thomas F., et al; Automatic Control in Microelectronics Manufacturing: Practices, Challenges, and Possibilities; Automatica 36, 2000, Elsevier Science Ltd.; pp. 1567-1603.

* cited by examiner

VERSATILE WORKPIECE REFINING

CROSS REFERENCE TO RELATED APPLICATIONS

This application claims benefit of Provisional Application Ser. No. 60/238,968 filed on Oct. 10, 2000 entitled "Magnetic finishing element"; Provisional Application Ser. No. 60/245,121 filed on Nov. 2, 2000 entitled "New magnetic finishing element", 60/386,567 filed on Jun. 6, 2002 entitled "Magnetic refining", 60/389,042 filed on Jun. 14, 2002 entitled "Wafer refining", 60/396,264 filed on Jul. 16, 2002 entitled "Versatile wafer refining", and 60/496,148 filed with filing date Aug. 18, 2003 entitled "Advanced wafer refining". This application claims benefit of Regular patent applications with Ser. No. 09/974,129 filed on Oct. 9, 2001 entitled "Magnetic refining apparatus", now U.S. Pat. No. 6,435,948, Ser. No. 10/261,113 filed on Sep. 30, 2002, now U.S. Pat. No. 7,008,300, Ser. No. 10/218,740 filed on Aug. 14, 2002 entitled "Versatile Wafer Refining", now U.S. Pat. No. 6,719,615, and Ser. No. 10/822,515 filed on Apr. 12, 2004 entitled "Versatile wafer refining", now U.S. Pat. No. 7,377,836. Provisional Applications and Regular Applications above are included herein by reference in their entirety.

BACKGROUND OF INVENTION

Chemical mechanical polishing (CMP) is generally known in the art. For example U.S. Pat. No. 5,177,908 issued to Tuttle in 1993 describes a finishing element for semiconductor wafers, having a face shaped to provide a constant, or nearly constant, surface contact rate to a workpiece such as a semiconductor wafer in order to effect improved planarity of the workpiece. U.S. Pat. No. 5,234,867 to Schultz et al. issued in 1993 describes an apparatus for planarizing semiconductor wafers which in a preferred form includes a rotatable platen for polishing a surface of the semiconductor wafer and a motor for rotating the platen and a non-circular pad is mounted atop the platen to engage and polish the surface of the semiconductor wafer. Fixed abrasive finishing elements are known for polishing. Illustrative examples include U.S. Pat. No. 4,966,245 to Callinan, U.S. Pat. No. 5,823,855 to Robinson, and WO 98/06541 to Rutherford.

An objective of polishing of semiconductor layers is to make the semiconductor layers as nearly perfect as possible.

BRIEF SUMMARY OF INVENTION

Current finishing elements and equipment can suffer from being costly to manufacture. Generally very complex mechanical equipment used when finishing semiconductor wafers. Complex, expensive, and bulky mechanical drives are generally used for generating polishing pad and wafer polishing motions. Also current finishing elements for semiconductor wafers generally have coextensive surface layers which can limit their versatility in some demanding finishing applications. Current polishing pads are generally larger than the workpiece being finished which consumes precious floor space in a semiconductor fab. Still further, current finishing apparatus are not capable of supplying a parallel finishing motion to finishing elements solely through magnetic coupling forces. Still further, current finishing apparatus are not capable of supplying multiple different parallel finishing motions to multiple finishing elements solely through magnetic coupling forces. Still further, current finishing apparatus are not capable of supplying multiple different parallel finishing motions to multiple different finishing elements solely through magnetic coupling forces. Still further, current finishing apparatus are not capable of supplying refining motion(s) to refining element(s) solely through magnetic coupling forces wherein the refining element(s) inside an enclosed refining chamber and the driving element is external to the enclosed refining chamber. Still further, current finishing apparatus are not capable of supplying a parallel finishing motion to refining elements solely through magnetic coupling forces while electrodeposition and/or electropolishing. Still further, a lack of the above characteristics in a finishing element reduces the versatility of the refining method(s) which can be employed for semiconductor wafer surface refining. Still further, current finishing pads can be limited in the way they apply pressure to the abrasives and in turn against the semiconductor wafer surface being finished. Still further, a method is needed which uses new control methods, quality information, and/or refining rate information to change refining of a workpiece with two layers. Still further, a method is needed which uses new control methods, different refining energies, quality information, and/or refining rate information to change refining of a workpiece with two layers and. These unwanted effects are particularly important and can be deleterious to yield and cost of manufacture when manufacturing electronic wafers which require extremely close tolerances in required planarity and feature sizes.

It is an advantage to improve the finishing method for semiconductor wafer surfaces to make them as perfect as possible. It is an advantage to make refining elements and refining equipment with a lower cost of manufacture and reduce the mechanical complexity of the refining equipment and thus also reduce the cost of refining a semiconductor wafer surface or workpiece surface. It is a preferred advantage to develop refining apparatus and refining elements that can be smaller than the workpiece being refined. It is further an advantage to develop refining apparatus that are capable of supplying a parallel refining motion to refining elements solely through magnetic coupling forces. It is further a preferred advantage to develop current finishing apparatus that are capable of supplying multiple different parallel refining motions to multiple different refining elements solely through magnetic coupling forces. It is further a preferred advantage to develop current finishing apparatus that are capable of supplying a plurality of independent parallel refining motions to multiple different refining elements solely through magnetic coupling forces. It is further an advantage to develop current refining apparatus that are capable of supplying multiple different parallel refining motions to multiple different, independently controlled refining elements solely through magnetic coupling forces. It is further an advantage to develop current refining apparatus that are capable of supplying multiple different refining energies, actions, and/or parallel motions to multiple different, independently controlled refining elements. It is further a preferred advantage to develop current refining apparatus, refining elements, and refining capability that can add and remove material from the workpiece surface being refined. It is further a preferred advantage to develop current refining apparatus, refining elements, and refining capability that can add and remove material from the workpiece surface being refined using similar and/or identical drive elements. It is an advantage of the invention to develop a refining element which has a unique way of applying pressure to the unitary and/or a plurality of discrete refining surface(s) and to the workpiece surface being refined. It is an advantage to develop a versatile method to refine a workpiece with two layers. It is an advantage to develop a versatile method use new control methods, quality information, and/or refining rate information to change refining of a workpiece with two layers. It is an advantage to develop a versatile method which uses new control methods, different refining energies, quality information, and/or refining rate information to change refining of a workpiece with two layers and. It is further an advantage to help improve yield and lower the cost of manufacture for finishing of workpieces having extremely close tolerances such as semiconductor wafers. It is further an advantage to help improve versatility and control which will in turn improve yield, reduce consumable costs, and lower the cost of manufacture for refining of workpieces having extremely close tolerances such as semiconductor wafers. Preferred embodiments accomplish one or more of the above advantages with a new structure and function in a new way to give the new and useful result.

A preferred embodiment is directed, to a method of refining a first and a second layer of a workpiece, each having an effect on a cost of manufacture of the workpiece, the method comprising applying a first refining energy to the first layer of the workpiece for a first layer refining; sensing an in situ process information for the first layer of the workpiece with an at least one operative sensor for the first layer refining; determining a change for an at least one first layer control parameter "A" using an at least one tracked information related to the workpiece and the in situ process information for the first layer of the workpiece with an at least one processor for the first layer refining; controlling the at least one first layer process control parameter "A" to change a first workpiece surface with an at least one operative controller for the first layer refining; storing for future availability a stored information related to the at least one first layer process control parameter "A", the at least one tracked information related to the workpiece, and the in situ process information for the first layer of the workpiece; applying a second refining energy to the second layer of the workpiece having an at least one second layer control parameter "B" for a second layer refining; sensing an in situ process information for the second layer of the workpiece with an at least one operative sensor for the second layer refining; determining a change for the at least one second layer control parameter "B" using the at least one tracked information related to the workpiece, the in situ process information for the first layer of the workpiece, and the in situ process information for the second layer of the workpiece with an at least one processor for the second layer refining; controlling the at least one second layer process control parameter "B" to change a second workpiece surface with an at least one operative controller for the second layer refining; and using at least in part an at least one process model during the method and wherein the method makes an appreciable change to the cost of manufacture of the workpiece.

A preferred embodiment is directed to a method of refining a first and a second layer of a workpiece, each having an effect on a cost of manufacture of the workpiece, the method comprising applying a first refining energy to the first layer of the workpiece for a first layer refining; sensing an in situ process information for the first layer of the workpiece with an at least one operative sensor for the first layer refining; determining a change for an at least one first layer control parameter "A" using an at least one tracked information related to the workpiece, an at least one tracked quality information related to the first layer refining, and the in situ process information for the first layer of the workpiece with an at least one processor for the first layer refining; controlling the at least one first layer process control parameter "A" to change a first workpiece surface during the first layer refining of the first layer of the workpiece with an at least one operative controller for the first layer refining; storing for future availability a stored information related to the at least one first layer process control parameter "A", the at least one tracked information related to the workpiece, the at least one tracked quality information related to the first layer refining, and the in situ process information for the first layer of the workpiece; applying a second refining energy to the second layer of the workpiece having an at least one second layer control parameter "B" for a second layer refining; sensing an in situ process information for the second layer of the workpiece with an at least one operative sensor for the second layer refining; determining a change for the at least one second layer control parameter "B" using the at least one tracked information related to the workpiece, the in situ process information for the first layer of the workpiece, the at least one tracked quality information related to the first layer refining, an at least one tracked quality information related to the second layer refining, and the in situ process information for the second layer of the workpiece with an at least one processor for the second layer refining; controlling the at least one second layer process control parameter "B" to change a second workpiece surface during the second layer refining of the second layer of the workpiece with an at least one operative controller for the second layer refining; and using at least in part an at least one process model during the method and wherein the method makes an appreciable change to the cost of manufacture of the workpiece.

A preferred embodiment is directed to a method of refining a first and a second layer of a workpiece, each having an effect on a cost of manufacture of the workpiece, the method comprising applying a first refining energy to the first layer of the workpiece for a first layer refining; sensing an in situ process information for the first layer of the workpiece with an at least one operative sensor for the first layer refining; determining a change for an at least one first layer control parameter "A" using an at least one tracked information related to the workpiece, an at least one tracked refining rate information related to the first layer refining, and the in situ process information for the first layer of the workpiece with an at least one processor for the first layer refining; controlling the at least one first layer process control parameter "A" to change a first workpiece surface during the first layer refining of the first layer of the workpiece with an at least one operative controller for the first layer refining; storing for future availability a stored information related to the at least one first layer process control parameter "A", the at least one tracked information related to the workpiece, the at least one tracked refining rate information related to the first layer refining, and the in situ process information for the first layer of the workpiece; applying a second refining energy to the second layer of the workpiece having an at least one second layer control parameter "B" for a second layer refining; sensing an in situ process information for the second layer of the workpiece with an at least one operative sensor for the second layer refining; determining a change for the at least one second layer control parameter "B" using the at least one tracked information related to the workpiece, the in situ process information for the first layer of the workpiece, the at least one tracked refining rate information related to the first layer refining, an at least one tracked refining rate information related to the second layer refining, and the in situ process information for the second layer of the workpiece with an at least one processor for the second layer refining; controlling the at least one second layer process control parameter "B" to change a second workpiece surface during the second layer refining of the second layer of the workpiece with an at least one operative controller for the second layer refining; and using at least in part an at least one process model during the method and wherein the method makes an appreciable change to the cost of manufacture of the workpiece.

A preferred embodiment is directed to a method of refining a first and a second layer of a workpiece, each having an effect on a cost of manufacture of the workpiece, the method comprising applying a first refining process to the first layer of the workpiece for a first layer refining; sensing an in situ process information for the first layer of the workpiece with an at least one operative sensor for the first layer refining; determining a change for an at least one first layer control parameter "A" using an at least one tracked information related to the workpiece, an at least one tracked refining rate information related to the first layer refining, an at least one tracked quality information related to the first layer refining, and the in situ process information for the first layer of the workpiece with an at least one processor for the first layer refining; controlling the at least one first layer process control parameter "A" to change a first workpiece surface during the first layer refining of the first layer of the workpiece with an at least one operative controller for the first layer refining; storing for future availability a stored information related to the at least one first layer process control parameter "A", the at least one tracked information related to the workpiece, the at least one tracked refining rate information related to the first layer refining, the at least one tracked quality information related to the first layer refining, and the in situ process information for the first layer of the workpiece; applying a second refining process to the second layer of the workpiece having an at least one second layer control parameter "B" for a second layer refining; sensing an in situ process information for the second layer of the workpiece with an at least one operative sensor for the second layer refining; determining a change for the at least one second layer control parameter "B" using the at least one tracked information related to the workpiece, the in situ process information for the first layer of the workpiece, the at least one tracked refining rate information related to the first layer refining, the at least one tracked quality information related to the first layer refining, an at least one tracked refining rate information related to the second layer refining, an at least one tracked quality information related to the second layer refining, and the in situ process information for the second layer of the workpiece with an at least one processor for the second layer refining; controlling the at least one second layer process control parameter "B" to change a second workpiece surface during the second layer refining of the second layer of the workpiece with an at least one operative controller for the second layer refining; and using at least in part an at least one process model during the method and wherein the method makes an appreciable change to the cost of manufacture of the workpiece.

One or more of these advantages are found in the embodiments of this invention. Illustrative preferred advantages can include higher profits and/or controlled costs during refining of a workpiece. Illustrative preferred advantages can include one or more improvements in quality. Illustrative preferred advantages can include one or more improvements in refining rate. Illustrative preferred advantages can include an appreciable change to the cost of manufacture or profitability. These and other advantages of the invention will become readily apparent to those of ordinary skill in the art after reading the following disclosure of the invention. Other preferred embodiments are discussed herein.

REFERENCE NUMERALS IN DRAWINGS

Figure 1A:
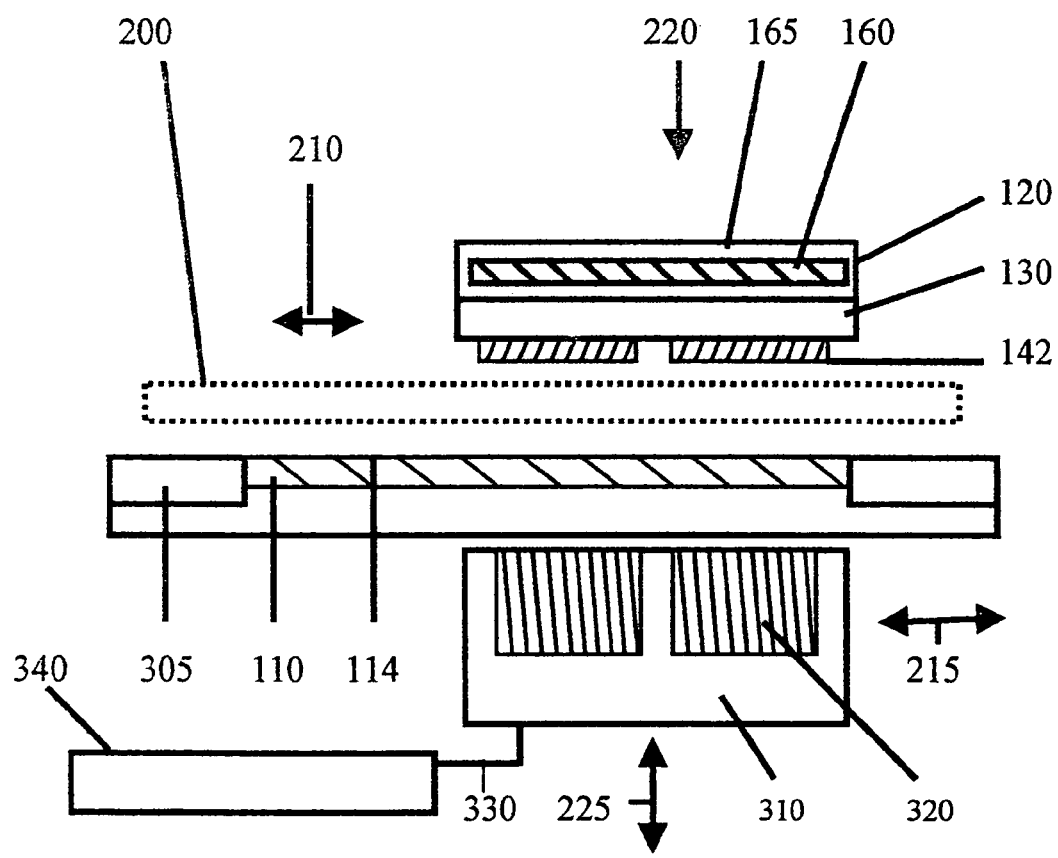
FIG. 1a is an artist's drawing of the interrelationships when finishing according to one embodiment of this invention.

Reference Numeral 20 finishing composition feed line for adding finishing chemicals Reference Numeral 22 reservoir of finishing composition Reference Numeral 24 alternate finishing composition feed line for adding alternate finishing chemicals Reference Numeral 26 a reservoir of alternate finishing composition Reference Numeral 30 a refining chamber Reference Numeral 32 a second inlet for reactive refining composition Reference Numeral 34 represents a second gaseous refining composition Reference Numeral 33 an optionally gaseous refining composition control subsystem Reference Numeral 36 an optional activating chamber for a first gaseous refining composition Reference Numeral 38 a first inlet for a gaseous refining composition Reference Numeral 40 a first gaseous refining composition Reference Numeral 41 an optional outlet operative sensor Reference Numeral 42 an outlet for the material removed from the refining chamber Reference Numeral 44 material removed from the refining chamber
Reference Numeral 110 workpiece
Reference Numeral 112 workpiece surface facing away from the workpiece surface being finished.
Reference Numeral 114 surface of the workpiece being finished
Reference Numeral 120 magnetically responsive refining element
Reference Numeral 130 unitary resilient body of an organic polymer
Reference Numeral 140 discrete finishing member
Reference Numeral 142 discrete finishing member finishing surface
Reference Numeral 143 backside surface of discrete finishing member
Reference Numeral 144 abrasive particles
Reference Numeral 146 optional discrete synthetic resin particles
Reference Numeral 148 discrete finishing member body
Reference Numeral 150 finishing element subsurface layer
Reference Numeral 152 optional finishing aids in discrete finishing member
Reference Numeral 160 magnetic material
Reference Numeral 165 protective covering for magnetic material
Reference Numeral 170 coating
Reference Numeral 171 a small region of a magnetic composite member before magnification
Reference Numeral 172 magnetic material such as magnetic particles
Reference Numeral 173 magnified view of one embodiment of a magnetic composite member
Reference Numeral 175 magnetic composite member
Reference Numeral 184 shortest distance across the discrete member body
Reference Numeral 184 thickness of the discrete finishing member body
Reference Numeral 200 finishing composition
Reference Numeral 210 resultant movement of the magnetic finishing element due to the driving movement of the driving magnet
Reference Numeral 215 driving movement of the driving magnet member
Reference Numeral 220 pressure in the interface between the magnetic finishing element and the semiconductor wafer surface being finished
Reference Numeral 225 movement which changes the perpendicular distance between the magnetic finishing element and the magnetic driving element
Reference Numeral 300 workpiece holder
Reference Numeral 305 adjustable retainer ring
Reference Numeral 307 preferred adjustable retainer ring mechanism
Reference Numeral 310 driving magnet body
Reference Numeral 315 driving magnet assembly
Reference Numeral 320 driving magnet(s)
Reference Numeral 330 operative drive assembly between the driver for the driving magnet assembly and the driving magnet assembly
Reference Numeral 340 driver for the driving magnet assembly
Reference Numeral 400 open spaces between discrete finishing members
Reference Numeral 410 optional third layer member
Reference Numeral 420 unitary resilient body proximal to the finishing member finishing surface
Reference Numeral 422 recess for discrete finishing member
Reference Numeral 430 discrete third layer members
Reference Numeral 432 recess for discrete third layer member
Reference Numeral 434 portion of discrete finishing member spaced apart from unitary resilient body
Reference Numeral 435 cavity between discrete finishing member spaced apart from unitary resilient body
Reference Numeral 436 portion of discrete finishing member attached to the unitary resilient body
Reference Numeral 440 cavity between discrete finishing member spaced apart from unitary resilient body
Reference Numeral 450 potential motion of discrete finishing member in FIG. 7*a*
Reference Numeral 460 potential motion of discrete finishing member in FIG. 7*b*
Reference Numeral 470 potential motion of discrete finishing member in FIG. 7*c*
Reference Numeral 480 potential motion of discrete finishing member in FIG. 8*a*
Reference Numeral 485 potential motion of discrete finishing member in FIG. 8*b*
Reference Numeral 490 potential motion of discrete finishing member in FIG. 9*a*
Reference Numeral 495 potential motion of discrete finishing member in FIG. 9*b*
Reference Numeral 498 potential motion of discrete finishing member in FIG. 9*c*
Reference Numeral 500 discrete regions of material having dispersed therein abrasives
Reference Numeral 502 expanded view of discrete regions of material having dispersed therein abrasives
Reference Numeral 510 abrasive particles
Reference Numeral 550 optional discrete finishing aids
Reference Numeral 555 optional soft organic synthetic resin and/or modifier materials
Reference Numeral 600 magnified small region in a discrete finishing member body
Reference Numeral 601 small region in a discrete member finishing body in FIG. 10*aa* which is magnified in FIG. 10*bb*
Reference Numeral 602 abrasive particles
Reference Numeral 660 electro-refining element
Reference Numeral 662 first electrode
Reference Numeral 664 operative electrical connection to first electrode
Reference Numeral 666 electro-refining surface
Reference Numeral 668 feed for electro-refining composition
Reference Numeral 670 electrical contact to workpiece surface for electro-refining
Reference Numeral 672 operative electrical connection the electrical contact to workpiece surface for electro-refining
Reference Numeral 680 connecting material
Reference Numeral 681 operative refining pressure
Reference Numeral 682 discrete refining member
Reference Numeral 684 connecting material proximate the surface of a discrete refining member
Reference Numeral 686 operative electrode
Reference Numeral 688 operative electrical connection
Reference Numeral 689 first type of magnetically responsive material
Reference Numeral 690 second type of magnetically responsive material
Reference Numeral 692 recesses in connecting material
Reference Numeral 700 optional footer having chamfers and protrusion extending into unitary resilient body Reference Numeral 702 another optional footer shape having chamfers and protrusion extending into unitary resilient body
Reference Numeral 710 optional chamfer proximate discrete finishing member finishing surface
Reference Numeral 712 optional chamfer on the discrete finishing member surface
Reference Numeral 750 layer covering magnetic composite member
Reference Numeral 755 finishing element finishing surface
Reference Numeral 760 optional channel
Reference Numeral 770 connecting member
Reference Numeral 800 semiconductor wafer surface being finished
Reference Numeral 802 high region on semiconductor wafer surface
Reference Numeral 804 lower region proximate the high region on the semiconductor wafer surface
Reference Numeral 810 first magnetic driver
Reference Numeral 811 second magnetic driver
Reference Numeral 812 discrete finishing member surface displaced from but proximate to the high local regions
Reference Numeral 3000 operative workpiece sensor
Reference Numeral 3005 optical waves such as laser beams for operative workpiece sensor
Reference Numeral 3010 operative connection between workpiece sensor and workpiece controller
Reference Numeral 3015 workpiece sensor controller
Reference Numeral 3020 operative connection between workpiece controller and processor
Reference Numeral 3030 operative magnetic finishing element sensor
Reference Numeral 3035 optical waves such as laser beams for the operative magnetic finishing element sensor
Reference Numeral 3040 operative connection between operative magnetic finishing element sensor and operative finishing element sensor controller
Reference Numeral 3045 operative magnetic finishing element sensor controller
Reference Numeral 3050 operative connection between operative magnetic finishing element sensor controller and processor
Reference Numeral 3100 operative magnetic driver sensor
Reference Numeral 3105 operative connection between operative magnetic driver sensor and magnetic driver
Reference Numeral 3110 operative connection between operative magnetic driver sensor and magnetic driver
Reference Numeral 3115 operative connection between operative magnetic driver sensor and processor
Reference Numeral 3200 operative sensor
Reference Numeral 3210 processor
Reference Numeral 3220 controller
Reference Numeral 3230 operative connections.
Reference Numeral 6000 electric current barrier film
Reference Numeral 6002 unwanted high region
Reference Numeral 6004 lower region than unwanted high region
Reference Numeral 6010 surface of refining element
Reference Numeral 6040 thinner region of electric current barrier film
Reference Numeral 6042 thicker region of electric current barrier film
Reference Numeral 6050 operative connection for electrode
Reference Numeral 6070 operative sensor
Reference Numeral 6072 optical beams
Reference Numeral 7000 refining element robot

DETAILED DESCRIPTION OF THE INVENTION

The book *Chemical Mechanical Planarization of Microelectric Materials* by Steigerwald, J. M. et al published by John Wiley & Sons, ISBN 0471138274 generally describes chemical mechanical finishing and is included herein by reference in its entirety for general background. In chemical mechanical finishing the workpiece is generally separated from the finishing element by a polishing slurry. The workpiece surface being finished is in parallel motion with finishing element finishing surface disposed towards the workpiece surface being finished. The abrasive particles such as found in a polishing slurry interposed between these surfaces is used to finish the workpiece is in the background arts.

Discussion of some of the terms useful to aid in understanding this invention are now presented. Finishing is a term used herein for both planarizing and polishing. Planarizing is the process of making a surface which has raised surface perturbations or cupped lower areas into a planar surface and thus involves reducing or eliminating the raised surface perturbations and cupped lower areas. Planarizing changes the topography of the work piece from non planar to ideally perfectly planar. Polishing is the process of smoothing or polishing the surface of an object and tends to follow the topography of the workpiece surface being polished. A finishing element is a term used herein to describe a pad or element for both polishing and planarizing. A finishing element finishing surface is a term used herein for a finishing element surface used for both polishing and planarizing. A finishing element planarizing surface is a term used herein for a finishing element surface used for planarizing. A finishing element polishing surface is a term used herein for a finishing element surface used for polishing. Workpiece surface being finished is a term used herein for a workpiece surface undergoing either or both polishing and planarizing. A workpiece surface being planarized is a workpiece surface undergoing planarizing. A workpiece surface being polished is a workpiece surface undergoing polishing. The finishing cycle time is the elapsed time in minutes that the workpiece is being finished. The planarizing cycle time is the elapsed time in minutes that the workpiece is being planarized. The polishing cycle time is the elapsed time in minutes that the workpiece is being polishing.

As used herein, a refining surface comprises a surface for refining a workpiece surface using an operative motion selected from a motion consisting of a planarizing operative motion, a polishing operative motion, a buffing operative motion, and a cleaning operative motion or combination thereof.

As used herein, die is one unit on a semiconductor wafer generally separated by scribe lines. After the semiconductor wafer fabrication steps are completed, the die are separated into units generally by sawing. The separated units are generally referred to as "chips". Each semiconductor wafer generally has many die which are generally rectangular. The terminology semiconductor wafer and die are generally known to those skilled in the arts. As used herein, within die uniformity refers to the uniformity of within the die. As used herein, local planarity refers to die planarity unless specifically defined otherwise. Within wafer uniformity refers to the uniformity of finishing of the wafer. As used herein, wafer planarity refers to planarity across a wafer. Multiple die planarity is the planarity across a defined number of die. As used herein, global wafer planarity refers to planarity across the entire semiconductor wafer planarity. Planarity is critical for the photolithography step generally common to semiconductor wafer processing, particularly where feature sizes are less than 0.25 microns. As used herein, a device is a discrete circuit such as a transistor, resistor, or capacitor. As used herein, pattern density is ratio of the raised (up) area to the to area of region on a specific region such as a die or semiconductor wafer. As used herein, pattern density is ratio of the raised (up) area to the total area of region on a specific region such as a die or semiconductor wafer. As used herein, line pattern density is the ratio of the line width to the pitch. As used herein, pitch is line width plus the oxide space. As an illustrative example, pitch is the copper line width plus the oxide spacing. Oxide pattern density, as used herein, is the volume fraction of the oxide within an infinitesimally thin surface of the die.

As used herein, the term "polymer" refers to a polymeric compound prepared by polymerizing monomers whether the same or of a different type. The "polymer" includes the term homopolymer, usually used to refer to polymers prepared from the same type of monomer, and the term interpolymer as defined below. Polymers having a number average molecular weight of greater than 5,000 are preferred and polymers having a number average molecular weight of at least 20,000 are more preferred and polymers having a number average molecular weight of at least 50,000 are even more preferred. Polymers generally having a preferred number average molecular weight of at most 1,000,000 are preferred. Those skill in the polymer arts generally are familiar with number average molecular weights. U.S. Pat. No. 5,795,941 issue to DOW Chemical is included by reference in its entirety for general guidance and appropriate modification by those skilled on number average molecular weight determination.

As used herein, the term "interpolymer" refers to polymers prepared by polymerization of at least two different types of monomers.

As used herein, an appreciable amount is term which means "capable of being readily perceived or estimated". A change in the cost of manufacture by an appreciable amount is a preferred nonlimiting example. A change in the refining rate and/or quality by an appreciable amount is a preferred nonlimiting example.

FIG. 1a is an artist's drawing of a particularly preferred embodiment of this invention when looking at a cross-section including the interrelationships of some preferred objects when finishing according to the method of this invention. Reference Numeral 120 represents a magnetically responsive refining element. A magnetic finishing element comprises an illustrative preferred magnetically responsive refining element. The magnetic finishing element has a finishing surface. An abrasive refining surface is preferred. An abrasive finishing surface is more preferred. An abrasive finishing surface can comprise inorganic abrasive particles for some applications. An abrasive finishing or refining surface can comprise organic abrasive particles for some applications. An abrasive refining or finishing surface can be free of inorganic abrasive particles for some applications. An abrasive refining or finishing surface can be free of organic abrasive particles for some applications. The abrasive refining or finishing surface can comprise an abrasive polymer. Generally, a finishing surface having abrasive particles therein is a more aggressive finishing surface and can be preferred for some applications, particularly where higher cuffing rates are preferred. Generally, a finishing surface free of abrasive particles therein can be preferred for finishing such as wherein an abrasive slurry is used. A finishing element finishing surface, preferably an abrasive finishing element finishing surface, free of fluorocarbon matter can be preferred for some types of finishing because the fluorocarbon matter can be difficult to clean from some workpiece surfaces after finishing, particularly with aqueous cleaning compositions. The finishing element finishing surface faces the workpiece surface being finished. An abrasive finishing element finishing surface is preferred. A finishing surface having an abrasive polymer is preferred and having an abrasive organic polymer is more preferred. A magnetically responsive finishing element free of a mechanical driving mechanism is preferred.

Reference Numeral 130 represents a preferred optional unitary resilient body of the finishing element. Reference Numeral 140 represents a discrete finishing member. Reference Numeral 160 represents a material capable of magnetic attraction. A ferromagnetic material is a preferred material capable of magnetic attraction. A paramagnetic material is a preferred material capable of magnetic attraction. In other words, Reference Numeral 160 represents a magnetically responsive member or a member capable of magnetic coupling. A permanent magnet is a preferred magnetic material. Reference Numeral 165 represents a preferred covering layer on the material capable of magnetic attraction. The preferred covering layer can reduce or eliminate chemical degradation to the material capable of magnetic attraction such as iron. A preferred nonlimiting example of a covering layer is a polymeric layer. A discrete finishing member may be referred to herein as a discrete finishing element. The discrete finishing members are preferably attached, more preferably fixedly attached, to the optionally preferred unitary resilient body of the finishing element. An abrasive finishing surface can be preferred for abrasive two body finishing. The abrasive surface can have metal oxide particles. The abrasive surface can comprise a polymeric abrasive surface. The abrasive surface can comprise abrasive polymeric particles. The discrete finishing members can have an abrasive surface such as created by metal oxide particles. In another embodiment the discrete finishing members are free of abrasive particles. Reference Numeral 300 represents a holder for the workpiece surface being finished. A holder for the workpiece can be oriented substantially horizontal, more preferably oriented horizontal (parallel with the ground) is preferred. A holder for the workpiece can be oriented substantially vertical, more preferably oriented vertical (perpendicular with the ground) is also preferred. For some apparatus designs, a vertical orientation can have a smaller footprint and thus a generally lower some of overhead cost to semiconductor wafer manufacturer. Further, for some finishing, removal of unwanted spent finishing compositions for the workpiece surface can be effected with gravity and/or gravity assistance. Reference Numeral 305 represents an optionally preferred adjustable retainer ring, more preferably a height adjustable retainer ring. Adjustable retainer rings and mechanisms are generally known in background art commercial polishing equipment and can be generally modified by those skilled in the art given the teachings and guidance herein. Pneumatic adjustable retainer rings are one preferred kind. Magnetically adjustable retainer rings are another preferred kind. Mechanically adjustable retainer rings are still another preferred kind. Reference Numeral 307 represents an adjustable retainer ring adjustment means. U.S. Pat. No. 6,059,638 gives guidance on some known adjustable retainer mechanism and is included in its entirety for guidance and modification by those skilled in the arts. The retainer ring facilitates holding the workpiece during finishing. An adjustable retainer ring can be used to finishing uniformity at the edge of the workpiece and a height adjustable retainer ring can be used to finishing uniformity at the edge of the workpiece is more preferred. Reference Numeral 315 represents a driving magnet assembly. Reference Numeral 310 represents the driving magnet body. Reference Numeral 320 represents the driving magnets. Reference Numeral 330 represents the operative drive assembly between the driver for the driving magnet assembly and the driving magnet assembly. Reference Numeral 340 represents the driver for the driving magnet assembly. Permanent magnets are a preferred driving magnet. Electromagnets are a preferred driving magnet. Reference Numeral 215 represents a driving movement of the driving magnet member. Reference Numeral 210 represents a resultant movement of the magnetic finishing element due to the driving movement of the driving magnet (Reference Numeral 215). Reference Numeral 210 represents an operative finishing motion. An operative finishing motion in the interface between the workpiece surface being finished and magnetic finishing element finishing surface. A magnetic operative finishing motion in the interface between the workpiece surface being finished and magnetic finishing element finishing surface, as used herein, is the operative finishing motion generated through the coupling the driver magnet(s) and the magnetic finishing element. An operative finishing interface, as used herein, is the interface between the workpiece surface being finished and magnetic finishing element finishing surface. A coefficient of friction in the operative finishing interface of at most 0.5 is preferred and of at most 0.4 is more preferred and of at most 0.3 is even more preferred and of at most 0.2 is even more particularly preferred. Reference Numeral 225 represents optionally preferred movement which changes the perpendicular distance between the magnetic finishing element and the magnetic driving element. Changing the perpendicular distance between the magnetic finishing element and the magnetic driving element is a preferred way to change the finishing pressure in the interface between the magnetic finishing element and the semiconductor wafer surface being finished (Reference Numeral 220). Reference Numeral 220 represents the operative finishing pressure in the operative finishing interface. The magnetic operative finishing pressure is the pressure generated in the interface between the magnetic finishing element finishing surface and the workpiece surface being finished by the magnetic coupling between driver magnet(s) and magnetic finishing element. Another preferred method to change the magnetic coupling force between the finishing element and the driving magnet assembly is to use controllable electromagnets. The workpiece surface facing the finishing element finishing surface is the workpiece surface being finished. Reference Numeral 110 represents the workpiece. Reference Numeral 200 represents a finishing composition and optionally, the alternate finishing composition disposed between the workpiece surface being finished and finishing element finishing surface. The interface between the workpiece surface being finished and the finishing element finishing surface is often referred to herein as the operative finishing interface. A finishing composition comprising a water based composition is preferred. A finishing composition comprising a water based composition which is substantially free of abrasive particles is preferred. The workpiece surface being finished is in operative finishing motion relative to the finishing element finishing surface. The workpiece surface being finished is in operative refining motion, more preferably operative finishing motion, relative to the refining element refining surface. The workpiece surface being finished in operative finishing motion relative to the finishing element finishing surface is an example of a preferred operative finishing motion. The workpiece surface being refined in operative refining motion relative to the finishing element finishing surface is an example of a preferred operative refining motion. Reference Numeral 210 represents a preferred operative refining motion, more preferably an operative finishing motion, between the surface of the workpiece being finished and refining surface.

Figure 1B:
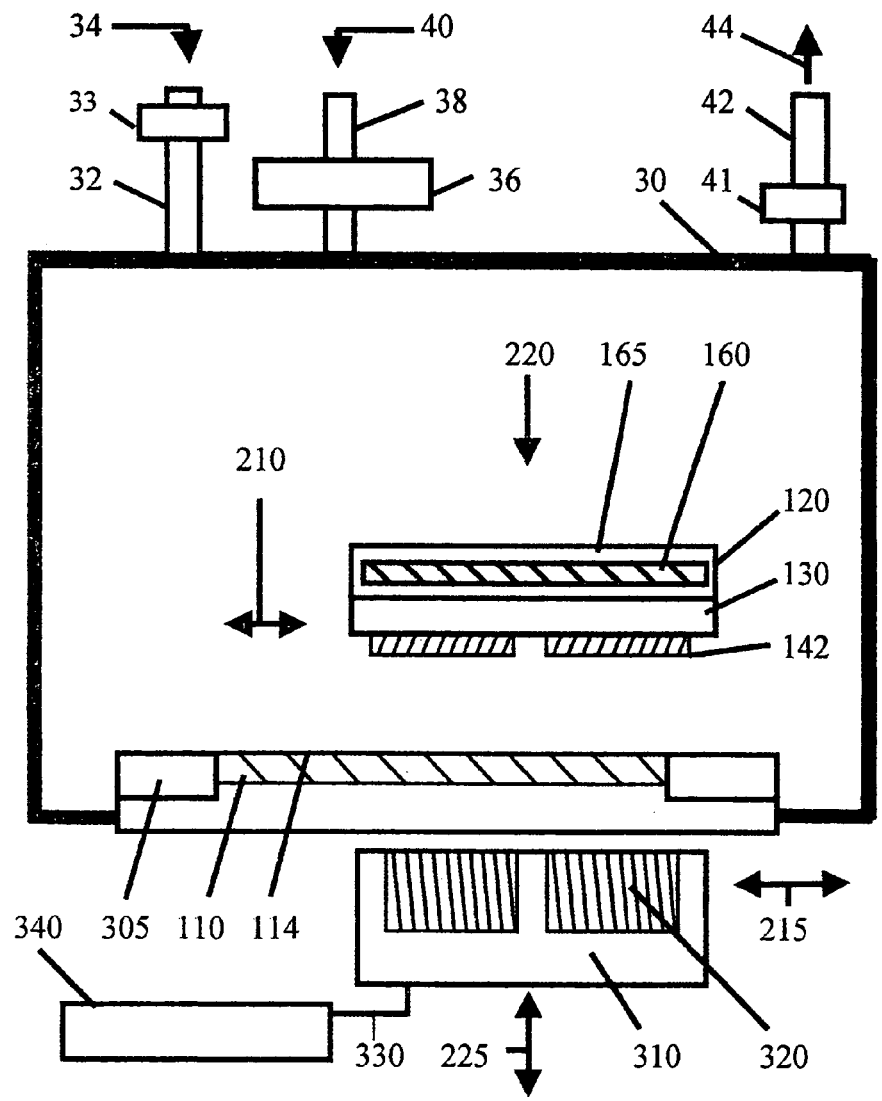
FIG. 1b is an artist's drawing of the interrelationships when finishing according to one embodiment of this invention.

FIG. 1b is an artist's drawing of a particularly preferred embodiment of this invention when looking at a cross-section including the interrelationships of some preferred objects when finishing according to the method of this invention. Reference Numeral 30 represents a refining chamber, preferably a sealed refining chamber, for finishing or refining. Reference Numeral 32 represents a second inlet for a refining composition, preferably a reactive refining composition. Reference Numeral 34 represents a second gaseous refining composition. Reference Numeral 33 represents an optionally preferred operative gaseous refining composition control subsystem having an operative sensor, processor, and controller. Reference Numeral 36 represents an optional activating chamber for a first gaseous refining composition as illustrated by a reactive gas such as an ultraviolet light source to activate ozone. Reference Numeral 38 represents a first inlet for a refining composition, preferably a gaseous refining composition, as illustrated by a reactive gas such as an ultraviolet light source to activate ozone. Reference Numeral 40 represents a first gaseous refining composition. Reference Numeral 42 represents an outlet for the material removed from the refining chamber. Reference Numeral 41 represents an optional outlet operative sensor to sense flow rates, chemical analysis, or pressures of the material removed from the refining chamber to enhance process control. Reference Numeral 44 represents the material removed from the refining chamber. The locations of the inlets and outlets can be changed to different locations to better enhance reactivity, mixing, and/or remove of the spent material. Reference Numeral 120 represents the magnetically responsive refining element. A magnetic refining element is a preferred example of a magnetically responsive refining element. A magnetic finishing element is a preferred example of a magnetically responsive refining element used in this figure. The magnetic finishing element has a finishing surface. An abrasive finishing surface is preferred. An abrasive finishing surface can comprise inorganic abrasive particles for some applications. An abrasive finishing surface can comprise organic abrasive particles for some applications. An abrasive finishing surface can be free of inorganic abrasive particles for some applications. An abrasive finishing surface can be free of organic abrasive particles for some applications. The abrasive finishing surface can comprise an abrasive polymer. Generally, a finishing surface having abrasive particles therein is a more aggressive finishing surface and can be preferred for some applications, particularly where higher cutting rates are preferred. Generally, a finishing surface free of abrasive particles therein can be preferred for finishing such as wherein an abrasive slurry is used. The finishing element finishing surface faces the workpiece surface being finished. An abrasive finishing element finishing surface is preferred. A finishing surface having an abrasive polymer is preferred and having an abrasive organic polymer is more preferred. A magnetically responsive finishing element free of a mechanical driving mechanism is preferred. Reference Numeral 130 represents a preferred optional unitary resilient body of the finishing element. Reference Numeral 140 represents a discrete finishing member. Reference Numeral 160 represents a material capable of magnetic attraction. A ferromagnetic material is a preferred material capable of magnetic attraction. A paramagnetic material is a preferred material capable of magnetic attraction. In other words, Reference Numeral 160 represents a magnetically responsive member or a member capable of magnetic coupling. A permanent magnet is a preferred magnetic material. Reference Numeral 165 represents a preferred covering layer on the material capable of magnetic attraction. The preferred covering layer can reduce or eliminate chemical degradation to the material capable of magnetic attraction such as iron. A preferred nonlimiting example of a covering layer is a polymeric layer. A discrete finishing member may be referred to herein as a discrete finishing element. The discrete finishing members are preferably attached, more preferably fixedly attached, to the optionally preferred unitary resilient body of the finishing element. An abrasive finishing surface can be preferred for abrasive two body finishing. The abrasive surface can have metal oxide particles. The abrasive surface can comprise a polymeric abrasive surface. The abrasive surface can comprise abrasive polymeric particles. The discrete finishing members can have an abrasive surface such as created by metal oxide particles. In another embodiment the discrete finishing members are free of abrasive particles. Reference Numeral 300 represents a holder for the workpiece surface being finished. A holder for the workpiece can be oriented substantially horizontal, more preferably oriented horizontal (parallel with the ground) is preferred. A holder for the workpiece can be oriented substantially vertical, more preferably oriented vertical (perpendicular with the ground) is also preferred. For some apparatus designs, a vertical orientation can have a smaller footprint and thus a generally lower some of overhead cost to semiconductor wafer manufacturer. Further, for some finishing, removal of unwanted spent finishing compositions for the workpiece surface can be effected with gravity and/or gravity assistance. Reference Numeral 305 represents an optionally preferred adjustable retainer ring, more preferably a height adjustable retainer ring. Adjustable retainer rings and mechanisms are generally known in background art commercial polishing equipment and can be generally modified by those skilled in the art given the teachings and guidance herein. Pneumatic adjustable retainer rings are one preferred kind. Magnetically adjustable retainer rings are another preferred kind. Mechanically adjustable retainer rings are still another preferred kind. Reference Numeral 307 represents an adjustable retainer ring adjustment means. U.S. Pat. No. 6,059,638 gives guidance on some known adjustable retainer mechanism and is included in its entirety for guidance and modification by those skilled in the arts. The retainer ring facilitates holding the workpiece during finishing. An adjustable retainer ring can be used to finishing uniformity at the edge of the workpiece and a height adjustable retainer ring can be used to finishing uniformity at the edge of the workpiece is more preferred. Reference Numeral 315 represents a driving magnet assembly. Reference Numeral 310 represents the driving magnet body. Reference Numeral 320 represents the driving magnets. Reference Numeral 330 represents the operative drive assembly between the driver for the driving magnet assembly and the driving magnet assembly. Reference Numeral 340 represents the driver for the driving magnet assembly. Permanent magnets are a preferred driving magnet. Electromagnets are a preferred driving magnet. Reference Numeral 215 represents a driving movement of the driving magnet member. Reference Numeral 210 represents a resultant movement of the magnetic finishing element due to the driving movement of the driving magnet (Reference Numeral 215). Reference Numeral 210 represents an operative finishing motion. An operative finishing motion in the interface between the workpiece surface being finished and magnetic finishing element finishing surface. Refining wherein the semiconductor wafer surface and the magnetically responsive refining elements are in an enclosed chamber and the magnetic driving mechanism is outside the enclosed chamber is preferred. Refining wherein the semiconductor wafer surface and the magnetically responsive refining elements are in an enclosed chamber and the magnetic driving mechanism is totally outside the enclosed chamber is more preferred. Refining wherein the semiconductor wafer surface and the magnetically responsive refining elements are in an enclosed chamber and the driving magnet(s) is outside the enclosed chamber is preferred. Refining wherein the semiconductor wafer surface and the magnetically responsive refining elements are in an enclosed chamber and the driving magnet(s) is totally outside the enclosed chamber is more preferred. A magnetic operative finishing motion in the interface between the workpiece surface being finished and magnetic finishing element finishing surface, as used herein, is the operative finishing motion generated through the coupling the driver magnet(s) and the magnetic finishing element. An operative finishing interface, as used herein, is the interface between the workpiece surface being finished and magnetic finishing element finishing surface. A coefficient of friction in the operative refining or finishing interface of at most 0.5 is preferred and of at most 0.4 is more preferred and of at most 0.3 is even more preferred and of at most 0.2 is even more particularly preferred. Reference Numeral 225 represents optionally preferred movement which changes the perpendicular distance between the magnetic finishing element and the magnetic driving element. Changing the perpendicular distance between the magnetic finishing element and the magnetic driving element is a preferred way to change the finishing pressure in the interface between the magnetic finishing element and the semiconductor wafer surface being finished (Reference Numeral 220). Reference Numeral 220 represents the operative finishing pressure in the operative finishing interface. The magnetic operative finishing pressure is the pressure generated in the interface between the magnetic finishing element finishing surface and the workpiece surface being finished by the magnetic coupling between driver magnet(s) and magnetic finishing element. Another preferred method to change the magnetic coupling force between the finishing element and the driving magnet assembly is to use controllable electromagnets. The workpiece surface facing the finishing element finishing surface is the workpiece surface being finished. Reference Numeral 110 represents the workpiece. The interface between the workpiece surface being finished and the finishing element finishing surface is often referred to herein as the operative finishing interface. A refining chamber having a refining fluid is preferred. A reactive liquid composition can be a preferred refining fluid. A reactive gas can be a preferred refining fluid. A reactive gas having a refining aid comprising a halogenated material is preferred. A halocompound represents a preferred halogenated material. A reactive gas which has been activated with a plasma is preferred. A refining chamber free of a supplied liquid (such as water) is preferred for some refining applications. The workpiece surface being finished is in operative finishing motion relative to the finishing element finishing surface. The workpiece surface being finished in operative finishing motion relative to the finishing element finishing surface is an example of a preferred operative finishing motion. Reference Numeral 210 represents a preferred operative finishing motion between the surface of the workpiece being finished and finishing element finishing surface. Refining the semiconductor wafer surface wherein the semiconductor wafer surface and the magnetically responsive refining element in an enclosed chamber is preferred. Refining the semiconductor wafer surface the semiconductor wafer surface and the magnetically responsive refining element is in a sealed enclosed chamber is more preferred. By refining in an enclosed chamber, the use of gaseous oxidizing agents can be controlled safely in an environmentally friendly manner. Generally a gaseous chamber pressure of between 0.5 and 1.5 atmospheres is preferred and about ambient pressure is more preferred because pressures can be maintained with lower costs. Some reactive gas will generally need a vacuum pressure to retain their activity. Refining the semiconductor wafer surface wherein the semiconductor wafer surface and the magnetically responsive refining elements is in a sealed enclosed chamber having a vacuum can also be preferred for some gaseous reactive agents. If a reactive gas which generally needs a vacuum pressure is used for refining, then the chamber is designed using vacuum technology generally known in the experts in the semiconductor wafer art. A first staging chamber can be used for staging introduction of the semiconductor wafer into the refining chamber and a second staging chamber can be used after refining of the semiconductor wafers for removal. Automated wafer mechanical pickup and movement arms are generally known in the skilled semiconductor wafer artisans. Staging chambers, wafer pickup arms, wafer movement arms are generally commercially used in the semiconductor wafer arts and generally broadly used by commercial equipment suppliers. To simplify the FIG. 1b and improve ease of understanding, generally known aspects such as multiple staging chambers (introduction staging chamber(s) and removal staging chamber(s)), wafer pickup arms, openable and sealable hatches for refining chambers, and wafer movement arms have been omitted because they are generally understood and used commercially by the skilled artisans in the semiconductor wafer arts. In other words, there can be a prerefining chamber(s) and post refining chamber(s). In other words, there can be a workpiece handling and/or placement mechanism. Refining chambers can enhance the versatility of refining with a magnetically responsive refining element. The magnetically responsive refining element is free of any mechanical driving mechanism which penetrates the refining chamber. This can reduce unwanted adventitious particulate contamination, improve yields, simplify and improve the use of gaseous oxidizing agents, and generally reduce the cost of the refining. The new refining chamber and the magnetically responsive finishing element illustrated in FIG. 1b have a new and useful structure which functions in a new and useful manner to generate a new and useful result.

Figure 1C:
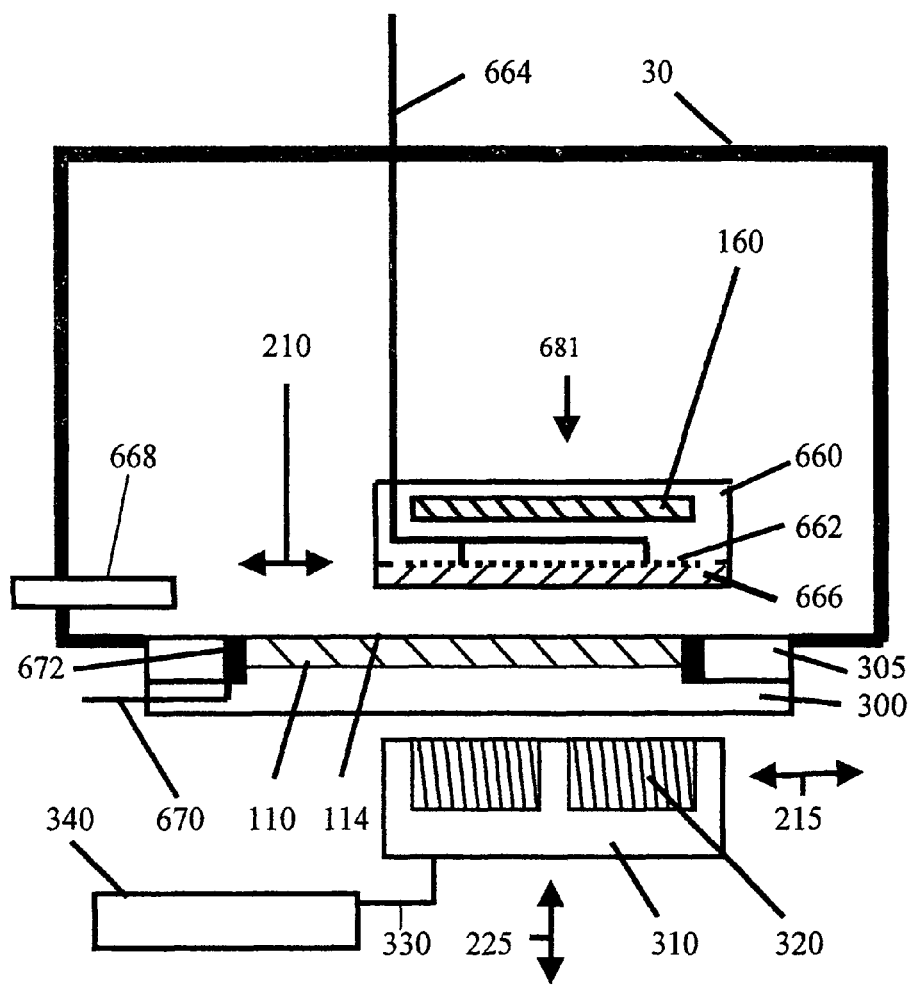
FIG. 1c is an artist's drawing an embodiment of the invention showing a cross-section

FIG. 1c is an artist's drawing of a particularly preferred embodiment of this invention when looking at a cross-section including the interrelationships of some preferred objects when finishing according to the method of this invention. Reference Numeral 30 represents a refining chamber, preferably a sealed refining chamber, for refining or electro-refining. Reference Numeral 660 represents the magnetic electro-refining element. Reference Numeral 662 represents an electrode in the electro-refining element. Reference Numeral 664 represents an operative electrical connection to the electrode in the electro-refining element. A wire connection connected to the electrode with an effective length for movement of the electro-refining element is preferred. Reference Numeral 666 represents an operative electro-refining surface of the electro-refining element. A porous electro-refining surface is a preferred example of an operative electro-refining surface. A porous polymeric surface is preferred and a porous organic polymeric surface is more preferred. A porous polyurethane is an example of a porous electro-refining surface. Reference Numeral 668 represents an operative inlet for electro-refining composition. Reference Numeral 670 represents an electrical contact to workpiece surface for electro-refining. Reference Numeral 672 represents an operative electrical connection the electrical contact to workpiece surface. A third electrode can be used to further enhance control. In this case, the third electrode (e.g. a reference electrode) is preferably used to control the voltage of the semiconductor wafer electrode and the electro-refining element electrode electropotential is changed (controlled). This can be used to aid control of the electro-refining and is generally known to those skilled in the electro-refining arts. Numeral 672 represents a down force from the magnetic coupling between the magnetic driving magnet and the magnetically responsive electro-refining element. For simplicity and ease of understanding some generally known mechanism to form the electrical contacts with the workpiece and preferably seal the backside from electrolyte are not shown but are nonlimiting examples are described in the United States patents contained herein by reference for guidance. Reference Numeral 160 represents the magnetically responsive material in the magnetic electro-refining element. A magnetically responsive electro-refining element free of a mechanical driving mechanism is preferred. Reference Numeral 160 represents a material capable of magnetic attraction. A ferromagnetic material is a preferred material capable of magnetic attraction. A paramagnetic material is a preferred material capable of magnetic attraction. In other words, Reference Numeral 160 represents a magnetically responsive member or a member capable of magnetic coupling. A permanent magnet is a preferred magnetic material. A magnetically responsive member having a preferred covering layer on the material capable of magnetic attraction is preferred. The preferred covering layer can reduce or eliminate chemical degradation to the material capable of magnetic attraction such as iron. A preferred nonlimiting example of a covering layer is a polymeric layer. Reference Numeral 300 represents a holder for the workpiece surface being finished. A holder for the workpiece can be oriented substantially horizontal, more preferably oriented horizontal (parallel with the ground) is preferred. A holder for the workpiece can be oriented substantially vertical, more preferably oriented vertical (perpendicular with the ground) is also preferred. For some apparatus designs, a vertical orientation can have a smaller footprint and thus a generally lower some of overhead cost to semiconductor wafer manufacturer. Further, for some finishing, removal of unwanted spent finishing compositions for the workpiece surface can be effected with gravity and/or gravity assistance. Reference Numeral 305 represents an optionally preferred adjustable retainer ring, more preferably a height adjustable retainer ring. Adjustable retainer rings and mechanisms are generally known in background art commercial polishing equipment and can be generally modified by those skilled in the art given the teachings and guidance herein. Pneumatic adjustable retainer rings are one preferred kind. Magnetically adjustable retainer rings are another preferred kind. Mechanically adjustable retainer rings are still another preferred kind. The retainer ring facilitates holding the workpiece during finishing. An adjustable retainer ring can be used to finishing uniformity at the edge of the workpiece and a height adjustable retainer ring can be used to finishing uniformity at the edge of the workpiece is more preferred. Reference Numeral 315 represents a driving magnet assembly. Reference Numeral 310 represents the driving magnet body. Reference Numeral 320 represents the driving magnets. Reference Numeral 330 represents the operative drive assembly between the driver for the driving magnet assembly and the driving magnet assembly. Reference Numeral 340 represents the driver for the driving magnet assembly. Permanent magnets are a preferred driving magnet. Electromagnets are a preferred driving magnet. Reference Numeral 215 represents a driving movement of the driving magnet member. Reference Numeral 210 represents a resultant movement of the magnetic electro-refining element due to the driving movement of the driving magnet (Reference Numeral 215). Reference Numeral 210 represents an operative refining motion. An operative electro-refining motion in the interface between the workpiece surface being electro-refined and magnetic electro-refining element finishing surface. A magnetic operative refining motion in the interface between the workpiece surface being electro-refined and magnetic electro-refining element electro-refining surface, as used herein, is the operative electro-refining motion generated through the coupling the driver magnet(s) and the magnetic finishing element. An operative electro-refining interface, as used herein, is the interface between the workpiece surface being electro-refined and magnetic electro-refining element electro-refining surface. A coefficient of friction in the operative electro-refining or refining or finishing interface of at most 0.5 is preferred and of at most 0.4 is more preferred and of at most 0.3 is even more preferred and of at most 0.2 is even more preferred and of at most 0.15 is even more particularly preferred. A coefficient of friction in the operative electro-refining or refining or finishing interface of at most 0.03 is preferred and of at least 0.05 is more preferred. A coefficient of friction in the operative electro-refining or refining or finishing interface of from 0.5 to 0.03 is preferred and of from 0.4 to 0.03 is more preferred and of from 0.3 to 0.05 is even more preferred. A low coefficient of friction can reduce unwanted surface defects on the workpiece. Reference Numeral 225 represents optionally preferred movement which changes the perpendicular distance between the magnetic electro-refining element and the magnetic driving element. Changing the perpendicular distance between the magnetic electro-refining element and the magnetic driving element is a preferred way to change the electro-refining pressure in the interface between the magnetic finishing element and the semiconductor wafer surface being finished (Reference Numeral 114). Reference Numeral 681 represents the in the operative finishing interface. The magnetic operative electro-refining pressure is the pressure generated in the interface between the magnetic electro-refining element electro-refining surface and the workpiece surface being finished by the magnetic coupling between driver magnet(s) and magnetic electro-refining element. Another preferred method to change the magnetic coupling force between the electro-refining element and the driving magnet assembly is to use controllable electromagnets. The workpiece surface facing the finishing element finishing surface is the workpiece surface being electro-refined. Reference Numeral 110 represents the workpiece. The interface between the workpiece surface being electro-refined and the electro-refining element electro-refining surface is often referred to herein as the operative electro-refining interface. By adjusting the pressure and gap between the electro-refining surface and the semiconductor wafer surface being refined, electrodeposition or the ratio of the electrodeposition and frictional refining can be controlled.

Refining and electro-refining in a chamber is preferred. Refining the semiconductor wafer surface wherein the semiconductor wafer surface and the magnetically responsive refining element is in an enclosed chamber is preferred. Refining the semiconductor wafer surface the semiconductor wafer surface and the magnetically responsive refining element in a sealed enclosed chamber is more preferred. A first staging chamber can be used for staging introduction of the semiconductor wafer into the refining chamber and a second staging chamber can be used after refining of the semiconductor wafers for removal. Automated wafer mechanical pickup and movement arms are generally known in the skilled semiconductor wafer artisans. Staging chambers, wafer pickup arms, wafer movement arms are generally commercially used in the semiconductor wafer arts and generally broadly used by commercial equipment suppliers. To simplify the FIGS. 1b and 1c and improve ease of understanding, generally known aspects such as multiple staging chambers (introduction staging chamber(s) and removal staging chamber(s)), wafer pickup & placement arms, openable and sealable hatches for refining chambers, multiple processing chambers, general robotics, and wafer movement arms have been omitted because they are generally known and used commercially by the skilled artisans in the semiconductor wafer arts. In other words, there can be a prerefining chamber(s) and post refining chamber(s). In other words, there can be a workpiece handling and/or placement mechanism. Refining chambers can enhance the versatility of refining with a magnetically responsive refining element. A refining chamber for simultaneously refining a plurality of workpieces is preferred and for refining a multiplicity of workpieces is more preferred. A magnetically responsive refining element free of any mechanical driving mechanism which penetrates the refining chamber is preferred. This can reduce unwanted adventitious particulate contamination, improve yields, simplify and improve the use of gaseous oxidizing agents, and generally reduce the cost of the refining. The new refining chamber and the magnetically responsive finishing element illustrated in FIGS. 1b and 1c have a new and useful structure which functions in a new and useful manner to generate a new and useful result.

Current densities between at least a portion of the interface between the semiconductor wafer surface and the magnetically responsive electro-refining element of from 0.1 to 100 milliampere per square centimeter is preferred and from 10 to 100 milliampere per square centimeter is more preferred and from 15 to 80 milliampere per square centimeter is even more preferred and from 15 to 65 milliampere per square centimeter is even more particularly preferred. The current density can be continuous or discontinuous. For discontinuous current densities can be used to control electro-refining. A pulsed DC voltage can be used to control electro-refining. Alternating magnitudes, polarities, and waveforms can be used to control electro-refining. Exemplary waveforms include square wave, sinusoidal, and sawtooth. Duty cycles can be varied to be control electro-refining. Generally a DC electrical power supply is used (preferably a controllable DC electrical power supply and more preferably an electronically controllable DC electrical power supply). DC power supplies are generally known to those skilled in the arts and not illustrated for simplicity. The DC electrical power supply and its output is preferably operatively connected to a control system, more preferably a control system having a processor for control during refining. The control system can be remote from the DC electrical power supply or integral to the DC electrical power supply. Control systems and their use are discussed further elsewhere herein. A pressure in at least a portion of the interface between the semiconductor wafer surface and the magnetically responsive electro-refining element of from 0.1 to 10 psi can be preferred. Controlling the current and pressure can help improve yields when manufacturing high precision workpieces. The electric field can have a polarity which removes material for the workpiece or add material to the workpiece.

Electro-refining compositions such as solutions for adding material as illustrated by electro-deposition and electroplating solutions have generally been used. As an illustration, copper electroplating solutions use a copper salt such as copper sulfate in a water solution having various additives such as levelers, grain refiners, wetting agents, stress reducing agents, and brighteners some of which are generally illustrated by chemical derivatives of sulfonic acid, mercaptobenzene, 2,4-imidazolidine-diol, thiobenhydantoin, polyethers, and polysulfdes. Known sulfuric acid solutions are illustrative examples for a solutions useful for electroplating of copper and alloys thereof. Electroplating solutions are generally known to those skilled in the electroplating arts and further guidance and non-limiting illustrations may be found in U.S. Pat. Nos. 4,430,173 to Boudot et al., 4,948,474 to Miljkovic, and 4,975,159 Dahms which are incorporated by reference in their entirety for further guidance and modification by those skilled in the relevant art. Combination electroplating (electrodeposition), mechanical polishing, and electropolishing solutions are also generally known. Electrodeposition is a preferred method of electro-refining for adding material. Electropolishing is a preferred method of electro-refining for removing material. Examples of compositions amendable to electro-polishing include Cu, Al, Ti, Ta, W, Fe, Ag, Au, and alloys thereof. Known phosphoric acid solutions are illustrative examples for a solutions useful for electropolishing of copper and alloys thereof. Frictional refining is a preferred form of refining which can be used with electrodeposition. Frictional refining is a preferred form of refining which can be used with electropolishing. Refining and electro-refining compositions are generally known. Combination electroplating (e.g. electrodeposition), mechanical polishing solutions, electropolishing solutions, and related technology and apparatus therefore are generally known to those skilled in the semiconductor wafer processing arts as illustrated by non-limiting examples found in U.S. Pat. Nos. 5,256,565 to Bernhardt et al., 5,567,300 to Datta et al., 5,807,165 to Uzoh et al., 5,897,165 to Uzoh et al., 6,004,880 to Liu et al., 6,354,916 to Uzoh et al., and 6,368,190 to Easter et al. and US Application 2002/0011417 to Talieh et al. which are incorporated by reference in their entirety for further guidance and modification by those skilled in the relevant art. Copper plating solutions and additives also generally available commercially by such companies as Shipley, LeaRonal, and Enthone-OMI under related company tradenames. Preferred embodiments of magnetically responsive refining elements and refining methods using them have a different structure and function in a new and different way and deliver a new and more versatile result.

As illustrated in FIGS. 1a, 1b, and 1c the apparatus, refining elements, and methods can be very versatile. In one preferred embodiment, operative electro-refining element and be used with a refining element free of electro-refining capacity (or capability) to refine the workpiece. In one preferred embodiment, operative electro-refining element for adding material can be used with a refining element free of electro-refining capacity (or capability) to refine the workpiece. In one preferred embodiment, operative electro-refining element for adding material can be used with a non-abrasive refining element free of electro-refining capacity (or capability) to refine the workpiece. In one preferred embodiment, operative electro-refining element for adding material can be used with an abrasive refining element free of electro-refining capacity (or capability) to refine the workpiece. In one preferred embodiment, operative electro-refining element for removing material can be used with a refining element free of electro-refining capacity (or capability) to refine the workpiece. In one preferred embodiment, operative electro-refining element for removing material can be used with a non-abrasive refining element free of electro-refining capacity (or capability) to refine the workpiece. In one preferred embodiment, operative electro-refining element for removing material can be used with an abrasive refining element free of electro-refining capacity (or capability) to refine the workpiece.

As illustrated in FIGS. 1a, 1b, and 1c the apparatus, refining elements, and methods can be very versatile. In one preferred embodiment, operative electro-refining element having a region for applying an operative electric field for electro-refining and also having a different refining region (such as a discrete finishing member surface) free of electro-refining capacity (or capability) to refine the workpiece. In one preferred embodiment, operative electro-refining element having a region for applying an operative electric field for electro-refining and also having a different abrasive refining region (such as a discrete finishing member surface) free of electro-refining capacity (or capability) to refine the workpiece. In one preferred embodiment, operative electro-refining element having a region for applying an operative electric field for electro-refining and also having a different non-abrasive refining region (such as a discrete finishing member surface) free of electro-refining capacity (or capability) to refine the workpiece. An electro-refining region having an operative electric field applied for adding material is preferred. An electro-refining region having an operative electric field applied for removing material is preferred.

Further illustrating in FIGS. 1a, 1b, and 1c the apparatus, refining elements, and methods can be very versatile. In one preferred embodiment, a refining element can have a region abrasive refining and a different region for non-abrasive refining. In one preferred embodiment, a refining element can having an abrasive refining surface can be used along with a second refining element having a non-abrasive surface. Where a plurality of refining element are used, they can the same or different operative finishing motions. A different refining elements can apply a different pressure (or pressure profile) and can, preferably be controlled independently. The different refining elements can have relative velocities (and preferably can be controlled independently). The different refining elements can have different paths (circular vs. linear, circular vs. orbital, orbital vs. linear). The different refining elements can have different refining cycle times. The different refining elements can have different control parameters. The different refining elements can have different control algorithms. A processor can be used for control of these different embodiments. Because of the versatility and the need for very high precision finishing for some workpieces, a tracking code for a refining is preferred. Historical performance and control information can be stored with the refining element tracking code and then this information used for control.

Figure 2:
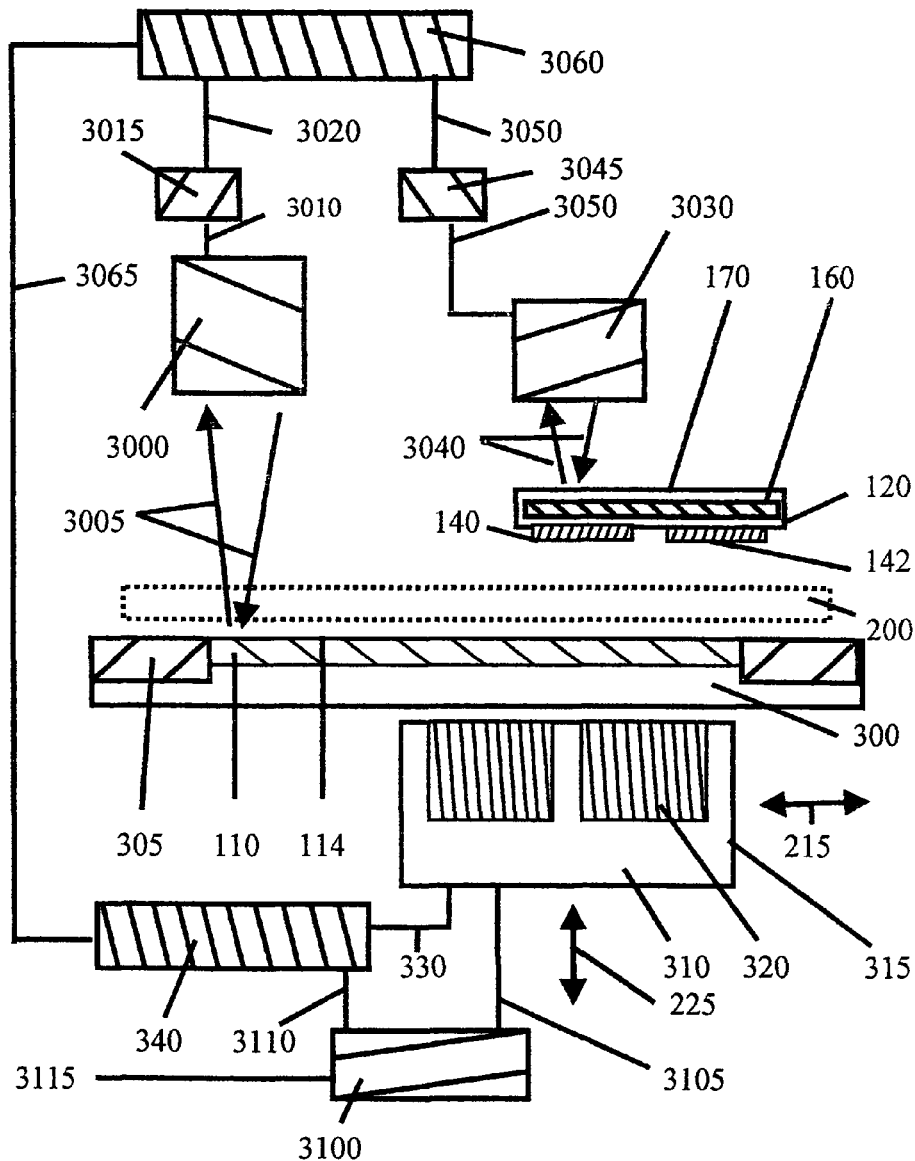
FIG. 2 is an artist's drawing of the interrelationships when finishing according to another embodiment of this invention

FIG. 2 is an artist's drawing of a preferred embodiment when looking from at a cross-section including the interrelationships of some preferred objects when finishing according to the method of this invention. Reference Numeral 120 represents the magnetic finishing element. A magnetically responsive finishing element free of any physically connected movement mechanism is preferred. Reference Numeral 140 represents a discrete finishing member. Reference Numeral 142 represents the finishing element finishing surface. Reference Numeral 160 represents a magnetic member capable of magnetic attraction. Reference Numeral 170 represents a preferred coating on the material capable of magnetic attraction. The preferred coating layer can reduce or eliminate chemical degradation to the magnetic member capable of magnetic attraction. A preferred nonlimiting example of a coating is a polymeric coating. Reference Numeral 300 represents a holder for the workpiece surface being finished. Reference Numeral 305 represents an optionally preferred height adjustable retainer ring. The retainer ring facilitates holding the workpiece during finishing. An adjustable retainer ring can be used to finishing uniformity at the edge of the workpiece and a height adjustable retainer ring can be used to finishing uniformity at the edge of the workpiece is more preferred. Reference Numeral 315 represents a driving magnet assembly. Reference Numeral 310 represents the driving magnet body. Reference Numeral 320 represents the driving magnets(s). Reference Numeral 330 represents the operative drive assembly between the driver for the driving magnet assembly and the driving magnet assembly. Reference Numeral 340 represents the driver for the driving magnet assembly. Permanent magnets are a preferred driving magnet. Electromagnets are a preferred driving magnet. Reference Numeral 215 represents a driving movement of the driving magnet member. Reference Numeral 210 represents a resultant movement of the magnetic finishing element due to the driving movement of the driving magnet (Reference Numeral 215). Reference Numeral 225 represents optionally preferred movement which changes the perpendicular distance between the magnetic finishing element and the magnetic driving element. Changing magnetic coupling by changing the perpendicular distance between the magnetically responsive finishing element and the magnetic driving element can be used to change the finishing pressure in the interface between the magnetic finishing element and the semiconductor wafer surface being finished. (Reference Numeral 220). Another preferred method to change the magnetic coupling force between the magnetically responsive finishing element and the driving magnet assembly is to use controllable electromagnets. Another preferred method of changing and/or controlling the coupling force between the magnetically responsive finishing element and the driving magnet assembly is use a permanent magnet modified to provide a dynamically controllable controllable coupling force. An electronically controllable coupling force is an example of a dynamically controllable coupling force. The workpiece surface facing the finishing element finishing surface is the workpiece surface being finished. Operative finishing motion consisting essentially of operative motion driven by the magnetic coupling the driver magnet and the magnetic finishing element is very preferred. Operative finishing motion consisting of operative motion driven by the magnetic coupling between the driver magnet and the magnetic finishing element is especially preferred. Reference Numeral 110 represents the workpiece. Reference Numeral 200 represents a finishing composition and optionally, the alternate finishing composition disposed between the workpiece surface being finished and finishing element finishing surface. The interface between the workpiece surface being finished and the finishing element finishing surface is often referred to herein as the operative finishing interface. A finishing composition comprising a water based composition is preferred. A finishing composition comprising a water based composition which is substantially free of abrasive particles is preferred. The workpiece surface being finished is in operative finishing motion relative to the finishing element finishing surface. The workpiece surface being finished in operative finishing motion relative to the finishing element finishing surface is an example of a preferred operative finishing motion. A preferred operative finishing motion is a parallel motion between the surface of the workpiece being finished and finishing element finishing surface with an effective between pressure applied therebetween.

Operative sensors, controllers, and processors are preferred for some finishing applications. FIG. 2 shows a preferred embodiment of operative sensors, controllers, and processors. Reference Numeral 3000 represents an operative workpiece sensor. A preferred workpiece sensor is a non-contact sensor. Illustrated is a radiation sensor (such as a laser sensor) showing the emitted radiation and the returned radiation (Reference Numeral 3005). The operative workpiece sensor is connected to a workpiece sensor controller (Reference Numeral 3015) with an operative connection (Reference Numeral 3010). The workpiece sensor controller is operatively connected to a processor (Reference Numeral 3060). As used herein, a workpiece sensor subassembly comprises an operative workpiece sensor, a workpiece controller, a processor, and operative connections or communication therebetween. Reference Numeral 3030 represents a magnetic finishing element sensor. A non-contact magnetic finishing element sensor is preferred. An electronically responsive coil element to a moving magnetic field is a magnetic sensor. Illustrated is a radiation magnetic finishing element sensor (such as a laser sensor) showing the emitted radiation and the returned radiation (Reference Numeral 3040). The operative magnetic finishing element sensor is connected to a magnetic finishing element sensor controller (Reference Numeral 3045) with an operative connection (Reference Numeral 3050). The magnetic finishing element sensor controller is operatively connected to a processor (Reference Numeral 3060). As used herein, a magnetic finishing element sensor subassembly comprises an operative magnetic finishing element sensor, a magnetic finishing element controller, a processor, and operative connections or communication therebetween. Reference Numeral 3100 represents a controller for the driving magnet assembly and the driver for the driving magnet assembly. Reference Numeral 3105 represents an operative connection between the controller (Reference Numeral 3100) for the driving magnet assembly (Reference Numeral 315) and the magnetic driver (Reference Numeral 340). Reference Numeral 3110 represents an operative connection between the controller and the driver for the driving magnet assembly. A driver magnetic sensor subassembly comprising an operative driving magnetic assembly sensor, an operative driver sensor (for the driving magnetic assembly sensor), a controller for the operative driving magnetic assembly, a controller for the driver sensor (for the driving magnetic assembly sensor), a processor, and operative connections or communication therebetween. Given the teachings and guidance herein, those generally skilled in the relevant art can readily assemble a driver magnetic sensor subassembly.

This illustrated method of real time control of magnetic refining or finishing is preferred. An operative real time control subsystem comprising a magnetic refining element sensor subassembly is preferred and an operative real time control subsystem comprising a magnetic refining element sensor subassembly having a plurality of magnetic refining element sensors is more preferred. An operative real time control subsystem comprising a magnetic finishing element sensor subassembly is preferred and an operative real time control subsystem comprising a magnetic finishing element sensor subassembly having a plurality of magnetic finishing element sensors is more preferred. An operative real time control subsystem comprising workpiece sensor subassembly is preferred and operative real time control subsystem comprising workpiece sensor subassembly having a plurality of workpiece sensors is more preferred. An operative real time control subsystem comprising a driver magnet sensor subassembly is also preferred and an operative real time control subsystem comprising a driver magnet sensor subassembly having a plurality of driver magnet sensors is more preferred. An operative real time control subsystem which is free of physical contact with the workpiece surface being finished is a preferred magnetic finishing controller. A magnetic refining controller which changes the magnetic coupling between the magnetic driver and the magnetic refining element is preferred and a magnetic refining controller which changes the magnetic coupling field(s) between the magnetic driver and the magnetic refining element is a more preferred magnetic refining controller. A magnetic refining controller which changes the magnetic coupling between an electromagnetic driver and the magnetic refining element is preferred and a magnetic refining controller which changes the magnetic coupling field(s) between the electromagnetic driver and the magnetic refining element is a more preferred magnetic refining controller. A magnetic refining controller which changes the magnetic coupling between an magnetic driver having a permanent magnet with an electronically controllable field strength, and the magnetic refining element is preferred and a magnetic refining controller which changes the magnetic coupling field(s) between the electromagnetic driver and the magnetic refining element is a more preferred magnetic refining controller. A magnetic finishing controller which changes the magnetic coupling between the magnetic driver and the magnetic finishing element is preferred and a magnetic finishing controller which changes the magnetic coupling field(s) between the magnetic driver and the magnetic finishing element is a more preferred magnetic finishing controller. A magnetic finishing controller which changes the magnetic coupling between an electromagnetic driver and the magnetic finishing element is preferred and a magnetic finishing controller which changes the magnetic coupling field(s) between the electromagnetic driver and the magnetic finishing element is a more preferred magnetic finishing controller. A magnetic finishing controller which changes the magnetic coupling between an magnetic driver having a permanent magnet with an electronically controllable field strength, and the magnetic finishing element is preferred and a magnetic finishing controller which changes the magnetic coupling field(s) between the electromagnetic driver and the magnetic finishing element is a more preferred magnetic finishing controller.

Figure 3A:
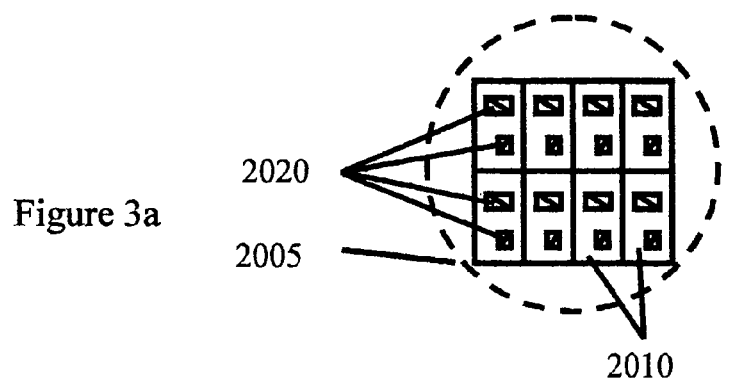
FIG. 3 is an artist's drawing of a particularly preferred embodiment of this invention including the interrelationships of the different objects when finishing according to an embodiment this invention.
Figure 3:
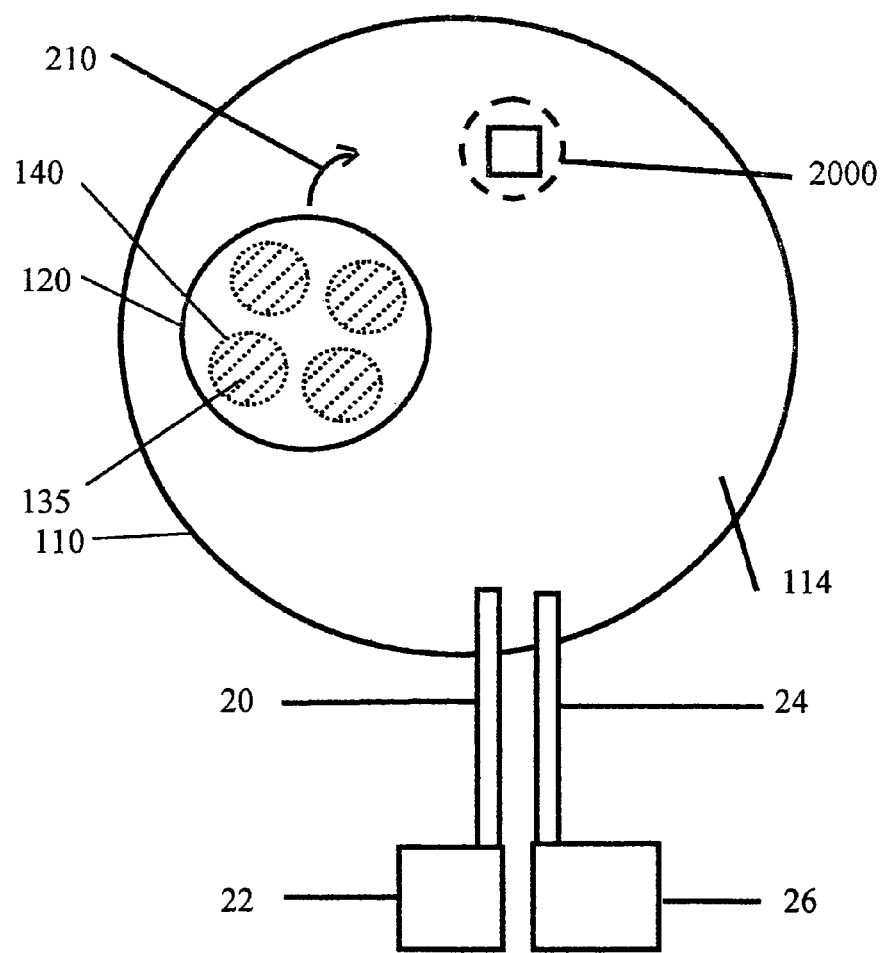

FIG. 3 is an artist's drawing of the interrelationships magnetic finishing element disposed on top of semiconductor wafer surface being finished according to a preferred embodiment of this invention. Reference Numeral 110 represents the workpiece. Reference Numeral 114 represents the workpiece surface being finished. A plurality of unwanted high regions can often be present on the workpiece surface being finished. During finishing, the high region(s) is preferably substantially removed and more preferably, the high region is removed and surface polished. Reference Numeral 120 represents the magnetic finishing element. A magnetic refining element having a surface area in square centimeters which is at least as large workpiece repeating patterns (such as semiconductor wafer die) is preferred and at least as large as three repeating patterns is more preferred. A magnetic refining element having a surface area in square centimeters from the surface area of a die in square centimeters to at most the surface area of a semiconductor wafer surface being refined in square centimeters is more preferred. A magnetic finishing element having a surface area in square centimeters which is at least as large workpiece repeating patterns (such as semiconductor wafer die) is preferred and at least as large as three repeating patterns is more preferred. Reference Numeral 140 represents an optional upper layer of material capable of magnetic attraction which is in turn coated with an anticorrosive layer. Reference Numeral 135 represents the optional discrete finishing members (side opposite of the finishing surface) which is underneath Reference Numeral 140 in this view. Reference Numeral 20 represents a finishing composition feed line for adding other chemicals to the surface of the workpiece such as acids, bases, buffers, other chemical reagents, and the like. The finishing composition feed line can have a plurality of exit orifices. Reference Numeral 22 represents a reservoir of finishing composition to be fed to finishing element finishing surface. Not shown is the feed mechanism for the finishing composition such as a variable pressure or a pump mechanism. Reference Numeral 24 represents an alternate finishing composition feed line for adding the finishing chemicals composition to the finishing element finishing surface to improve the quality of finishing. Reference Numeral 26 represents an alternate finishing composition reservoir of chemicals to be, optionally, fed to finishing element finishing surface. Reference Numeral 210 represents a preferred finishing motion. Not shown is the feed mechanism for the alternate finishing composition such as a variable pressure or a pump mechanism. A preferred embodiment of this invention is to feed liquids from the finishing composition line and the alternate finishing composition feed line which are free of abrasive particles. Reference Numeral 2000 represents a small surface area of workpiece surface being finished having a repeating pattern (such as semiconductor wafer die) each having a repeating subpattern of unwanted regions (such as unwanted raised regions). In FIG. 3a, Reference Numeral 2005 represents a magnified view of Reference Numeral 2000 of FIG. 3. Reference Numeral 2010 represents the repeating pattern (such as semiconductor wafer die) each having a repeating subpattern of unwanted regions represented by Reference Numeral 2020 (such as unwanted raised regions).

Figure 4:
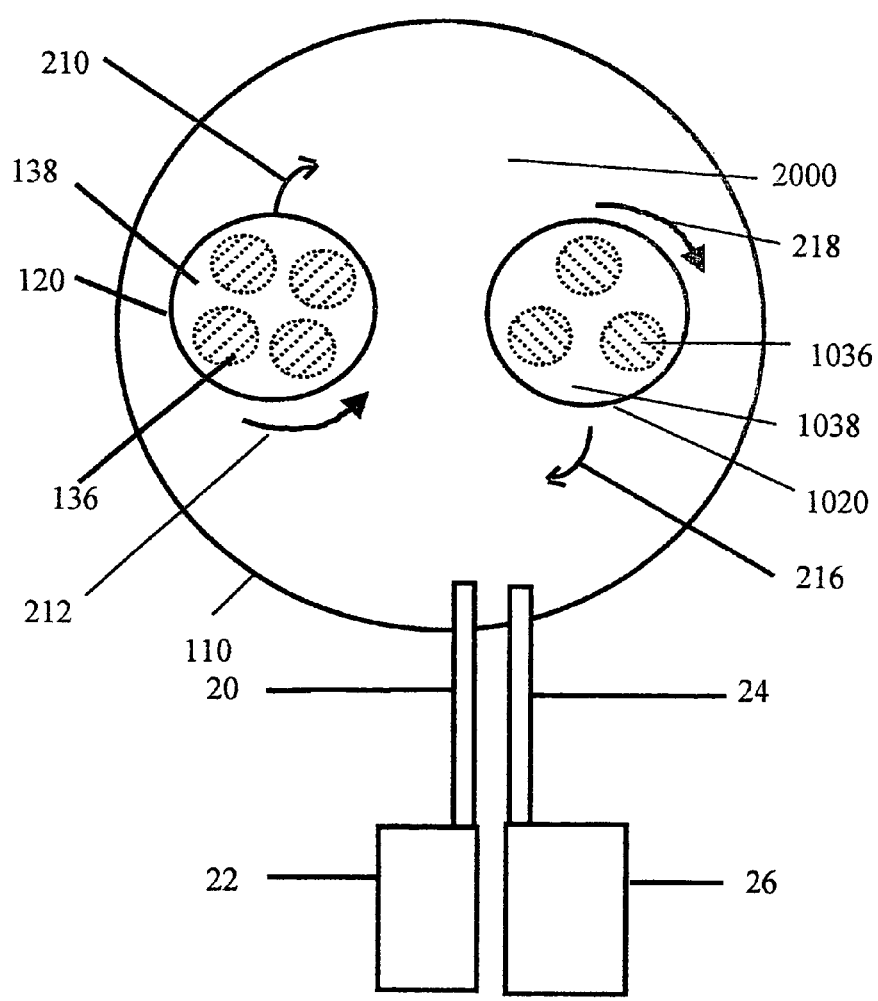
FIG. 4 is an artist's drawing of a particularly preferred embodiment of this invention including the interrelationships of the different objects when finishing according to an embodiment of this invention.

FIG. 4 is an artist's drawing of the interrelationships magnetic finishing element disposed on top of semiconductor wafer surface being finished according to a preferred embodiment of this invention. Reference Numeral 110 represents the workpiece. Reference Numeral 114 represents the workpiece surface being finished. A plurality of unwanted high regions can often be present on the workpiece surface being finished. During finishing, the high region(s) is preferably substantially removed and more preferably, the high region is removed and surface polished. Reference Numerals 120 and 1020 represent a first and an optional second magnetic finishing elements, respectively. Reference Numeral 138 and 1038 represent upper layers of material capable of magnetic attraction (and/or magnetic coupling) which can be coated with optional anticorrosive layer(s). Reference Numeral 136 and 1036 represents the optional discrete finishing members (side opposite of the finishing surface) for the first and an optional second magnetic finishing elements, respectively. Reference Numeral 210 and 216 represent a first and a second operative finishing motions moving on the surface of the workpiece being finished. As shown in this embodiment, the first and second finishing motions can be related or independent of each other. Reference Numerals 212 and 218 represent a third and a fourth operative finishing motions of the first and second finishing elements which are different from each other. Finishing a workpiece with a plurality of finishing motions is preferred. Finishing a workpiece with a plurality of finishing elements is preferred and finishing a workpiece with a plurality of finishing elements wherein each finishing element has a plurality of operative finishing motions is more preferred. Numeral 20 represents a finishing composition feed line for adding other chemicals to the surface of the workpiece such as acids, bases, buffers, other chemical reagents, and the like. The finishing composition feed line can have a plurality of exit orifices. Reference Numeral 22 represents a reservoir of finishing composition to be fed to finishing element finishing surface. Not shown is the feed mechanism for the finishing composition such as a variable pressure or a pump mechanism. Reference Numeral 24 represents an alternate finishing composition feed line for adding the finishing chemicals composition to the finishing element finishing surface to improve the quality of finishing. Reference Numeral 26 represents an alternate finishing composition reservoir of chemicals to be, optionally, fed to finishing element finishing surface. Not shown is the feed mechanism for the alternate finishing composition such as a variable pressure or a pump mechanism. Reference Numeral 3200 represents an operative sensor, more preferably a plurality of operative sensors. Reference Numeral 3210 represents a processor. Reference Numeral 3220 represents a controller. Reference Numeral 3230 represents operative connections. Reference Numeral 7000 represents a refining element placement robot (or mechanism) for the magnetically responsive refining element(s). A placement arm having a magnetic member to lift, place, and release the magnetically responsive refining element. An operative refining element robot operatively connected to a control subsystem having a process is preferred. A means to read a tracking code on a refining element is also preferred. A processor to evaluate information such as tracking codes and historical performance of the refining element is preferred. Preferably, the magnetic member of the placement arm is an electromagnetic. A controller to control lifting, placement, release, and other related process parameters is also preferred. A preferred embodiment of this invention is to feed liquids from the finishing composition line and the alternate finishing composition feed line which are free of abrasive particles. By using multiple finishing elements, finishing rates can generally be reduced and/or finishing versatility enhanced.

Figure 5:
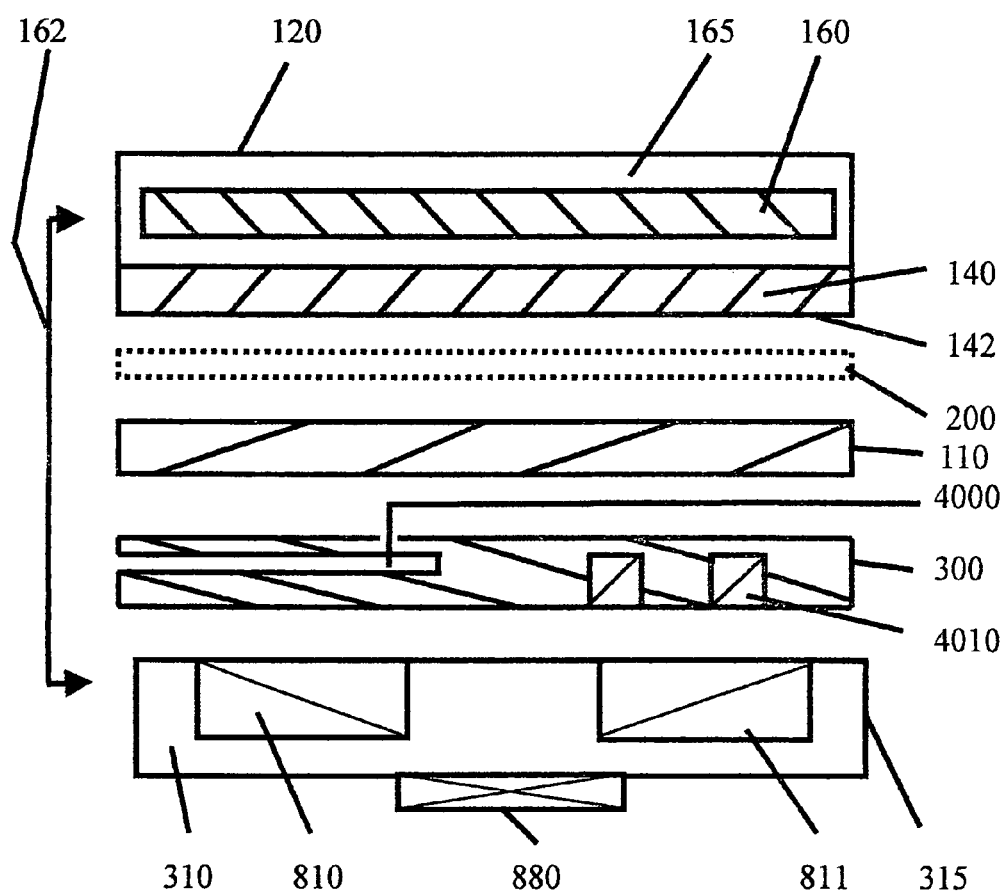
FIG. 5 is a closeup drawing of a preferred embodiment

FIG. 5 is an artist's closeup drawing of a preferred embodiment of this invention showing some further interrelationships of the different objects when finishing according to the method of this invention. Reference Numeral 110 represents the workpiece. The workpiece is in operative contact with the magnetic finishing element finishing surface during finishing (represented by a discrete finishing element finishing surface Reference Numeral 142). Reference Numeral 114 represents the surface of the workpiece being finished. Reference Numeral 120 represents the magnetic finishing element. Reference Numeral 140 represents a discrete finishing member. Reference Numeral 142 represents the discrete finishing member finishing surface. Optional abrasive materials are preferably dispersed on the surface of the discrete finishing member finishing surface. Reference Numeral 200 represents the finishing composition and optionally, the alternate finishing composition supplied between the workpiece surface being finished and surface of the finishing element facing the workpiece. For some applications the finishing composition and the alternate finishing composition can be combined into one feed stream, preferably free of abrasive particles. Reference Numeral 160 represents a material capable of magnetic attraction (or magnetic coupling material). Reference Numeral 162 represents the magnetic attraction and/or coupling between the magnetic driver and the magnetic finishing element. Reference Numeral 165 represents an optional coating on the material capable of magnetic attraction. Reference Numeral 172 represents magnetic material such as magnetic particles. Reference numeral 165 represents a protective layer covering for Reference Numeral 160. Reference Numeral 300 represents the workpiece holder. Reference Numeral 4010 represents optional flux pins in the workpiece holder to improve magnetic coupling between the finishing element and the magnetic driver subsystem. Reference Numeral 4000 represents optional passageways in the workpiece holder. In this embodiment the passageways are used for temperature control (for example temperature control fluids. Reference Numeral 315 represents the magnetic driver assembly. Reference Numeral 310 represents an optional body for the magnetic driver subsystem. Reference Numerals 810 and 811 represent optionally different magnetic drivers and/or different magnetic poles on a magnetic driver. The magnetic drivers can be electromagnetic. Optionally and preferably the electromagnetic driver, and more preferably a plurality of electromagnetic magnetic drivers can be controlled by the controller.

Figure 6B:
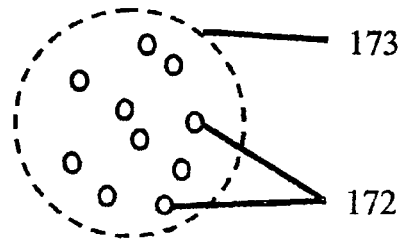
FIGS. 6 and 6b are closeup drawings of preferred embodiments
Figure 6:
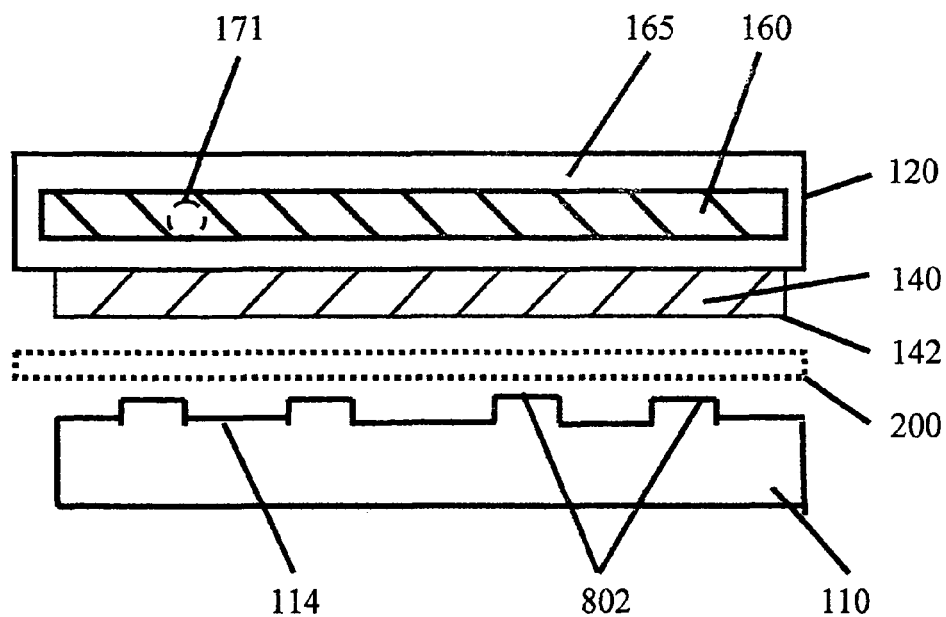

FIG. 6 is an artist's closeup drawing of a preferred embodiment of this invention showing some further interrelationships of the different objects when finishing according to the method of this invention. Reference Numeral 110 represents the workpiece. The workpiece is in operative contact with the magnetic finishing element finishing surface during finishing (represented by a discrete finishing element finishing surface Reference Numeral 142). Reference Numeral 114 represents the surface of the workpiece being finished. Reference Numeral 120 represents the magnetic finishing element. Reference Numeral 802 represents the unwanted raised regions illustrated with at least one repeating pattern on the surface of the workpiece surface being finished. Reference Numeral 140 represents a discrete finishing member. Reference Numeral 142 represents the discrete finishing member finishing surface. Optional abrasive materials are preferably dispersed on the surface of the discrete finishing member finishing surface. Reference Numeral 200 represents the finishing composition and optionally, the alternate finishing composition supplied between the workpiece surface being finished and surface of the finishing element facing the workpiece. For some applications the finishing composition and the alternate finishing composition can be combined into one feed stream, preferably free of abrasive particles. Reference Numeral 160 represents a material capable of magnetic attraction. Reference Numeral 165 represents an optional coating on the material capable of magnetic attraction. In FIG. 6, Reference Numeral 171 represents a region in the material capable of magnetic attraction which is magnified in FIG. 6b. In FIG. 6b, Reference Numeral 173 represents a magnified view of a preferred material capable of magnetic attraction having comprising a magnetic composition such as a polymeric resin with iron particles dispersed therein. The material capable of magnetic attraction comprising a paramagnetic particles is preferred. The material capable of magnetic attraction comprising a ferromagnetic magnetic particles is also preferred. Reference Numeral 172 represents magnetic material such as magnetic particles. Reference numeral 165 represents a protective layer covering for Reference Numeral 160.

Figure 7A:
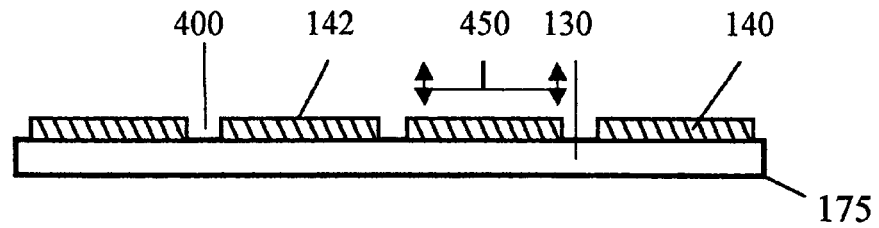
FIGS. 7a, 7b, and 7c are cross-sectional views of a magnetic finishing element
Figure 7B:
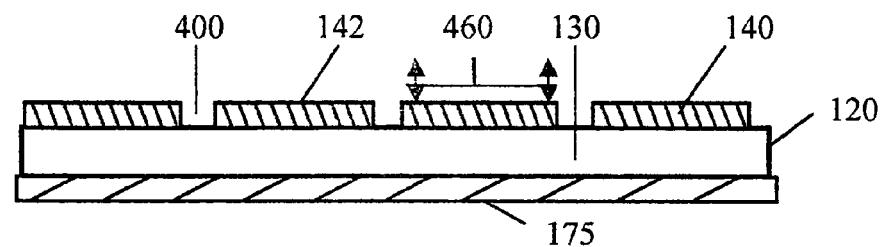
Figure 7C:
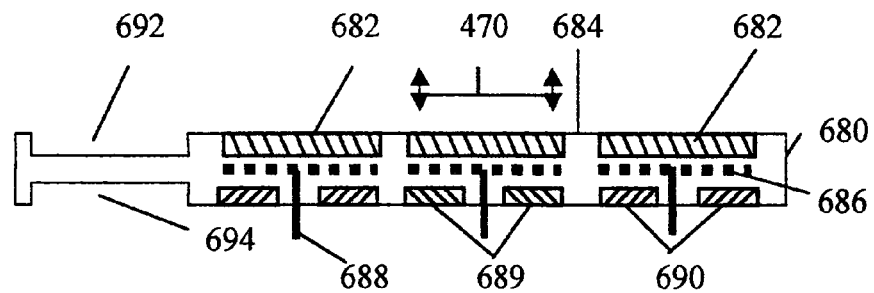

FIGS. 7a, 7b, and 7c are an artist's representation of the cross section of some preferred embodiments of the magnetic finishing elements of this invention. In FIG. 7b Reference Numeral 120 represents the magnetic finishing element. In FIGS. 7a, 7b, and 7c Reference Numeral 130 represents the unitary resilient body in the finishing element. In FIGS. 7a, 7b, and 7c Reference Numeral 140 represents one of the discrete finishing members and Reference Numeral 142 represents the discrete finishing member finishing surface. Reference Numeral 402 represents a high flexural modulus finishing region. Reference Numeral 175 represents magnetic composite member(s) which preferably have a corrosion resistant coating. A magnetic composite is a nonlimiting example of a magnetically responsive material. The high flexural modulus finishing region corresponds to the region of the discrete finishing member (which is a higher flexural modulus). Reference Numeral 404 represents a low flexural modulus region between the high flexural modulus finishing regions. A preferred aspect shown in FIG. 7*a* is the discrete finishing members connected to the surface of a unitary resilient body comprising a sheet of resilient organic polymer. In FIG. 7*a*, there are shown open spaces (Reference Numeral 400) between the discrete finishing members. A magnetic finishing element of this form can be manufactured by for instance laminating a continuous sheet of the finishing member material to a magnetic composite material such as a resin composite having magnetic particles therein and then laser cutting or mechanically milling out the spaces there between using technology known to those skilled in the arts. Reference Numeral 450 represents a preferred motion which the magnetic composite can impart to the discrete finishing member to improve local planarity while retaining some global flexibility at Reference Numeral 400 if a flexible magnetic composite structure is used such as a thermoplastic material having magnetic particles dispersed therein. This cooperative motion between the unitary resilient body and the magnetic composite is unique to the finishing element of this invention.

In FIG. 7*b*, there is a shown discrete finishing members fixedly attached to the surface of a unitary resilient body comprising a sheet of resilient organic polymer (Reference Numeral 130) and further comprising a magnetic composite member (or layer) (Reference Numeral 175) connected to the surface of the unitary resilient body facing away from the finishing element members. A reinforcing film is an optionally preferred fourth layer which is not shown. A reinforcing layer having fibers is another optionally preferred third layer. The fourth layer preferably can be used to reinforce the finishing element. The fourth layer preferably can be used to stabilize the finishing element and/or the movement of the discrete finishing members. Reference Numeral 460 represents a preferred motion which the unitary resilient body can impart to the discrete finishing member to improve local planarity while retaining some moderated global flexibility at Reference Numeral 400. A magnetic finishing element having discrete finishing member(s) and the unitary resilient body influence the motion 460. Again the cooperative motion between the unitary resilient body, the discrete finishing member, and the magnetic composite layer is unique to the finishing element of this invention. In this embodiment the unitary resilient body and magnetic composite layer applies a substantially uniform pressure across the backside surface of the discrete finishing members and more preferably the unitary resilient body applies a uniform pressure across the backside surface of the discrete finishing members.

In FIG. 7*c*, there is shown electro-refining members connected to a connecting material and which are disposed in recesses (Reference Numeral 692) of the connecting material (Reference Numeral 680). Reference Numeral 682 represents a discrete refining member, preferably a discrete electro-refining member, and more preferably a porous discrete electro-refining member. It is recognized that the connecting material can be proximal to the refining member refining surface (see Reference Numeral 684) and thus can aid in refining. Alternately the connecting material can be spaced apart from the discrete refining member refining surface and thus not rub against the workpiece during operative refining motion. The recesses can further aid in connecting the refining member to the connecting material. The recesses can form a preferred friction mechanism to facilitate attaching the discrete refining member(s) to the unitary resilient body. Also in FIG. 7*c*, there is shown a plurality of discrete regions of separated magnetically responsive material (Reference Numeral 689 & 690) preferably disposed in recesses (Reference Numeral 694) of the connecting material. In one preferred embodiment the magnetically responsive material (Reference Numeral 689 and Reference Numeral 690) have a recess to permit an operative electrical connection (Reference Numeral 688) to an operative electrode (Reference Numeral 686). The magnetically responsive material can be the same or different in Reference Numeral 689 and 690. For instance the concentration or type of magnetically responsive can be different. For instance, in a first region a first magnetically responsive material can be a temporarily attracted to a permanent magnet no matter the magnetic pole while in a different region a second magnetically responsive material can be a permanent magnet which is repulsed like poles and attracted with opposite magnetic poles. Thus one can readily see that not only can localized positive pressure be applied to refining interface between a workpiece surface and refining element but also a negative pressure (or reduced pressure) can be applied enhancing control of refining. A plurality of different magnetically responsive materials in a refining element can be preferred and a plurality of different magnetically responsive materials, each in spaced apart locations can be more preferred. The separate magnetically responsive material can further reinforce the unitary resilient body and/or change the motion the discrete refining member(s). Having a plurality of separate magnetically responsive material members can improve the flexibility of the refining element to follow some of the global non uniformities in the wafer while the discrete refining members improve local planarity during electrodeposition and/or electropolishing (preferably within die uniformity). The recesses can further aid in connecting the magnetically responsive material to the connecting material (preferably a polymer) and to the magnetically responsive material members. Reference Numeral 470 represents a preferred motion which the connecting material and magnetically responsive material members can impart to the discrete refining member(s) to improve local planarity while retaining some global flexibility at Reference Numeral 684. The magnetically responsive material members and the connecting material cooperate to influence the motion 470. Again the cooperative motion between the magnetically responsive material member, the connecting material, the discrete electro-refining member(s), and electrode is unique, preferred embodiment of this invention. Optionally the electro-refining members can have the same or different compositions and/or structures. For example, an electro-refining member can have a higher porosity and another electro-refining member can have a lower porosity in comparison. As a further example, an electro-refining member can have a higher flexural modulus and another electro-refining member can have a lower flexural modulus. These preferred options can improve the versatility of magnetic electro-refining.

Figure 8A:
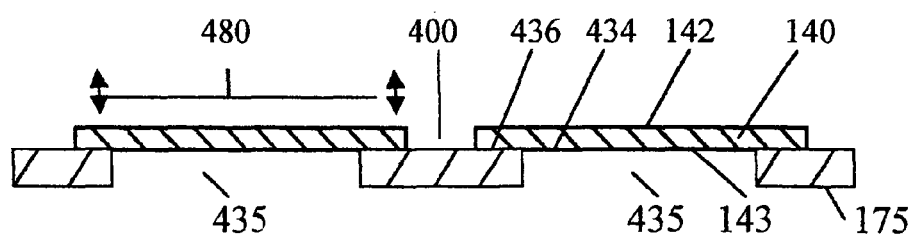
FIGS. 8a and 8b are cross-sectional views of alternate preferred embodiments of a magnetic finishing element

Reference Numerals 450, 460, and 470 represent preferred up and down motions of the discrete finishing member finishing surfaces during finishing. Movement of the discrete finishing member finishing surfaces which remain substantially parallel with the workpiece surface being finished during finishing is preferred and applying movements to the discrete finishing member finishing surfaces which are within 3 degrees of parallel with the workpiece surface being finished are more preferred and applying movements to the discrete finishing member finishing surfaces which are within 2 degrees of parallel with the workpiece surface being finished are even more preferred and applying movements to the discrete finishing member finishing surfaces which are within 1 degree of parallel with the workpiece surface being finished are even more preferred. Reference Numeral 114 (workpiece surface being finished) and Reference Numeral 142 (finishing element finishing surface) are depicted in FIG. 5 in a substantially parallel relationship. By keeping the discrete finishing members substantially parallel with the workpiece surface during finishing, unwanted surface damage can generally be reduced or eliminated. Applying a variable pressure to the backside of the discrete finishing members as shown in FIGS. 8a & 8b can facilitate maintaining this parallel relationship.

A finishing element having discrete finishing members having at least of a portion of its surface facing away from the workpiece being finished spaced apart from the unitary resilient body is preferred for some applications. FIGS. 8a and 8b are artist's expanded cross-sectional view representing some preferred spaced apart embodiments. FIG. 8a represents an artist's cross-section view showing a portion of backside of the discrete finishing member attached, more preferably fixedly attached, to the unitary resilient body. Reference Numeral 175 represents the magnetic composite member (or layer). Reference Numeral 140 represents the discrete finishing member and Reference Numeral 142 represents the finishing surface of the discrete finishing member. Reference Numeral 143 represents the surface of the discrete finishing member facing away from the workpiece being finished and is often referred to herein as the backside of the discrete finishing member. Reference Numeral 400 represents an optional open space between the discrete finishing members. Reference Numeral 400 can be a passage way for supplying the finishing composition to the discrete finishing member finishing surface. Reference Numeral 435 represents a portion of the backside of the discrete finishing member spaced apart from the unitary resilient body. In other words, at least a portion of the backside surface of the discrete finishing member is free of contact with the unitary resilient body. Reference Numeral 435 represents a spaced apart region between the unitary resilient body and the discrete finishing member. Numeral 436 represents a portion of the backside of the discrete finishing member which is preferably fixedly attached to unitary resilient body in FIG. 8a (and the unitary resilient body is then attached, more preferably fixedly attached, to magnetic composite member). By applying only local pressure to the discrete finishing member backsides with the magnetic composite members, a nonuniform pressure can be applied to the backside of the discrete finishing member in order to aid control the pressure applied to workpiece surface being finished (see FIG. 8a). By having a portion of the backside of the discrete finishing member spaced apart from the unitary resilient body and a different portion of the backside of the discrete finishing member fixedly attached to the unitary resilient body, a nonuniform pressure can be applied to the backside of the discrete finishing member in order to control the pressure applied to workpiece surface being finished (see FIG. 8b). A backside of the discrete finishing member proximate at least a portion of the perimeter of the discrete finishing member attached, more preferably fixedly attached, to the unitary resilient body and/or the magnetic composite member is preferred and a backside of the discrete finishing member proximate to the perimeter of the discrete finishing member attached, more preferably fixedly attached, to the unitary resilient body and/or the magnetic composite member is more preferred. A nonuniform pressure applied to the backside of the discrete finishing member proximate at least a portion of the perimeter of the discrete finishing member is preferred and a nonuniform pressure applied to the backside of the discrete finishing member proximate at least the perimeter of the discrete finishing member is more preferred. This nonuniform pressure can help compensate for shear stresses during finishing to improve maintaining the discrete finishing member finishing surface parallel to the workpiece surface being finished. Some illustrative motions of the discrete finishing member is represented in Reference Numeral 480 for illustration. Nonuniform pressure applied to the backside of the discrete finishing member can help reduce unwanted surface damage. Applying a nonuniform pressure to the backside of the discrete finishing member for maintaining the discrete finishing member finishing surface substantially parallel to the workpiece surface being finished is preferred.

Figure 8B:
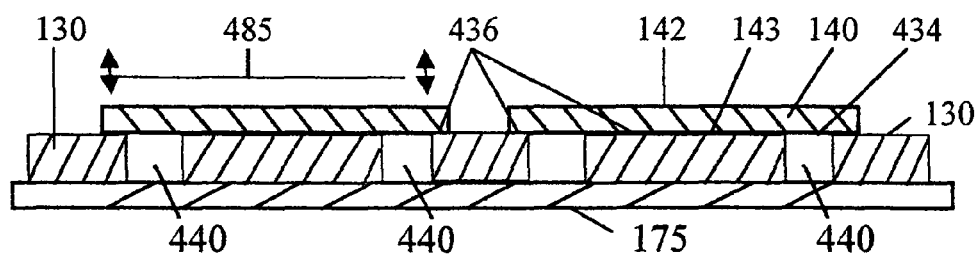

FIG. 8b represents an artist's cross-section view showing a portion of backside of the discrete finishing member fixedly attached to the unitary resilient body. Reference Numeral 130 represents the unitary resilient body. Reference Numeral 140 represents the discrete finishing member and Reference Numeral 142 represents the finishing surface of the discrete finishing member. Reference Numeral 143 represents the surface of the discrete finishing member facing away from the workpiece being finished and is often referred to herein as the backside of the discrete finishing member. Reference Numeral 440 represents an optional open space between the discrete finishing members. Reference Numeral 440 can be a passage way for supplying the finishing composition to the discrete finishing member finishing surface. Reference Numeral 175 represents the magnetic composite member (or layer). Optionally, the magnetic composite layer can reinforce the finishing element and/or change the resilience. The magnetic composite layer is attached to the directly or indirectly to the finishing surface. The magnetic composite layer (or magnetic composite member) can be attached to the finishing surface, or instance, through the unitary resilient body. The magnetic composite layer is preferably fixedly attached to the unitary resilient body. Reference Numeral 434 represents a portion of the backside of the discrete finishing member spaced apart from the unitary resilient body. Reference Numeral 440 represents a spaced apart region between the unitary resilient body and the discrete finishing member. Reference Numeral 436 represents a portion of the backside of the discrete finishing member which is attached to unitary resilient body. By having a portion of the backside of the discrete finishing member spaced apart from the unitary resilient body and a different portion of the backside of the discrete finishing member fixedly attached (and/or in contact with) to the unitary resilient body, a nonuniform pressure can be applied to the backside of the discrete finishing member in order to control the pressure applied to workpiece surface being finished. This nonuniform pressure can help compensate for shear stresses during finishing to improve maintaining the discrete finishing member finishing surface parallel to the workpiece surface being finished. This can help reduce unwanted surface damage. By having a portion of the backside of the discrete finishing member spaced apart from the unitary resilient body and a different portion of the backside of the discrete finishing member fixedly attached (and/or in contact with) to the unitary resilient body, a nonuniform pressure can be applied to the backside of the discrete finishing member in order to control the pressure applied to workpiece surface being finished. This nonuniform pressure can help compensate for shear stresses during finishing to improve maintaining the discrete finishing member finishing surface parallel to the workpiece surface being finished. Some illustrative motions of the discrete finishing member is represented in Reference Numeral 485 for illustration. Nonuniform pressure applied to the backside of the discrete finishing member can help reduce unwanted surface damage. Applying a nonuniform pressure to the backside of the discrete finishing member for maintaining the discrete finishing member finishing surface substantially parallel to the workpiece surface being finished is preferred. An organic lubricating boundary layer is also preferred to reduce unwanted surface damage and unwanted shear forces.

Each of these constructions shown in FIGS. 7a, 7b, and 7c and 8a and 8b can be preferable for different workpiece topographies needed particular finishing. Various combinations can also be preferred. The shapes of the cooperating pieces, their thickness, and their physical parameters such as flexural modulus and magnetic strength can be used to improve local and global planarity. The local and global magnetic forces applied to the magnetic finishing element can be customized for the individual semiconductor wafer design and finishing needs by adjusting the parameters herein discussed. The local and global forces can also be adjusted by proper design of the magnetic finishing element for the individual semiconductor wafer design and finishing needs by adjusting the parameters herein discussed. A magnetic member contained in at least a portion of the magnetic finishing element is preferred for applying the preferred operative finishing motion. A finishing element having the above cooperating elements works in a new and different manner for delivering a new and useful finishing result. Further, since in a preferred mode the discrete finishing member, the magnetic member(s), and the unitary resilient body are fixedly attached (and/or in contact with) to each other and they function in a new and interdependent manner. A finishing element having a plurality of discrete finishing surfaces attached to a magnetic member for applying an interdependent localized pressure to the operative finishing interface is very preferred. Applying localized pressure to the operative finishing interface with a plurality of finishing element finishing surfaces attached to a magnetic member(s) is preferred and applying localized pressure to the operative finishing interface with a plurality of finishing element finishing surfaces attached to a plurality of magnetic members is more preferred.

Figure 9A:
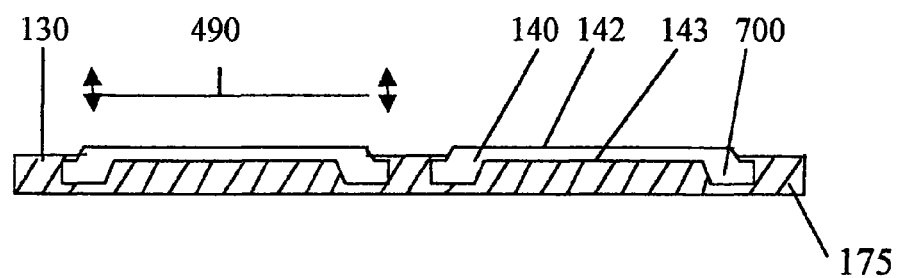
FIGS. 9a, 9b, and 9c are cross-sectional views of further alternate preferred embodiments of a magnetic finishing element
Figure 9B:
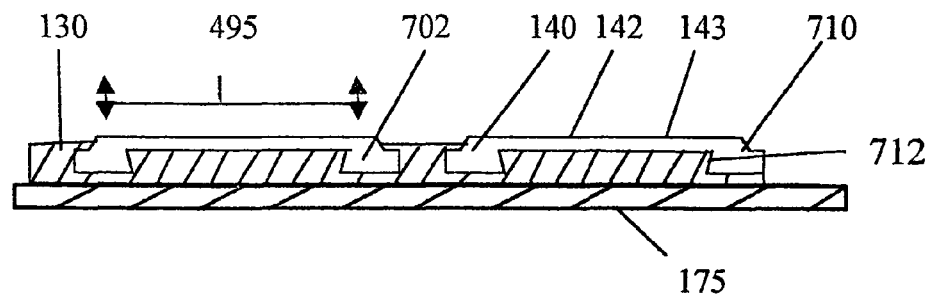

A finishing element having discrete finishing members having at least of a portion of its surface facing away from the workpiece being finished spaced apart from the unitary resilient body is preferred for some applications. FIGS. 9a and 9b are artist's expanded cross-sectional view representing some preferred spaced apart embodiments and the discrete finishing members having an interlocking mechanism with the unitary resilient body. FIG. 9a represents an artist's cross-section view showing a portion cross-sectional view of the discrete finishing member attached, more preferably fixedly attached, to the unitary resilient body. Reference Numeral 130 represents the unitary resilient body. Reference Numeral 140 represents the discrete finishing member and Reference Numeral 142 represents the finishing surface of the discrete finishing member. Reference Numeral 143 represents the surface of the discrete finishing member facing away from the workpiece being finished and is often referred to herein as the backside of the discrete finishing member. Reference Numeral 700 represents an interlocking mechanism to help fixedly attach the discrete finishing member to the magnetic composite member (Reference Numeral 175). In this particular preferred embodiment, an interlocking protrusion which extends into the magnetic composite member is shown. Also, the protrusion, in this illustrated embodiment, extends from an integral footer on the discrete finishing member. The integral footer, as shown here, applies a variable pressure to the backside of the discrete finishing member to help reduce unwanted motion of the discrete finishing member due to shearing forces during finishing. The motion of the discrete finishing member during finishing is represented by Reference Numeral 490. The chamfers illustrated in this FIG. 9a can aid in fixedly attaching the discrete finishing member to magnetic composite member and also ease the discrete finishing member over the "up areas" on the workpiece being finished and thus help reduce unwanted surface damage to the workpiece surface being finished. A physical attaching mechanism at least in part can be preferred fixedly attachment in some finishing elements. Nonlimiting preferred examples of a physical attaching mechanism is a friction mechanism, an interlocking mechanism, and an interpenetrating mechanism. A finishing element having discrete finishing members having at least of a portion of its surface facing away from the workpiece being finished spaced apart from the unitary resilient body is preferred for some applications. FIG. 9b represents an artist's cross-section view showing a portion cross-sectional view of the discrete finishing member fixedly attached to the unitary resilient body. Reference Numeral 130 represents the unitary resilient body. Reference Numeral 140 represents the discrete finishing member and Reference Numeral 142 represents the finishing surface of the discrete finishing member. Reference Numeral 143 represents the surface of the discrete finishing member facing away from the workpiece being finished and is often referred to herein as the backside of the discrete finishing member. Reference Numeral 175 represents a magnetic composite member which is attached to the resilient body. Reference Numeral 702 represents an interlocking mechanism to help fixedly attach the discrete finishing member to the unitary resilient body. In this particular preferred embodiment, an interlocking protrusion which extends into the unitary resilient body is shown. Also, the protrusion, in this illustrated embodiment, extends from an integral footer on the discrete finishing member. The integral footer, as shown here, applies a variable pressure to the backside of the discrete finishing member to help reduce unwanted motion of the discrete finishing member due to shearing forces during finishing. The motion of the discrete finishing member during finishing is represented by Reference Numeral 495. The chamfers illustrated by Reference Numerals 710 and 712 in this FIG. 9b can aid in fixedly attaching the discrete finishing member to unitary resilient body. Reference Numeral 712 optional chamfer on the discrete finishing member surface. The chamfer illustrated by Reference Numeral 712 can ease the discrete finishing member over the "up areas" on the workpiece being finished and thus help reduce unwanted surface damage to the workpiece surface being finished (and stress on the discrete finishing member during finishing). A rounded edge can be used to ease the workpiece over the "up areas" to reduce unwanted surface damage. A mechanical locking mechanism can be preferred for some finishing elements to aid fixedly attaching the discrete finishing member to the unitary resilient body. An interlocking mechanism can be preferred for some finishing elements to aid fixedly attaching the discrete finishing member to the unitary resilient body. An interpenetrating the unitary resilient body material with the discrete finishing members can be preferred to improve the ruggedness of some magnetic finishing elements.

Figure 9C:
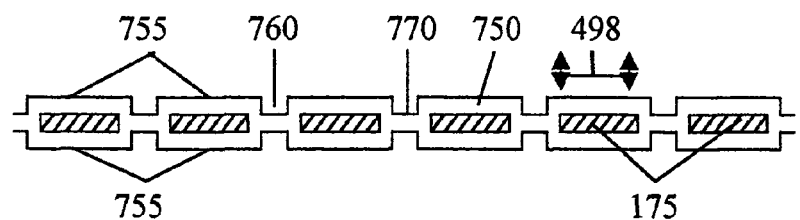

FIG. 9c is an artist's cross-sectional view of one preferred embodiment of an integral magnetic finishing element. Reference Numeral 750 represents the covering layer of the magnetic composite member (Reference Numeral 175). As shown, the covering layer composition can also be the composition used for the finishing surface as represented by Reference Numeral 755 (In this embodiment, a plurality of discrete finishing surfaces is illustrated). Preferred compositions and polymers have been discussed elsewhere herein. Thermoplastic elastomers are preferred covering compositions. Two phase polymeric compositions are preferred integral covering compositions. Thermoplastic vulcanizates (TPV)

are a preferred integral covering composition. An integral covering composition which forms a plurality of discrete finishing surfaces is preferred. An integral covering composition which both covers and connects all the magnetic composite members in the magnetic finishing element is preferred. An integral covering composition which both forms a corrosion reducing or protecting layer for the magnetic composite members and connects all the magnetic composite members in the magnetic finishing element is more preferred. An integral covering composition which forms a corrosion protecting layer for the magnetic composite members, connects all the magnetic composite members in the magnetic finishing element, and forms a flexible connection between magnetic composite members is even more preferred. An integral covering composition which both forms a corrosion protecting layer for the magnetic composite members, connects all the magnetic composite members in the magnetic finishing element, forms a flexible connection between composite members, and forms at least a portion of the magnetic element finishing surface is even more particularly preferred. Reference Numeral 498 represents the movement for finishing surfaces. Further guidance for a preferred plurality of discrete finishing surfaces is found herein under discrete finishing members.

Figure 10A:
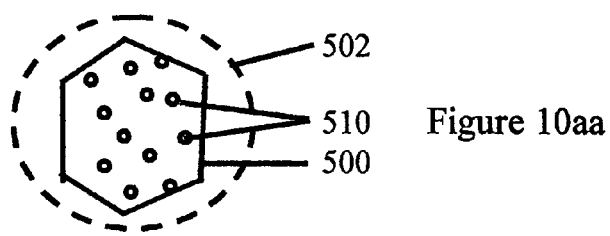
FIGS. 10a and 10b are cross-sectional views of a discrete finishing member
Figure 10A:
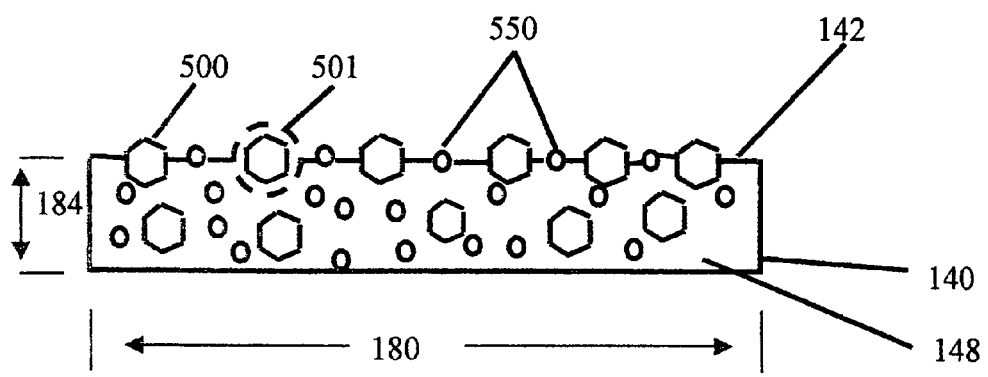
Figure 10B:
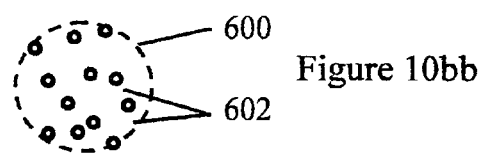
Figure 10B:
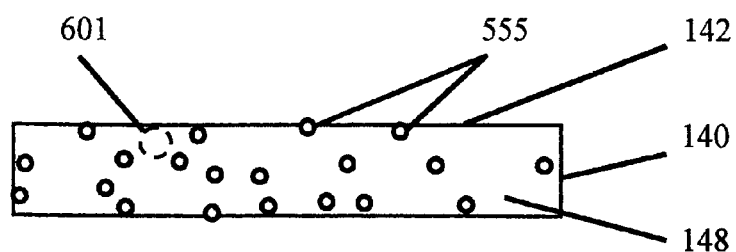

FIGS. 10a and 10b are artist's representation cross-sections of several preferred embodiments of the discrete finishing members and/or magnetic finishing element finishing surfaces of this invention. The magnetic members are not shown in these figures to simplify them. In FIGS. 10a and 10b, Reference Numeral 140 represents the discrete finishing member, Reference Numeral 142 represents the discrete finishing member finishing surface and Reference Numeral 148 represents the discrete finishing member body. A discrete member body having a continuous phase synthetic resin matrix in discrete finishing member is preferred. In FIG. 10a, Reference Numeral 500 represents discrete regions of material, preferably soft organic synthetic resin, optionally having dispersed therein abrasives, preferably abrasive particles. In FIG. 10aa, Reference Numeral 502 represents a magnified view of Reference Numeral 501 showing the abrasive particles (Reference Numeral 510) in the discrete regions of soft material (Reference Numeral 500). Reference Numeral 510 represents the abrasive particles in the discrete regions of material in FIG. 10a. Optional abrasive particles can be dispersed in both the discrete regions of synthetic material and in the continuous phase of synthetic resin to advantage. Different abrasive particles dispersed in the continuous phase of synthetic resin and in the discrete regions of synthetic material are more preferred when abrasive particles are dispersed in both phases. A preferred discrete region of synthetic material is a discrete synthetic resin particle and more preferably a discrete soft synthetic resin particle. By adjusting the type and location of the abrasive particles, the finishing element finishing characteristics can be adjusted to advantage for the workpiece being finished. Reference Numeral 550 represents optional discrete finishing aids. The embodiment shown in FIG. 10a is particularly preferred because the discrete abrasive regions can be finely tuned to particular finishing needs of the semiconductor wafer while maintaining control of the flexibility of the discrete finishing member body. Also shown is the thickness of the discrete finishing member body (Reference Numeral 184) and the shortest distance across the discrete finishing member body (Reference Numeral 180). Control of the ratio of the shortest distance across in centimeters of the discrete finishing member body to the thickness in centimeters of the discrete finishing member body can improve finishing. A ratio of the shortest distance across in centimeters of the discrete finishing member body to the thickness in centimeters of the discrete finishing member body of at least 10/1 is preferred and a ratio of at least 20/1 is more preferred and a ratio of at least 30/1 is even more preferred. A ratio of the shortest distance across in centimeters of the discrete finishing member body to the thickness in centimeters of the discrete finishing member body of from 10/1 to 1000/1 is preferred and a ratio of from 20/1 to 1000/1 is more preferred and a ratio of from 30/1 to 500/1 is even more preferred. A finishing element having all of the discrete finishing members separated from their nearest discrete finishing member neighbor by at least ½ the thickness of the finishing member in centimeters is preferred and a finishing element having all of the discrete finishing members separated from their nearest discrete finishing member neighbor by at least 1 times the thickness of the finishing member in centimeters is more preferred and a finishing element having all of the discrete finishing members separated from their nearest discrete finishing member neighbor by at least times the thickness of the finishing member in centimeters is even more preferred. The separating distance reduces unwanted interactions between neighboring discrete finishing members during finishing helping to reduce unwanted surface damage to the workpiece surface being finished and/or the finishing element during manufacturing and shipping. A specific maximum distance of separation of the finishing elements from their nearest neighbor has yet to be determined but as the distance becomes larger, fewer discrete finishing members are contained in the finishing element which can cause unwanted reductions in finishing rate and/or higher than necessary localized pressures. For this reason, a finishing element having all of the discrete finishing members separated from their nearest discrete finishing member neighbor by from ½ to 10 the thickness of the discrete finishing member in centimeters is currently preferred and a finishing element having all of the discrete finishing members separated from their nearest discrete finishing member neighbor by from 1 to 6 times the thickness of the discrete finishing member in centimeters is currently more preferred In FIG. 10b, Reference Numeral 601 represents a small region in a different discrete finishing member body which is magnified in FIG. 10bb Reference Numeral 600 to show the abrasive particles Reference Numeral 602. Reference Numeral 555 represents optional regions of soft organic synthetic resin and/or modifier materials. Preferably, in the embodiment shown FIG. 10b the abrasives are dispersed in the discrete finishing member body. This prolongs the useful life of the discrete finishing member body even after conditioning of the finishing element.

Current commercial semiconductor polishing apparatus can tend to lead to a higher cost for manufacture semiconductor wafers. Current commercial polishing equipment have multiple mechanical drives which are complex, space consuming, and expensive. No finishing apparatus is currently available which can drive, with a magnetic coupling force, multiple different finishing elements with multiple finishing surfaces. This versatility can improve finishing and lower the manufacturing cost for finishing workpieces such as semiconductor wafers. The new finishing apparatus has a different structure and functions in a different way to accomplish these new and useful results. Parts of the magnetic finishing element of this invention can be generally be made on high volume plastic processing equipment and at low cost. The new discrete finishing members can be generally be made with current commercial thermoplastic materials having low processing costs and in addition have excellent toughness and reinforcement characteristics which help to increase finishing element life expectancy and thus further reduce costs to finish a semiconductor wafer. The magnetic finishing elements of this invention can be made with current commercial synthetic resin materials having broad range Shore A hardness, Shore D hardness, flexural modulus, coefficient of friction, and compressibility to customize the "responsiveness" of the finishing element finishing surface to applied pressure and the way it urges the discrete finishing members against the workpiece surface to effect finishing in both local and global regions. Discrete finishing surfaces and their interactions with the magnetic composite members and optional unitary resilient body can be customized for improve both local planarizing and global planarizing. Discrete finishing member finishing surfaces and their interactions with the magnetic composite members along with the optional resilient members such as a unitary resilient body can be designed to enhance selectivity and improve control particularly near the end-point. Still further, the magnetic finishing element can be used as a reservoir to efficiently and effectively deliver finishing aids to the operative finishing interface. Finishing aids and/or preferred continuous phase synthetic resin matrices can help lubricate the operative finishing interface. Higher than needed tangential frictional forces can cause mechanical failure in some semiconductor wafers such as those having a plurality of metal layers, even more particularly when low-k dielectric layers are also incorporated in the semiconductor wafer structure. Differential film lubrication and/or boundary lubrication can enhance localized finishing rates to improve the semiconductor wafer surface while helping to control overall friction forces. Supply of an organic lubricating film is preferred. A marginal amount of organic lubricating film layer or boundary lubricating layer often can help meeting a plurality of these objectives simultaneously. Still further, the finishing equipment can be made with lower costs. Lubrication reduces breaking away of the optionally preferred abrasive particles from the surface of the fixed abrasive finishing element by reducing friction forces. Localized and or micro localized distortions to the surface of a fixed abrasive finishing element and chatter can also occur with other finishing motions and/elements and lubrication can reduce or eliminate these. By having optional discrete synthetic resin particles having abrasives dispersed in the discrete finishing members, the synthetic resin in the discrete synthetic resin particles can be further customized by adjusting such preferred properties as Shore A hardness (Shore D hardness), flexural modulus, coefficient of friction, and resilience to interact with both the workpiece surface being finished and also the discrete finishing member to make a very versatile, low cost manufacturing platform to produce customized low cost fixed abrasive finishing elements. With the above advantages, the new magnetic finishing elements can be customized and made on low cost, highly efficient manufacturing equipment to produce high performance, unique versatile fixed abrasive finishing elements. The magnetic finishing elements of this invention can improve the yield and lower the cost of finishing semiconductor wafer surfaces. Still further preferred embodiments are described elsewhere herein. The magnetic composite member(s), resilient body members, and the magnetic finishing element finishing surface interact and cooperate in a new and useful way to improve finishing.

By providing a magnetically responsive finishing element free of any physically connected movement mechanism, finishing apparatus can generally be made at lower cost. By providing a magnetic driving means for magnetically responsive finishing elements free of any nonmagnetic driving mechanism, parallel operative finishing motions with the new magnetic finishing apparatus can generally be more efficient, effective, and versatile than prior known finishing apparatus and methods. In a preferred mode, operative finishing motion of the workpiece can be free of circular motion. By providing a preferred lubricant to reduce the friction in the operative finishing interface, the coefficient of friction can be reduced and better controlled with preferred control subsystems as taught herein.

The new problem recognition and unique solution are new and considered part of this current invention.

Magnetic Refining Element

Preferred magnetically responsive refining and finishing elements have been described in the Figures herein. A cohesive finishing element is a preferred illustrative example. A preferred finishing element of this invention have at least two different layers, one layer having a finishing surface and one layer comprising a layer or material capable of magnetic coupling. A preferred finishing element of this invention have regions having at least two different layers, one layer having a plurality of discrete finishing surfaces and one layer comprising a layer capable of magnetic coupling. Optional discrete finishing members can comprise at least a portion of the finishing surface. An optional resilient body member, preferably a unitary resilient body member, can comprise a continuous layer throughout the finishing element or discrete layers in the magnetic finishing element. The discrete finishing members preferably are uniformly shaped. A rectangle is a preferred uniform shape. A circle is a preferred uniform shape. An oval is a preferred uniform shape. An hexagon shape is a preferred uniform shape. A shape combining elements of an oval and a rectangular shape is a preferred uniform shape. The discrete finishing member can be arranged randomly or in a pattern on the unitary resilient body. Each discrete finishing member is preferably spaced apart from its nearest discrete finishing member neighbor. In other words, a finishing element having each discrete finishing member separated from its nearest discrete finishing member neighbor is generally preferred. Still in other words, a finishing element having each discrete finishing member spaced apart from and free of contact with its nearest discrete finishing member neighbor is generally preferred. In other words, the discrete finishing members are generally separated in space from their nearest discrete finishing member neighbors. This spacing apart facilitates preferred discrete finishing member motion during finishing.

The finishing surface is attached to the magnetic composite member. The finishing surface can optionally be replaced. As an illustrative example, the finishing surface can be bonded to the magnetic composite member with adhesive. The adhesive can be soluble in a solvent or chemical solution which is not used for finishing. In another embodiment, the bonding is temperature sensitive such that changing the temperature weaken the adhesive outside of the finishing temperature such as at higher temperatures can be used. The finishing surface can be mechanically attached (directly or indirectly) to the magnetic composite member and/or layer (or magnetic responsive member or layer). A temporary attachment can be preferred for some finishing operations. A temporary mechanical attachment is a preferred temporary attachment. A temporary mechanical attachment can be preferred for some types of finishing apparatus. Examples of a temporary mechanical attachment are a snap fit, friction fit, threaded mechanism, and cam locking mechanism. A permanent mechanical attachment can be preferred for some types of finishing apparatus. The finishing surface can be mechanically attached to the magnetic composite member and/or layer. A temporary mechanical connection can be preferred for some types of finishing apparatus. A permanent mechanical connection can be preferred for some types of finishing apparatus.

Magnetic Composite Member

The magnetic composite member contains a composition which is capable of magnetic attraction. A ferromagnetic material is a preferred ingredient. A magnetic metal is a preferred ingredient. The magnetic materials can be in many shapes and forms. A magnetic metal salt is a preferred ingredient. Rare earth elements having an atomic number from 58 (Ce) to 71 (Lu) are preferred ingredients. A magnetic composite member comprising a plurality of metal atoms is preferred. A magnetic composite member comprising a multiphase magnetic composite or system is especially preferred. A magnetic composite member comprising a magnetically responsive alloy or compound is especially preferred. The magnetic materials can be rods, plates, and/or particles. The magnetic particles may be bound to each other through such process as sintering or adhesives. The magnetic particles can be mixed with a polymeric material(s) and binders. A thermoplastic material is a preferred polymeric material. A thermoset material is a preferred polymeric material. A magnetic finishing member having a plurality magnetic poles is preferred.

Optionally and preferably, any material which can corrode or otherwise contaminate the finishing process is coated with a protective coating. Optionally and preferably, any material which can corrode or otherwise contaminate the finishing process is covered with a protective layer. Polymers are a preferred protective layer and/or protective coating. Protective coatings and layers are generally known to those skilled in the art. Illustrative nonlimiting examples include epoxies, polyurethanes, polyolefins, and halocarbons such chlorocarbons and fluorocarbons. Protective layers and protective coating are free of any contaminants which will degrade the performance of the semiconductor wafers are preferred. Corrosion products and free contaminants can seriously adversely affect the semiconductor production yields.

U.S. Pat. Nos. 5,464,670 to Ikuma et al., 5,470,400 to Bogatin et al., 5,567,746 to Gay, and 5,932,134 to Christ et al. comprise illustrative nonlimiting examples of types of magnetic composite members and other useful information and each is contained by reference in their entirety for teaching and guidance herein and can be adapted for new magnetically applied finishing motions and are thus given for general guidance for those skilled in the arts.

Additional generally useful polymers are included herein in other sections.

Optional Unitary Resilient Body

The unitary resilient body forms a continuous layer in the finishing element. A plurality of discrete resilient members can also be used. The resilient member forms a flexible member allowing limited motion of the discrete finishing members during the finishing operation. Preferred limited motion is represented by Reference Numerals 450, 460, and 470 in FIGS. 7a, 7b, and 7c respectively. The limited motion is influenced by the magnetic force applied between the unitary resilient body and the discrete finishing members along with any third layer members. Properties of the unitary resilient body which are preferably controlled include the hardness of the unitary resilient body, the flexural modulus of the unitary resilient body, and the compression set of the unitary resilient body. The limited motion urges the discrete finishing members against the workpiece surface in local areas (in operative finishing contact with the discrete finishing members) while facilitating global flexibility in the finishing element (such as at the areas in between the discrete finishing members shown in FIG. 7b in Reference Numeral 400. In finishing elements having three layers such as shown in FIGS. 7b and 7c, the unitary flexible body also forms a cooperative laminate construction which can stiffen the localized regions having the discrete finishing members.

A unitary resilient body comprising an elastomer is preferred. A preferred elastomer is a thermoset elastomer. Another preferred elastomer is a thermoplastic elastomer. A preferred synthetic resin is a polyolefin elastomer. Some particularly preferred elastomers include synthetic resins selected from the group consisting of polyurethanes, acrylics, acrylates, polyamides, polyesters, chloroprene rubbers, ethylene propylene polymers, butyl polymers, polybutadienes, polyisoprenes, EPDM elastomers, and styrene butadiene elastomers. Thermoplastic elastomers can have preferred processing characteristics. Polyolefin elastomers can be preferred for their generally low cost. A cross-linked elastomer can have improved thermoset properties and also chemical resistant and thus can be preferred. A thermoplastic vulcanizate comprises a preferred composition. A multiphase thermoplastic elastomer comprises a preferred composition and a multiphase thermoplastic elastomer having a compatibilizing agent is even more preferred. A finishing element comprising a compressible porous material is preferred and comprising organic synthetic polymer of a compressible porous material is more preferred.

Foamed sheets of elastomers suitable for some preferred embodiments of the invention are available from commercially Rodel in Newark, Del. and Freundenberg in Lowell, Mass. Refining surface, discrete refining surfaces, and discrete refining member A refining element having a refining surface is preferred. A refining element having a plurality of discrete refining surfaces is more preferred. A finishing element having a finishing surface is preferred. A finishing element having a plurality of discrete finishing surfaces is more preferred. An abrasive finishing is preferred for some finishing. A non-abrasive finishing surface can be preferred for particularly delicate finishing. A discrete refining or finishing member surface can be a preferred discrete refining or finishing surface.

The ratio of the area in square centimeters of the surface of the discrete finishing surface to the area in square centimeters of the surface of the surface of the semiconductor die being finished can give useful guidance for finishing improvements. Each discrete finishing surface having a surface area of less than the surface area of the semiconductor wafer being finished is preferred. Each discrete finishing surface having a surface area of less than the surface area of the semiconductor wafer being finished and at least the surface area of the die being finished is more preferred. A ratio of the area of the surface of the discrete refining surface(s) (such as the finishing surface of a discrete finishing member) to area of the die of at least 1/1 is preferred and of at least 2/1 is more preferred and of at least 3/1 is even more preferred and of at least 4/1 is even more particularly preferred. A ratio of the area of the surface of the discrete refining surfaces to area of the die of from 1/1 to 20/1 is preferred and of from 2/1 to 15/1 is more preferred and of from 3/1 to 10/1 is even more preferred and of from 4/1 to 10/1 is even more preferred. A ratio of the area of the surface of the discrete finishing surfaces to area of the die of at least 1/1 is preferred and of at least 2/1 is more preferred and of at least 3/1 is even more preferred and of at least 4/1 is even more particularly preferred. A ratio of the area of the surface of the discrete finishing surfaces to area of the die of from 1/1 to 20/1 is preferred and of from 2/1 to 15/1 is more preferred and of from 3/1 to 10/1 is even more preferred and of from 4/1 to 10/1 is even more preferred. These ratios tend to optimize the cooperative motions discussed in relation to FIGS. 7a, 7b, and 7c. A discrete finishing surface having a surface area sufficient to simultaneously cover at least two regions of high device integration during finishing of the semiconductor wafer is preferred and a surface area sufficient to simultaneously cover at least five regions of high device integration during finishing of the semiconductor wafer is more preferred and a surface area sufficient to simultaneously cover at least ten regions of high device integration during finishing of the semiconductor wafer is even more preferred. A refining surface, preferably discrete refining surface, having a surface area sufficient to simultaneously cover from 2 to 100 regions of high device integration during refining of the semiconductor wafer is preferred and a surface area sufficient to simultaneously cover 2 to 50 regions of high device integration during refining of the semiconductor wafer is more preferred and a surface area sufficient to simultaneously cover from 5 to 50 regions of high device integration during refining of the semiconductor wafer is even more preferred. A refining surface, preferably a discrete refining surface, having a surface area sufficient to simultaneously cover from 2 to 100 regions of high pattern density during refining of the semiconductor wafer is preferred and a surface area sufficient to simultaneously cover 2 to 50 regions of high pattern density during refining of the semiconductor wafer is more preferred and a surface area sufficient to simultaneously cover from 5 to 50 regions of high pattern density during refining of the semiconductor wafer is even more preferred. A discrete finishing surface, preferably discrete finishing surface, having a surface area sufficient to simultaneously cover from 2 to 100 regions of high device integration during finishing of the semiconductor wafer is preferred and a surface area sufficient to simultaneously cover 2 to 50 regions of high device integration during finishing of the semiconductor wafer is more preferred and a surface area sufficient to simultaneously cover from 5 to 50 regions of high device integration during finishing of the semiconductor wafer is even more preferred. A discrete finishing surface having a surface area sufficient to simultaneously cover from 2 to 100 regions of high pattern density during finishing of the semiconductor wafer is preferred and a surface area sufficient to simultaneously cover 2 to 50 regions of high pattern density during finishing of the semiconductor wafer is more preferred and a surface area sufficient to simultaneously cover from 5 to 50 regions of high pattern density during finishing of the semiconductor wafer is even more preferred. A line pattern density and a oxide pattern density are preferred types of pattern density. The size of the preferred discrete finishing surface is also dependent on the specific design and layout of the die and the wafer but applicant believes that the above ratios will serve as helpful general guidance.

A fixed abrasive finishing member surface layer having discrete synthetic resin particles dispersed throughout at least a portion of its thickness, such that if some of the surface is removed additional discrete synthetic resin particles are exposed on the newly exposed surface is preferred. A finishing member surface having a three dimensional dispersion of discrete synthetic resin particles is particularly preferred. A fixed abrasive discrete finishing surface having a plurality of discrete synthetic resin particles substantially uniformly dispersed throughout at least a portion of its thickness is more preferred. A fixed abrasive discrete finishing surface having a plurality of discrete synthetic resin particles uniformly dispersed throughout at least a portion of the member's thickness and wherein the discrete synthetic resin particles have abrasive particles dispersed therein is even more preferred. Having a discrete finishing surface having a three dimensional dispersion of discrete synthetic resin particles can facilitate renewal of the finishing surface during finishing element conditioning. During finishing of a workpiece, it is preferred that a discrete finishing surface having a three dimensional discrete synthetic resin particles is substantially uniform over the depth the finishing surface used. Any nonuniform surface formed during manufacture due to the processing and/or forming conditions when manufacturing the discrete finishing surfaces is preferably removed prior to finishing of the workpiece surface. A thin nonuniform layer can be removed by cutting the unwanted nonuniform layer off. A thin nonuniform layer can be removed by abrasive means. A nonuniform skin can be formed by settling due to density differences of the components and/or due to specific shear conditions or surface interactions with a molding or forming surface.

Synthetic resin polymers are generally available commercially. Illustrative nonlimiting examples of commercial suppliers of useful organic synthetic polymers include Exxon Co., Dow Chemical, Sumitomo Chemical Company, Inc., DuPont Dow Elastomers, Bayer, and BASF. Further illustrative information regarding versatile refining elements is found in U.S. application Ser. No. 10/822,515 and is included by reference in its entirety for all purposes.

Preferred Abrasive Surfaces—Further Comments

An abrasive three dimensional refining surface is preferred. An abrasive three dimensional abrasive discrete finishing member is a preferred abrasive three dimensional refining surface. The abrasive particles are preferably attached to a synthetic resin. Abrasive particles which are bonded to adjacent synthetic organic synthetic resin is more preferred. One or more bonding agents can be used. Illustrative nonlimiting examples of abrasive particles in the discrete synthetic resin particles comprise silica, silicon nitride, alumina, and ceria. Fumed silica is particularly preferred. A metal oxide is a type of preferred abrasive particle. A particularly preferred particulate abrasive is an abrasive selected from the group consisting of iron (III) oxide, iron (II) oxide, magnesium oxide, barium carbonate, calcium carbonate, manganese dioxide, silicon dioxide, cerium dioxide, cerium oxide, chromium (III) trioxide, and aluminum trioxide. Abrasive particles having an average diameter of less than 0.5 micrometers are preferred and less than 0.3 micrometer are more preferred and less than 0.1 micrometer are even more preferred and less than 0.05 micrometers are even more particularly preferred. Abrasive particles having an average diameter of from 0.5 to 0.01 micrometer are preferred and between 0.3 to 0.01 micrometer are more preferred and between 0.1 to 0.01 micrometer are even more preferred. These abrasive particles are currently believed particularly effective in finishing semiconductor wafer surfaces. Smaller abrasive particles can be preferred in the future as feature sizes decrease.

For refining or finishing of semiconductor wafers having low-k dielectric layers, finishing aids, more preferably lubricating aids, are preferred. Illustrative nonlimiting examples of low-k dielectrics are low-k polymeric materials, low-k porous materials, and low-k foam materials. Some further examples of preferred low-k dielectric materials are aerogels, xerogels, parylene, fluorocarbons, polyaromatic polymers, and polyaromatic ether polymers. As used herein, a low-k dielectric has at most a k range of less than 3.5 and more preferably less than 3.0. Illustrative examples include doped oxides, organic polymers, highly fluorinated organic polymers, and porous materials. A high flexural modulus organic synthetic resin comprising an engineering polymer is also preferred. A high flexural modulus organic synthetic resin containing even higher modulus organic synthetic resin particles can also be preferred for finishing some sensitive low-k materials. An illustrative example of the manufacture of a tough high flexural modulus synthetic resin containing an even higher modulus organic synthetic resin particles is found in U.S. Pat. No. 5,508,338 to Cottis et al. As used herein, even higher flexural modulus organic synthetic resin particles than the continuous region of high flexural modulus organic synthetic resin are referred in this specification as abrasive organic synthetic resin particles. A discrete finishing member having discrete abrasive organic synthetic resin particles is preferred for some low-k dielectric layer finishing. Abrasive organic synthetic resin particles having a flexural modulus of at most 100 times higher than the low-k dielectric layer flexural modulus is preferred and having a flexural modulus of at most 50 times higher than the low-k dielectric layer flexural modulus is more preferred and having a flexural modulus of at most 25 times higher than the low-k dielectric layer flexural modulus is even more preferred. Abrasive organic synthetic resin particles having a flexural modulus of at least equal to the low-k dielectric layer flexural modulus is preferred and having a flexural modulus of at least 2 times higher than the low-k dielectric layer flexural modulus is more preferred. Flexural modulus is believed to be useful for guidance to aid initial screenings. Abrasive synthetic resin particles can help to reduce unwanted surface damage of the low-dielectric layer.

A discrete synthetic resin particle having a three dimensional dispersion of abrasive particles as used herein is a discrete synthetic resin particle having abrasive particles dispersed in the discrete synthetic resin particle, such that if some of the surface is removed additional abrasive particles are exposed on the newly exposed surface. A three dimensional abrasive discrete synthetic resin particle is a preferred means for incorporating abrasive particles in the discrete finishing member. A three dimensional abrasive discrete synthetic resin particle having a plurality of abrasive particles substantially dispersed throughout at least a portion of its volume is more preferred. A three dimensional abrasive discrete synthetic resin particle having a plurality of abrasive particles substantially uniformly dispersed throughout at least a portion of its volume is more preferred. A three dimensional abrasive discrete synthetic resin particle having a plurality of abrasive particles uniformly dispersed throughout at least a portion of its volume is even more preferred. Having a three dimensional abrasive discrete synthetic resin particle can facilitate renewal of the finishing surface during finishing element conditioning.

Discrete synthetic resin particles having abrasive particles dispersed therein can be made by generally known procedures to those skilled in the abrasive arts. For example, an abrasive slurry can be formed by mixing thoroughly 10 parts of trimethanolpropane triacrylate, 30 parts of hexanediol diacrylate, 60 of parts alkl benzyl phthalate plasticizer, 6.6 parts of isopropyl triisostearoly titanate, 93.2 parts of 2,4,6-trimethylbenzoyl-diphenyl-phosphine oxide photoiniatator and then mixing in 170 parts of cerium oxide followed by mixing in a further 90 parts of calcium carbonate and then curing in a thin sheets. The cured sheets are then ground into discrete synthetic resin particles having abrasive particles therein. As a second and currently preferred example, to a monomer phase of a synthetic resin having a reactive functional group(s) is added a second linking monomer which in turn has a both a linking functional group and a particulate bonding group. The linking functional group is selected to covalently bond to the synthetic resin reactive functional group. The abrasive particle bonding group is selected to covalently bond with the abrasive particles such as silica. An example of a linking monomer is alkyl group with from 8-20 carbon atoms and having a carboxylic linking functional group and a trichlorosilane abrasive particle bonding group. Additional preferred, non limiting examples of useful bonding groups include carboxylic acid groups, epoxy groups, and anhydride groups. Additional nonlimiting information on the formation of synthetic resin matrices having abrasive particles dispersed and/or bound therein include U.S. Pat. Nos. 5,624,303 to Robinson, 5,692,950 to Rutherford et. al., and 5,823,855 to Robinson et. al. and are included herein by reference in their entirety for guidance and modification as appropriate by those skilled in the art. Synthetic matrices having dispersed abrasive particles can be formed into discrete synthetic resin particles having dispersed abrasive particles by using grinding technology generally known to those skilled in the art. Cold grinding is sometimes helpful. Cryogenic grinding can also be useful. Methods to sort by size are generally known and preferable. Further, the discrete synthetic resin particles are preferably cleaned before use. Washing using generally known solvents and/or reagents can also be useful.

Optional Stabilizing Fillers in Refining Elements

A fibrous filler is a preferred stabilizing filler for the synthetic resins of this invention. A fibrous filler is a particularly preferred additive to the synthetic resin of the continuous phase synthetic resin matrix in the finishing element surface and also in the synthetic resin of the subsurface layer. A plurality of synthetic fibers are particularly preferred fibrous fillers. Fibrous fillers tend to help generate a lower abrasion coefficient and/or stabilize the finishing member finishing surface from excessive wear. By reducing wear the finishing element has improved stability during finishing.

U.S. Pat. Nos. 4,877,813 to Jimmo, 5,079,289 to Takeshi et al., and 5,523,352 to Janssen are included herein by reference in its entirety for general guidance and appropriate modification by those skilled in the art.

Further Comments on Preferred Finishing Element

Manufacture of refining surfaces are known. Manufacture of porous refining surfaces are known. Manufacture of nonporous refining surfaces are known. Manufacture of resilient foamed composite articles are known. Foamed laminates and their production are generally known to those in the foam arts. Multicomponent shaped foamed articles are generally known in the foam arts. Generally blowing agents are used to produce foams. Melting the foamed material which is later removed after solidification can also produce foamed products. Foams often have at least some crosslinking. Foams can be open celled or closed celled foams. Chemical bonding with composite shapes such as laminates is generally known in the foamed arts. Molding composite foamed shapes are also known in the foamed arts. Illustrative nonlimiting examples of some general foam technology in the art include U.S. Pat. Nos. 3,924,362 to McAleer, 3,989,869 to Neumaier et al., 4,674,204 to Sullivan et. al., 4,810,570 to Rutten et. al., 4,997,707 to Otawa et al., 5,053,438 to Kozma, 5,254,641 to Alex et al., 5,397,611 to Wong, 5,581,187 to Sullivan et al., 5,786,406 to Uejyukkoku et al., and 5,847,012 to Shalaby et. al. and are included herein in their entirety for general foam and foam composite guidance and for modification by those skilled in the art. As only one nonlimiting example, the discrete finishing members can be positioned on a release film on the inside and then a foam laminate can be formed using known foam laminate technology. When the laminate is formed and the release sheet is removed, the discrete finishing members will be foamed in place in recess. Bonding agents can enhance the fixed attachment of the discrete finishing members to the foam.

Figure 11:
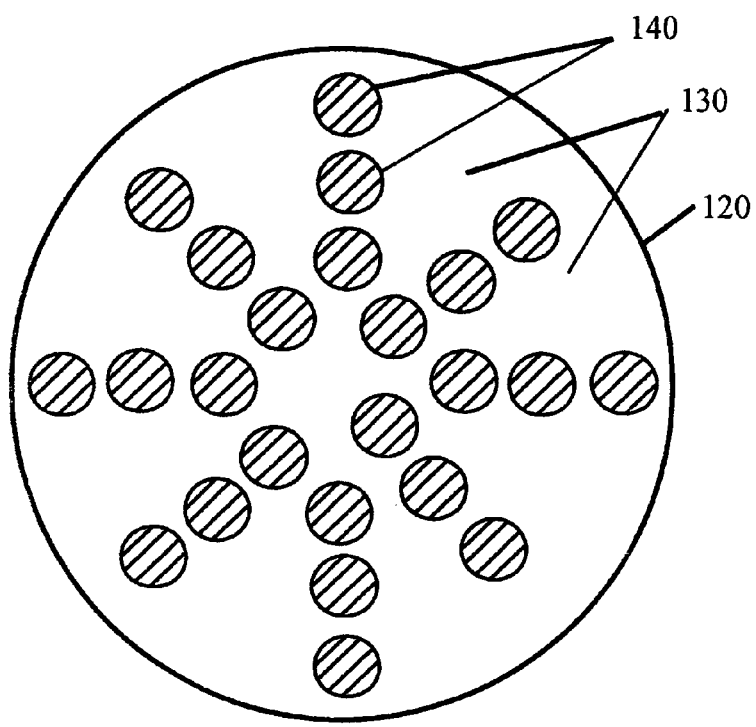
FIG. 11 is an artist's view a preferred arrangement of the discrete finishing members in the finishing element FIG. 12a & b is an artist's representation of local high finishing rate regions and some local low finishing rate regions FIG. 12c, d, & e is an artist's representation of preferred method of electro-refining

Another preferred arrangement is shown in FIG. 11 wherein the discrete finishing members (Reference Numeral 140) are fixedly attached to a unitary resilient body (Reference Numeral 130) in the magnetic finishing element (Reference Numeral 120). In this embodiment, the magnetic composition member is not shown because it lies below the optional unitary resilient body. Preferably the discrete finishing members are arranged in a manner to finish the workpiece surface being finished at a uniform rate across the macro workpiece surface. In other words, a discrete finishing members arranged in pattern and size in the finishing element in a manner to cause a substantially a uniform finishing rate across the macro operative finishing interface is preferred and a discrete finishing members arranged in pattern and size in the finishing element in a manner to cause a uniform finishing rate across the macro operative finishing interface is more preferred. Macro uniform finishing rates can help improve quality and reduce costs. The versatility of the unitary finishing elements of this invention are unique and are part of the problem recognition and solution of this invention.

A preferred method of forming the unitary resilient body is molding. A preferred method of forming the discrete finishing member is molding. Molding can be done cost effectively and to tight tolerances. Injection molding is a preferred form of molding. Reaction injection molding (RIM) is a preferred form of molding. Thermoset resins can be rapidly made to tight tolerances parts with RIM. Co-molding is a preferred form of molding. Co-injection molding is a preferred form of molding and co-molding. With co-injection molding, multiple organic synthetic resins can be molded into composite structures and thus the discrete finishing member and the unitary resilient body can be formed in one cycle. Close tolerances, rapid composite part formation, and low costs can be realized with co-injection molding. RIM is generally well known to those skilled in plastics processing. Co-injection molding is also generally known. Co-injection molding can be effected from a plurality of resins by blocking of injection channels with pairs of abutting plates and separating the plates to unblock a channel or channels to permit sequentially injecting different resins. General guidance for co-injection molding can be found in U.S. Pat. Nos. 4,275,030 to Mares, 5,651,998 to Bertschi et al., and 5,814,252 to Gouldson et al. and these patents are included in their entirety for general guidance and modification by those skilled in the molding arts. Both RIM and co-injection molding can facilitate fixedly connecting the unitary resilient body to discrete finishing member by using either chemical and/or thermal energy during the forming process. Fixedly connecting the unitary resilient body to discrete finishing member with energy selected from the group consisting of thermal and chemical energy is preferred. Supplying a first organic synthetic resin composition to a mold and then supplying a second organic synthetic resin composition to the mold in the same molding cycle is preferred in a co-injection molding process. Supplying a first organic synthetic resin composition to a mold and then supplying a second organic synthetic resin composition to the mold in the same molding cycle forming an attachment between the first and second organic resin composition is more preferred in a co-injection molding process. Supplying a first organic synthetic resin composition to a mold and then supplying a second organic synthetic resin composition to the mold in the same molding cycle forming a bond between the first and second organic resin composition is even more preferred in a co-injection molding process. Supplying a first organic synthetic resin composition to a mold and then supplying a second organic synthetic resin composition to the mold in the same molding cycle forming a physical bond between the first and second organic resin composition is even more preferred in a co-injection molding process. Supplying a first organic synthetic resin composition to a mold and then supplying a second organic synthetic resin composition to the mold in the same molding cycle forming a chemical bond between the first and second organic resin composition is even more preferred in a co-injection molding process. Co-injection molding can make high precision finishing elements of this invention rapidly and at reduced cost.

Optionally Preferred Refining and Finishing Aid

A refining aid for changing the refining rate is preferred. A finishing aid for changing the finishing rate is preferred. Supplying an effective amount of refining aid which changes refining rate is preferred. Supplying an effective amount of refining aid which reduces the number of unwanted surface defects during refining is more preferred. Supplying an effective amount of refining aid which changes the differential refining rate on a heterogeneous workpiece surface is also more preferred. A reactive refining aid is also preferred.

Supplying an effective amount of finishing aid, more preferably a lubricating aid, which reduces the coefficient of friction between the finishing element finishing surface and the workpiece surface being finished is preferred. Supplying an effective amount of finishing aid, more preferably a lubricating aid, which reduces the unwanted surface damage to the surface of the workpiece being finished during finishing is preferred. Supplying an effective amount of finishing aid, more preferably a lubricating aid, which differentially lubricates different regions of the workpiece and reduces the unwanted surface damage to at least a portion of the surface of the workpiece being finished during finishing is preferred. An organic lubricating boundary layer is a preferred finishing aid.

Certain particularly preferred workpieces in the semiconductor industry have regions of high conductivity and regions of low conductivity. The higher conductivity regions are often comprised of metallic materials such as tungsten, copper, aluminum, and the like. An illustrative example of a common lower conductivity region is silicon or silicon oxide. A lubricant which differentially lubricates the two regions is preferred and a lubricant which substantially lubricates two regions is more preferred. An example of a differential lubricant is if the coefficient of friction is changed by different amounts in one region versus the other region during finishing. For instance one region can have the coefficient of friction reduced by 20% and the other region reduced by 40%. This differential change in lubrication can be used to help in differential finishing of the two regions. An example of differential finishing is a differential finishing rate between the two regions. For example, a first region can have a finishing rate of "X" angstroms/minute and a second region can have a finishing rate of "Y" angstroms per minute before lubrication and after differential lubrication, the first region can have a finishing rate of 80% of "X" and the second region can have a finishing rate of 60% of "Y". An example of where this will occur is when the lubricant tends to adhere to one region because of physical or chemical surface interactions (such as a metallic conductive region) and adhere or not adhere as tightly to the an other region (such as a non metallic, non conductive region). Changing the finishing control parameters to change the differential lubrication during finishing of the workpiece is a preferred method of finishing. Changing the finishing control parameters to change the differential lubrication during finishing of the workpiece which in turn changes the regional finishing rates in the workpiece is a more preferred method of finishing. Changing the finishing control parameters with in situ process control to change the differential lubrication during finishing of the workpiece which in turn changes the region finishing rates in the workpiece is an even more preferred method of finishing. The friction sensor probes can play a preferred role in detecting and controlling differential lubrication in the workpieces having heterogeneous surface compositions needing finishing.

A lubricant comprising a reactive lubricant is preferred. A lubricant comprising a boundary lubricant is also preferred. A reactive lubricant is a lubricant which chemically reacts with the workpiece surface being finished. A lubricant free of sodium is a preferred lubricant. As used herein a lubricant free of sodium means that the sodium content is below the threshold value of sodium which will adversely impact the performance of a semiconductor wafer or semiconductor parts made therefrom. A boundary layer lubricant is a preferred example of a lubricant which can form a lubricating film on the surface of the workpiece surface. As used herein a boundary lubricant is a thin layer on one or more surfaces which prevents or at least limits, the formation of strong adhesive forces between the workpiece being finished and the finishing element finishing surface and therefore limiting potentially damaging friction junctions between the workpiece surface being finished and the finishing element finishing surface. A boundary layer film has a comparatively low shear strength in tangential loading which reduces the tangential force of friction between the workpiece being finished and the finishing element finishing surface which can reduce surface damage to the workpiece being finished. In other words, boundary lubrication is a lubrication in which friction between two surfaces in relative motion, such as the workpiece surface being finished and the finishing element finishing surface, is determined by the properties of the surfaces, and by the properties of the lubricant other than the viscosity. A boundary film generally forms a thin film, perhaps even several molecules thick, and the boundary film formation depends on the physical and chemical interactions with the surface. A boundary lubricant which forms a thin film is preferred. A boundary lubricant forming a film having a thickness from 1 to 10 molecules thick is preferred and a boundary lubricant forming a film having a thickness from 1 to 6 molecules thick is more preferred and a boundary lubricant forming a film having a thickness from 1 to 4 molecules thick is even more preferred. A boundary lubricant forming a film having a thickness from 1 to 10 molecules thick on at least a portion of the workpiece surface being finished is particularly preferred and a boundary lubricant forming a film having a thickness from 1 to 6 molecules thick on at least a portion of the workpiece surface being finished is more particularly preferred and a boundary lubricant forming a film having a thickness from 1 to 4 molecules thick on at least a portion of the workpiece surface being finished is even more particularly preferred. A boundary lubricant forming a film having a thickness of at most 10 molecules thick on at least a portion of the workpiece surface being finished is preferred and a boundary lubricant forming a film having a thickness of at most 6 molecules thick on at least a portion of the workpiece surface being finished is more preferred and a boundary lubricant forming a film having a thickness of at most 4 molecules thick on at least a portion of the workpiece surface being finished is even more preferred and a boundary lubricant forming a film having a thickness of at most 2 molecules thick on at least a portion of the workpiece surface being finished is even more preferred. An operative motion which continues in a substantially uniform direction can improve boundary layer formation and lubrication. Friction sensor subsystems and finishing sensor subsystems having the ability to control the friction probe motions and workpiece motions are preferred and uniquely able to improve finishing in many real time lubrication changes to the operative finishing interface. Boundary layer lubricants, because of the small amount of required lubricant, can be effective lubricants for use in the operative finishing interface.

Limited zone lubrication between the workpiece being finished and the finishing element finishing surface is preferred. As used herein, limited zone lubricating is lubricating to reduce friction between two surfaces while simultaneously having wear occur. Limited zone lubricating which simultaneously reduces friction between the operative finishing interface while maintaining a cut rate on the workpiece surface being finished is preferred. Limited zone lubricating which simultaneously reduces friction between the operative finishing interface while maintaining an acceptable cut rate on the workpiece surface being finished is more preferred. Limited zone lubricating which simultaneously reduces friction between the operative finishing interface while maintaining a finishing rate on the workpiece surface being finished is preferred. Limited zone lubricating which simultaneously reduces friction between the operative finishing interface while maintaining an acceptable finishing rate on the workpiece surface being finished is more preferred. Limited zone lubricating which simultaneously reduces friction between the operative finishing interface while maintaining a planarizing rate on the workpiece surface being finished is preferred. Limited zone lubricating which simultaneously reduces friction between the operative finishing interface while maintaining an acceptable planarizing rate on the workpiece surface being finished is more preferred. Limited zone lubricating which simultaneously reduces friction between the operative finishing interface while maintaining a polishing rate on the workpiece surface being finished is preferred. Limited zone lubricating which simultaneously reduces friction between the operative finishing interface while maintaining an acceptable polishing rate on the workpiece surface being finished is preferred. Lubricant types and concentrations are preferably controlled during limited zone lubricating. Limited zone lubricating offers the advantages of controlled wear along with reduced unwanted surface damage. In addition, since limited zone lubrication often involves thin layers of lubricant, often less lubricant can be used to finish a workpiece.

Lubricants which are polymeric can be very effective lubricants. A lubricant having functional groups containing elements selected from the group consisting of chlorine, sulfur, and phosphorous is preferred and a boundary lubricant having functional groups containing elements selected from the group consisting of chlorine, sulfur, and phosphorous is more preferred. A lubricant comprising a fatty acid substance is a preferred lubricant. A preferred example of a fatty substance is a fatty acid ester or salt. Fatty acid salts of plant origin can be particularly preferred. A lubricant comprising a synthetic polymer is preferred and a lubricant comprising a boundary lubricant synthetic polymer is more preferred and a lubricant comprising a boundary lubricant synthetic polymer and wherein the synthetic polymer is water soluble is even more preferred. A lubricating polymer having a number average molecular weight from 400 to 150,000 is preferred and one having a number average molecular weight from 1,000 to 100,000 is more preferred and one having a number average molecular weight from 1,000 to 50,000 is even more preferred.

A lubricant comprising a polyalkylene glycol polymer is a preferred composition. A polymer of polyoxyalkylene glycol monoacrylate or polyoxyalkylene glycol monomethacrylate is very useful as a base of lubricant. A polyethylene glycol having a molecular weight of 400 to 1000 is preferred. Polyglycols selected from the group polymers consisting of ethylene oxide, propylene oxide, and butylene oxide and mixtures thereof are particularly preferred. A fatty acid ester can be an effective lubricant.

A polyglycol is an example of a preferred finishing aid. Preferred polyglycols include glycols selected from the group consisting of polyethylene glycol, an ethylene oxide-propylene butyl ethers, a diethylene glycol butyl ethers, ethylene oxide-propylene oxide polyglycol, a propylene glycol butyl ether, and polyol esters. A mixture of polyglycols is a preferred finishing aid. Alkoxy ethers of polyalkyl glycols are preferred finishing aids. An ultra high molecular weight polyethylene, particularly in particulate form, is an example of preferred finishing aid. A fluorocarbon resin is an example of a preferred lubricating agent. Fluorocarbons selected from the group consisting of polytetrafluoroethylene (PTFE), ethylene tetrafluoride/propylene hexafluoride copolymer resin (FEP), an ethylene tetrafluoride/perfluoroalkoxyethylene copolymer resin (PFA), an ethylene tetra fluoride/ethylene copolymer resin, a trifluorochloroethylene copolymer resin (PCTFE), and a vinylidene fluoride resin are examples of preferred fluorocarbon resin finishing aids. A polyphenylene sulfide polymer is a preferred polymeric lubricating aid. Polytetrafluoroethylene is a preferred finishing aid. Polytetrafluoroethylene in particulate form is a more preferred finishing aid and polytetrafluoroethylene in particulate form which resists reaggolmeration is a even more preferred finishing aid. A silicone oil is a preferred finishing aid. A polypropylene is a preferred finishing aid, particularly when blended with polyamide and more preferably a nylon 66. A lubricating oil is a preferred finishing aid. A polyolefin polymer can be a preferred effective lubricating aid, particularly when incorporated into polyamide resins and elastomers. A high density polyethylene polymer is a preferred polyolefin resin. A polyolefin/polytetrafluoroethylene blend is also a preferred lubricating aid. Low density polyethylene can be a preferred lubricating aid. A fatty acid substance can be a preferred lubricating aid. An examples of a preferred fatty acid substance is a fatty ester derived from a fatty acid and a polyhydric alcohol. Examples fatty acids used to make the fatty ester are lauric acid, tridecylic acid, myristic acid, pentadecylic acid, palmitic acid, margaric acid, stearic acid, nonadecylic acid, arachidic acid, oleic acid, elaidic acid and other related naturally occurring fatty acids and mixtures thereof. Examples of preferred polyhydric alcohols include ethylene glycol, propylene glycol, glycerol, homopolymers of ethylene glycol and propylene glycol or polymers and copolymers thereof and mixtures thereof.

Illustrative, nonlimiting examples of useful lubricants and systems for use in lubricated finishing element finishing surface systems and general useful related technology are given in the U.S. Pat. Nos. 3,287,288 to Reilling, 3,458,596 to Eaigle, 4,332,689 to Tanizaki, 4,522,733 to Jonnes, 4,544,377 to Schwen, 4,636,321 to Kipp et. al., 4,767,554 to Malito et. al., 4,877,813 to Jimo et. al., 4,950,415 to Malito, 5,079,287 to Takeshi et. al., 5,110,685 to Cross et. al., 5,216,079 to Crosby et. al., 5,225,249 to Biresaw, 5,368,757 to King, 5,401,428 to Kalota, 5,433,873 to Camenzind, 5,496,479 to Videau et. al., 5,523,352 to Janssen, 5,591,808 to Jamison, 5,614,482 to Baker et. al., and 5,990,225 to Sagisaka et al. and are included by reference in their entirety for guidance and modification by those skilled in the art and are included by reference in their entirety herein. Further nonlimiting and preferred examples of useful lubricated finishing technology are found in U.S. Pat. Nos. 6,267,644 to Molnar, 6,283,829 to Molnar, 6,291,349 to Molnar, and 6,293,851 to Molnar and are included by reference in their entirety for guidance and modification by those skilled in the art and are included by reference in their entirety herein. It is also understood that the lubricants and lubricant systems can be combined in many different ways to produce useful finishing results given the new guidance herein.

Some preferred suppliers of lubricants include Dow Chemical, Huntsman Corporation, and Chevron Corporation. An organic boundary layer lubricant consisting essentially of carbon, hydrogen, and oxygen is a particularly preferred lubricant. Organic boundary layer lubricants which are water soluble are also preferred and organic boundary layer lubricants free of mineral oils and vegetable oils can be preferred for applications where long term stability is especially preferred such as in slurry recycle applications.

Manufacture of Polymeric Components for Magnetic Finishing Elements

Synthetic resin polymer refining elements are generally known in the refining arts. The refining elements can optionally have one or more polymers therein. Multiphase synthetic resin polymer mixtures can be manufactured by preferred polymeric processing methods. Preformed synthetic resin particles can be mixed with the continuous phase synthetic resin in melt processing equipment such as extruders and melt blending apparatus. Preformed synthetic resin particles can be added under mixing conditions to a thermoset resin and mixed therein prior to curing. The preformed particles can contain preferred additives such as abrasive particles. Under high shear and temperature mixing conditions, a two phase synthetic resin mixture having discrete synthetic resin particles comprised of polymer "B" dispersed in a continuous phase of a separate synthetic resin polymer "A". Further, polymer "B" can contain preferred additives such as abrasives or fibers prior to the high shear melt mixing process. Alternately one or both of the synthetic resin polymers can be functionalized to graft with one of the polymers. The functional group can be capable of reacting during mixing with other functional groups. A block copolymer can be used to compatibilize the multiphase polymeric mixture. The mixing can be with self-cured elastomers. The melt mixing for dynamically vulcanizing at least one polymer in the multiphase synthetic resin mixture is preferred. Optionally, crosslinking agents can be used to enhance crosslinking. Crosslinking agents are generally specific to the polymer or polymeric system to be crosslinked and are generally well known by those skilled in the crosslinking arts. Illustrative examples of chemical crosslinking agents include peroxides, phenols, azides, and active compositions including sulfur, silicon, and/or nitrogen. Optionally, initiators can also be used to enhance crosslinking. Optionally, radiation can be used to enhance crosslinking. Generally, the radiation type and dosage is specific to the polymer system undergoing crosslinking. Crosslinking systems are effective crosslinking for the polymer or polymeric system being crosslinked and generally well known for different polymeric and elastomeric systems. Crosslinking systems can also employ moisture, heat, radiation, and crosslinking agents or combinations thereof the effect crosslinking. An agent for crosslinking can be preferred for specific finishing element components. The multiphase synthetic resin mixtures can have preferred morphologies and compositions to change wear, friction, flexural modulus, hardness, temperature sensitivity, toughness, and resistance to fatigue failure during finishing to improve finishing.

Illustrative examples of multiphase polymeric constructions, their manufacture, compatibilization, and dynamic crosslinking can be found in various United States patents. Included are various crosslinking systems, compatibibilizers, and specific guidance on mixing conditions for multiphase polymeric systems. U.S. Pat. Nos. 3,882,194 to Krebaum, 4,419,408 to Schmukler et al., 4,440,911 to Inoue et al., 4,632,959 to Nagano, 4,472,555 to Schmukler et al., 4,762,890 to Strait et al., 4,477,532 to Schmukler et al, 5,100,947 to Puydak et al., 5,128,410 to Illendra et al., 5,244,971 to Jean-Marc, 5,266,673 to Tsukahara et al., 5,286,793 to Cottis et al., 5,321,081 to Chundry et al., 5,376,712 to Nakajima, 5,416,171 to Chung et al., 5,460,818 to Park et al., 5,504,139 to Davies et al., 5,523,351 to Colvin et al., 5,548,023 to Powers et al., 5,585,152 to Tamura et al., 5,605,961 to Lee et al., 5,610,223 to Mason, 5,623,019 to Wiggins et al., 5,625,002 to Kadoi et. al., 5,683,818 to Bolvari, 5,723,539 to Gallucci et al, 5,783,631 to Venkataswamy, 5,852,118 to Horrion et al., 5,777,029 to Horrion et al., 5,777,039 to Venkataswamy et al., 5,837,179 to Pihl et al., 5,856,406 to Silvis et al., 5,869,591 to McKay et al., 5,929,168 to Ikkala et al., 5,936,038 to Coran et al., 5,936,039 to Wang et al., 5,936,058 to Schauder, and 5,977,271 to McKay et al. comprise illustrative nonlimiting examples of compatible two phase polymer systems, some illustrative examples of manufacture for two phase polymer systems, some illustrative examples of manufacture of polymeric compatibilizers, and manufacture of a two phase polymer system having discrete synthetic particles having silica particles dispersed therein, and these references are contained herein by reference in their entirety for further general guidance and modification by those skilled in the arts.

Melt forming the finishing element components is preferred. Molding is a preferred type of melt forming. Injection molding is a preferred type of molding. Compression molding is a preferred type of molding. Coinjection molding is a preferred type of melt forming. Melt injection molding is a preferred method of molding. Melt coinjection molding is a preferred form of coinjection molding. U.S. Pat. No. 4,385,025 to Salerno et al. provides nonlimiting illustrative guidance for injection molding and coinjection molding and is included herein by reference in its entirety. Melt molding can form components with very tight tolerances. Injection molding and coinjection molding offer low cost, good resistance to contamination, and very tight tolerances. Extrusion is a preferred form of melt forming. Extrusion can be low cost and have good tolerances. Preferred finishing element components include finishing element finishing layers, finishing element sublayers, and discrete stiffening members. Melt forming finishing elements and/or components thereof with a thermoplastic multiphase polymeric composition which can be recycled is especially preferred to help reduce costs and improve performance.

Post crosslinking after mixing and finishing element formation (or component thereof) can improve the physical properties of finishing element components used to finish semiconductor wafer surfaces. Post crosslinking a synthetic resin forming a multiphase polymeric mixture with higher Tensile Strength as measured by ASTM D 638 than that of the same multiphase polymeric mixture formed in the absence of the post crosslinking is preferred. Post crosslinking a synthetic resin forming a multiphase polymeric mixture with higher Ultimate Tensile Strength as measured by ASTM D 638 than that of the same multiphase polymeric mixture formed in the absence of the post crosslinking is preferred. Post crosslinking a synthetic resin forming a multiphase polymeric mixture with higher Ultimate Elongation as measured by ASTM D 638 than that of the same multiphase polymeric mixture formed in the absence of the post crosslinking is preferred. Post crosslinking a synthetic resin forming a multiphase polymeric mixture with lower compression set as measured by ASTM D 395 than that of the same multiphase polymeric mixture formed in the absence of the post crosslinking is preferred. Post crosslinking a synthetic resin forming a multiphase polymeric mixture with higher toughness to that of the same multiphase polymeric mixture formed in the absence of the post crosslinking is preferred. Post crosslinking a synthetic resin forming a multiphase polymeric mixture with higher Fatigue Endurance as measured by ASTM D 671 to that of the same multiphase polymeric mixture formed in the absence of the post crosslinking is preferred. Post crosslinking a synthetic resin forming a multiphase polymeric mixture with higher chemical resistance to that of the same multiphase polymeric mixture formed in the absence of the post crosslinking is preferred. Post crosslinking a synthetic polymer to increase the amount of elastic deformation of a polymeric composition during finishing motion and decrease the plastic deformation polymeric composition during operative finishing motion is preferred. Post crosslinking a synthetic polymer to increase the amount of elastic deformation and decrease the plastic deformation of at least one polymer in a multiphase polymeric composition during operative finishing motion is more preferred. Post crosslinking improving a plurality of these properties is especially preferred. Post crosslinking for improving at least one of these properties by at least 10% is preferred and for improving at least one of these properties by at least 30% is more preferred and for improving at least one of these properties by at least 70% is even more preferred. Post crosslinking for improving a plurality of these properties by at least 10% is preferred and for improving a plurality of these properties by at least 30% is more preferred and for improving a plurality of these properties by at least 70% is even more preferred. Finishing elements having these improved physical and/or chemical properties can improve finishing and finishing elements having at least two of these improved physical and/or chemical properties are especially preferred.

Each of these forming processes can be low cost and produce finishing elements with tight tolerances.

Optionally Preferred Polymeric Components

When finishing workpieces, even a low number of small scratches can lead to lower yields and higher manufacturing costs. For this reason it is preferred that the polymers on the finishing element finishing surface be as free as possible from unwanted particles capable of scratching the workpiece surface being finished. It is particularly preferred that unwanted particles capable of scratching the workpiece surface be also as small as possible. Methods to purify the polymers prior to forming the finishing element finishing surface are preferred. Purifying polymers in the magnetically responsive refining elements is generally preferred. Purifying polymer "A" by filtering, extracting, or neutralizing an unwanted reactive group before adding it to a second polymer is preferred because this can reduce the cost and can even improve the purification process, such as a cleaning or filtering process. For abrasive finishing element finishing surfaces having abrasive particles, purifying a polymer "A" before adding the abrasive is preferred because this can also reduce the cost of purification and even improve the purification process. Cleaning or filtering a plurality of polymers before mixing them or adding abrasive is also preferred for the similar reasons. By example, a multiphase synthetic polymer composition having at least one cleaned polymer "A" wherein both particles and particle forming materials are removed before being added to the polymeric multiphase system or the abrasive composition to provide a polymer "A" free of unwanted particles having a maximum dimension of at least 20 microns capable of scratching a workpiece surface is preferred. In other words, polymer "A" is precleaned of both particles (and particle forming materials) to render it free of unwanted particles having a maximum dimension of at least 20 microns capable of scratching a workpiece surface and is preferred. As a further example, a finishing surface having at least one polymer filtered before adding abrasive to the filtered polymer to remove particles having a maximum dimension of at least 10 microns capable of scratching a workpiece surface is preferred. In a similar fashion, precleaned polymer to remove particles having a maximum dimension of 1 micron is even more preferred. By pretreating polymers to clean them before making the finishing element, generally a higher performance finishing element finishing surface can be made.

Finishing elements for finishing semiconductor wafers generally have a very high degree of cleanliness and/or purity to finish semiconductor wafers at high yields. Corrosive contaminates and/or contaminate particles unintentionally in the finishing element can cause yield losses costing thousands of dollars. Purifying the ingredients in the finishing element prior to manufacture of the finishing element is preferred. A preferred example of purifying ingredients and/or polymers is cleaning the ingredients and/or polymers to remove unwanted reactive functional groups that can lead to formation of unwanted particles which can cause unwanted damage to the workpiece surface during finishing. Cleaning at least one polymer wherein both particles and particle forming materials are removed (or rendered inactive, thus removing them) in order to provide a cleaned polymer free of unwanted particles capable of scratching the workpiece surface is preferred and cleaning a plurality of polymers wherein both particles and particle forming materials are removed (or rendered inactive, thus removing them) in order to provide a plurality of cleaned polymers free of unwanted particles capable of scratching the workpiece surface is more preferred. Melt purifying the synthetic resin before melt mixing multiple synthetic resins is a preferred example of a purifying step. Vacuum melt purifying is a preferred example of a melt purifying step. Melt vacuum screw extrusion is a preferred form of melt purifying the synthetic resin. Melt vacuum screw extrusion can remove or reduce unwanted low molecular weight substances such as unreacted oligomers and unreacted monomers. Unwanted low molecular weight side reaction products developed during polymeric graft reactions can also be removed with vacuum screw extrusion. Melt filter purifying is a preferred form of melt purifying the synthetic resin. Filtering the polymer to remove unwanted contaminants is a preferred method of cleaning or purifying the polymer. Solvent assisted filtering can be an effective method to remove unwanted contaminants. Melt filtering can also be an effective method to remove unwanted contaminants. Thermal assisted filtering can be an effective method to remove unwanted contaminants. Melt filtering can remove unwanted hard particulate contaminants which can cause scratching during subsequent finishing. A screen pack can be used for filtering the melt. A screen pack designed for melt extrusion is a preferred example of melt filtering. Melt filter purifying to remove all visible unmelted hard particle contaminants is preferred. Filter purifying to remove unmelted hard particle contaminants of less than 20 microns in diameter is preferred and of at most 10 microns is more preferred and of at most 1 micron is even more preferred and of at most 0.5 micron is even more particularly preferred. The smallest size particle which can be removed by filtration depends on the filtration system used, viscosities, available pressure drops, and, in some cases, the thermal stability of the polymer being filtered. Filtration systems are continuously being improved. For example, pressure drops can be minimized by some advanced systems and new solvent assisted systems have been developed and are reported in the recent United States patent literature. Evaluations for improved cleaning and filtering are continuing. Particles of at least 0.1 micron, perhaps smaller, are currently believed to be removable. Melt purifying the synthetic resins with melt purifying equipment is preferred before dynamic formation of the two phase because it is more difficult to filter the two phase system. Polymers can also be purified by extraction techniques (such as liquid extraction and selective precipitation) to remove unwanted contaminants. A vacuum extruder and polymer melt filters are preferred examples of melt purifying equipment. The cleaning and filtering of the polymers is preferably done before adding abrasives to the polymeric composition because this makes filtering and cleaning easier and more cost effective. The cleaning and filtering of the polymers for a multiphase polymeric composition is preferably done before making to the multiphase polymeric composition because this makes filtering and cleaning easier and more cost effective. In other words, precleaned and/or prefiltered polymers are preferred starting components to make an abrasive composition and/or a multiphase polymeric composition. U.S. Pat. Nos. 4,737,577 to Brown, 5,198,471 to Nauman et al., 5,266,680 to Al-Jimal et al., 5,756,659 to Hughes, 5,928,255 to Hobrecht, 5,869,591 to McKay et al., 5,977,271 to McKay et al. and 5,977,294 to Hoehn give further non-limiting guidance for some preferred purifying methods and equipment and are included herein in the entirety by reference.

An abrasive finishing element finishing surface comprising a multiphase synthetic polymer composition having a continuous phase of thermoplastic polymer "A" and a second synthetic polymer "B" in a different phase having abrasive particles dispersed therein is preferred. This multiphase abrasive composition can be used to operatively finish a workpiece. A dynamically formed second synthetic polymer "B" phase is especially preferred. A dynamically formed composition can reduce costs and also help to reduce contamination from additional handling. A crosslinked polymer "B" is preferred because this can improve temperature resistance and also increase elastic deformation during operative finishing.

Workpiece

A workpiece needing finishing is preferred. A homogeneous surface composition is a workpiece surface having one composition throughout and is preferred for some applications. A workpiece needing refining is preferred. A workpiece needing polishing is preferred. A workpiece needing planarizing is especially preferred. A workpiece having a microelectronic surface is preferred. A workpiece surface having a heterogeneous surface composition is preferred. A heterogeneous surface composition has different regions with different compositions on the surface, further the heterogeneous composition can change with the distance from the surface. Thus finishing can be used for a single workpiece whose surface composition changes as the finishing process progresses. A workpiece having a microelectronic surface having both conductive regions and nonconductive regions is more preferred and is an example of a preferred heterogeneous workpiece surface. Illustrative examples of conductive regions can be regions having copper or tungsten and other known conductors, especially metallic conductors. Metallic conductive regions in the workpiece surface consisting of metals selected from the group consisting of copper, aluminum, and tungsten or combinations thereof are particularly preferred. A semiconductor device is a preferred workpiece. A substrate wafer is a preferred workpiece. A semiconductor wafer having a polymeric layer requiring finishing is preferred because a lubricating aid can be particularly helpful in reducing unwanted surface damage to the softer polymeric surfaces. An example of a preferred polymer is a polyimide. Polyimide polymers are commercially available from E.I. DuPont Co. in Wilmington, Del. A semiconductor having a interlayer dielectric needing finishing is preferred. A semiconductor having a low-k dielectric layer is a preferred workpiece.

This invention is particularly preferred for workpieces requiring a highly flat surface. Finishing a workpiece surface to a surface to meet the specified semiconductor industry circuit design rule is preferred and finishing a workpiece surface to a surface to meet the 0.35 micrometers feature size semiconductor design rule is more preferred and finishing a workpiece surface to a surface to meet the 0.25 micrometers feature size semiconductor design rule is even more preferred and finishing a workpiece surface to a to meet the 0.18 micrometers semiconductor design rule is even more particularly preferred. Semiconductor meeting at most the 0.25 micrometer feature size design rule is preferred and at most the 0.16 micrometer feature size design rule is preferred and at most the 0.13 micrometer feature size design rule is preferred. An electronic wafer finished to meet a required surface flatness of the wafer device rule in to be used in the manufacture of ULSIs (Ultra Large Scale Integrated Circuits) is a particularly preferred workpiece made with a method according to preferred embodiments. The design rules for semiconductors are generally known to those skilled in the art. Guidance can also be found in the "The National Technology Roadmap for Semiconductors" published by SEMATECH in Austin, Tex.

A semiconductor wafers having low-k dielectric layers(s) are preferred workpiece. Illustrative nonlimiting examples of low-k dielectrics are low-k polymeric materials, low-k porous materials, and low-k foam materials. As used herein, a low-k dielectric has a k value of most 3.5 and more preferably of at most 3.0 and more preferably of at most 2.5. Illustrative examples include doped oxides, organic polymers, highly fluorinated organic polymers, and porous materials. Low-k dielectric materials are generally known to those skilled in the semiconductor wafer arts.

A semiconductor wafer having a diameter of at least 200 mm is preferred and a semiconductor wafer having a diameter of at least 300 mm is more preferred. As the semiconductor wafer become larger, it becomes more valuable which makes higher yields very desirable.

Supplying an organic lubricant to a semiconductor wafer during finishing having a diameter of at least 200 mm is preferred and supplying an organic lubricant to a semiconductor wafer during finishing having a diameter of at least 300 mm is more preferred. Supplying reactive lubricant to a semiconductor wafer during finishing having a diameter of at least 200 mm is even more preferred and supplying reactive lubricant to a semiconductor wafer during finishing having a diameter of at least 300 mm is more preferred. Large semiconductor wafers can generally be finished more effectively with an aqueous lubricating composition. Friction and heat generation can be more effectively controlled.

For finishing of semiconductor wafers having low-k dielectric layers (low dielectric constant layers), finishing aids, more preferably lubricating aids, are preferred. Illustrative nonlimiting examples of low-k dielectrics are low-k polymeric materials, low-k porous materials, and low-k foam materials. As used herein, a low-k dielectric has at most a k range of less than 3.5 and more preferably less than 3.0 and even more preferably less than 2.5 and even more especially preferred is less than 2.0. Illustrative examples include doped oxides, organic polymers, highly fluorinated organic polymers, and porous materials. A porous low-k dielectric layer is a preferred low-k dielectric layer. Low-k dielectric materials are generally known to those skilled in the semiconductor wafer arts. Abrasive organic synthetic resin particles can be effective to finishing low-dielectric materials. Abrasive organic synthetic resin asperities can be effective to finishing low-dielectric materials. Multilevel semiconductor wafers such as those having low-k dielectric layers and multilevel metal layers are generally known by those skilled in the semiconductor arts and U.S. Pat. No. 6,153,833 to Dawson et al. is included herein by reference for general non-limiting guidance for those skilled in the art. Since low-k dielectric layers generally have lower mechanical strength, the lower coefficient of friction that is offered by organic lubricating boundary layers is particularly preferred. A semiconductor wafer having a plurality of low-k dielectric layers is a preferred workpiece and a semiconductor wafer having at least 3 of low-k dielectric layers is a more preferred workpiece and a semiconductor wafer having at least 5 of low-k dielectric layers is an even more preferred workpiece. Supplying a lubricant to plurality of different low-k dielectric layers during finishing of the same semiconductor wafer is preferred and supplying a lubricant to at least 3 of different low-k dielectric layers during finishing of the same semiconductor wafer is more preferred and supplying a lubricant to at least 5 of the low-k dielectric layers during finishing of the same semiconductor wafer is even more preferred. A semiconductor wafer having at most 10 low-k dielectric layers is currently preferred but in the future this can increase. Semiconductor wafers for logic integrated circuits are particularly preferred. Defects caused during finishing can be reduced by supplying a lubricant.

A semiconductor wafer having multiple logic die with multiple low-k dielectric layers is a preferred workpiece. A semiconductor wafer having multiple memory die with multiple low-k dielectric layers is a preferred workpiece. These workpieces can be improved by reducing unwanted surface damage and/or unwanted tangential forces of friction during finishing.

A semiconductor wafer having a plurality of metal layers is a preferred workpiece and a semiconductor wafer having at least 3 of metal layers is a more preferred workpiece and a semiconductor wafer having at least 5 of the metal layers is an even more preferred workpiece. A semiconductor wafer having at most 10 metal layers is currently preferred but in the future this will increase. A semiconductor wafer having logic chips or logic die is particularly preferred because they can have multiple metal layers for supplying lubricants such as preferred lubricants during finishing. Supplying a lubricant to a plurality of finishing layers of the same semiconductor wafer is preferred and supplying a lubricant to at least 3 of finishing layers of the same semiconductor wafer is more preferred and supplying a lubricant to at least 5 of finishing layers of the same semiconductor wafer is more preferred. Defects caused during finishing can be reduced by supplying a lubricant. Semiconductor wafers having a plurality of metal layers or dielectric layers are generally known to those skilled in the semiconductor wafer arts and U.S. Pat. Nos. 5,516,346 to Cadien et al. and 5,836,806 to Cadien et al. are included herein in their entirety for general illustrative guidance. Further, defects in the first finished layer can cause defects in the second finished layer (and so on). In other words, defects in a prior layer can cause defects in a latter layer. Preferred in situ control can help reduce unwanted defects. Thus by supplying a lubricant during finishing (with preferred situ control), one can improve yields by minimizing unwanted defects in both the current and subsequent layers. A method which updates the cost of manufacture control parameters, look-up tables, algorithms, or control logic consistent with the current manufacturing step is preferred. A method which updates the cost of manufacture control parameters, look-up tables, algorithms, or control logic consistent with the current manufacturing step while evaluating prior manufacturing steps (such as completed manufacturing steps) is preferred. A method which updates the cost of manufacture control parameters, look-up tables, algorithms, or control logic consistent with the current manufacturing step while evaluating future manufacturing steps is preferred. A method which updates the cost of manufacture control parameters, look-up tables, algorithms, or control logic consistent with the current manufacturing step while evaluating both prior and future manufacturing steps is more preferred. The semiconductor wafer can be tracked for each finishing step during processing with a tracking means such as tracking code. As an illustrative example, a semiconductor wafer can be assigned with a trackable UPC code. U.S. Pat. No. 5,537,325 issued to Iwakiri, et al. on Jul. 16, 1997 teaches a method to mark and track semiconductor wafers sliced from an ingot through the manufacturing process and is included for by reference in its entirety for general guidance and appropriate modification by those skilled in the art. As a nonlimiting example, Cognex Corporation in Natick, Mass. markets commercial tacking means for tracking semiconductor wafers. As further illustration of preferred tracking codes include 2D matrix (such as SEMI 2D matrix), alphanumeric, and bar codes. Processes, performance, and preferred lubrication conditions and information can be tracked and stored by wafer (and/or wafer batches) with this technology when used with the new disclosures herein.

Finishing in preferred value ranges of the coefficient of friction and/or effective coefficient of friction is generally advantageous. Using the coefficient of friction and/or effective coefficient of friction to manage, control, and improve finishing results by reducing unwanted surface defects and improving semiconductor wafer processing costs is a particularly preferred embodiment of this invention. Using the coefficient of friction and/or effective coefficient of friction to control in situ, real time finishing is particularly preferred.

Preferred semiconductor wafer surfaces can be heterogeneous. A heterogeneous semiconductor preferably has different uniform regions such as conductive regions and non-conductive regions. Another preferred example is a having more conductive regions and less conductive regions. During finishing it is often the case that one of the uniform regions is particularly preferred during finishing. Also, because of differences such as surface energy, preferred marginal lubrication may be more preferred for one uniform region or the other uniform region. A preferred uniform region in some applications is the conductive region. A preferred uniform region in some applications is the non-conductive region. Heterogeneous semiconductor wafer surfaces are generally known to those skilled in the semiconductor wafer processing arts.

A workpiece which is manufactured in a multiplicity of separate manufacturing steps is preferred. A workpiece which is manufactured in a multiplicity of separate and distinct manufacturing steps is more preferred. A workpiece which is manufactured in at least 10 separate manufacturing steps is preferred. A workpiece which is manufactured in at least 10 separate and distinct manufacturing steps is more preferred. A workpiece which is manufactured in at least 25 separate manufacturing steps is preferred. A workpiece which is manufactured in at least 25 separate and distinct manufacturing steps is more preferred. A workpiece manufactured in steps which comprise preferred non-equilibrium process control is preferred. A workpiece manufactured in steps which include a refining step comprising non-equilibrium process control is preferred. A workpiece manufactured in steps which include a plurality of refining steps comprising non-equilibrium process control is more preferred. A workpiece manufactured in steps which include at least three of refining steps comprising non-equilibrium process control is more preferred. A workpiece manufactured in steps which include a refining step having a portion of the step in non-steady state is preferred. A workpiece manufactured in steps which include a plurality of refining steps having a portion of the step in non-steady state is more preferred. A workpiece manufactured in steps which include at least three of refining steps having a portion of the step in non-steady state is more preferred. Determining a change for a process control parameter with progress of refining information and changing a process control parameter while a process is in a non-steady state is preferred for some process control operations. Determining a change for a process control parameter with progress of refining information and changing a process control parameter while a process is in a non-equilibrium time period of change is preferred for some process control operations. An illustrative example of non-steady state processing time period is the partial clearing of a conductive layer from a nonconductive layer. During this period of clearing the surface composition (refining) of the workpiece generally has a surface composition changing during a non-steady time period. During this period of clearing the surface composition (refining) of the workpiece can have frictional and/or differential frictional changes during a non-steady time period.

A generally robust control subsystem for manufacturing a workpiece having multiple manufacturing steps wherein some having non-steady time periods is preferred. A control system with a plurality of operative sensors, a plurality of processors, and at least one controller is a nonlimiting example of a preferred control subsystem for controlling during non-steady state. A process model and/or a cost of manufacture model can be preferred. A workpiece having an identification code is preferred and a workpiece having a unique identification code is preferred. An identification code can further aid process control of a manufacturing process having multiple steps. A semiconductor wafer is a preferred example of a workpiece. A workpiece having a microelectronic component is another example.

Workpiece Holder

A workpiece holder which facilitates coupling of the magnetic field of the driver magnetic system with the magnetically responsive finishing element. Plastics are a preferred composition for the workpiece holder. A nonmagnetic stainless steel workpiece holder can be used. A vacuum system in the workpiece holder can facilitate holding of the workpiece.

Adjustable retainer rings can also help facilitating holding the workpiece. An adjustable retainer ring can also help reduce the edge exclusion or loss during finishing. A retainer ring having a width of at least one third the width of the discrete finishing member is preferred and having a width of at least one half the width of the discrete finishing is more preferred.

Magnetic Refining and Finishing System Further Guidance

Coupling magnetic driver systems to drive magnetically responsive refining elements to generate different motions such as linear motion, circular motion, and eccentric motion are known. Magnetic driver systems which transmit torque through nonmagnetic structures to drive mixing and pumping elements and the like are known in the mixing arts and can be adapted for use with the confidential magnetic finishing systems disclosed herein using the confidential teaching disclosed herein. Mechanical motion mechanisms to generate linear motions, planar motions (such as x-y motion) circular motion, and orbital motions. Control of the magnetic coupling between the magnetically responsive finishing element and driving magnet by varying the distance and/or using electronically adjustable magnetic fields is preferred. Nonlimiting illustrative examples are included in U.S. Pat. Nos. 4,088,379 to Perper, 4,836,826 to Carter et al., 4,927,337 to Lustwerk, 5,216,308 to Meeks, 5,253,986 to Bond et al., 5,254,925 to Flynn, 5,315,197 to Meeks et al., 5,331,861 to Joffe, 5,463,263 to Flynn, 5,708,313 to Bowes et al., 5,723,917 to Chitayat et al., 5,779,456 to Bowes et al., 5,834,739 to Lockwood et al., 5,906,105 to Ugolini, 5,911,503 to Braden, 5,961,213 to Tsuyuki et al., 6,005,317 to Lamb, 6,065,865 to Eyraud et al., 6,076,957 to Gomes, 6,095,677 to Karkos Jr. et al., and 6,121,704 to Fukuyama et al., and each is included by reference in their entirety for general useful guidance and modification by those skilled in the art using the confidential teaching and guidance contained herein.

Refining Composition

A refining composition is preferred during refining. A refining fluid is a preferred refining composition. A refining composition including a reactive refining aid is preferred. A reactive liquid composition can be a preferred refining fluid.

Functional refining and finishing compositions are generally known to those skilled in the art for chemical mechanical finishing. A chemical mechanical polishing slurry can generally be used as finishing composition. Alternately, a finishing composition can be modified by those skilled in the art by removing the abrasive particles to form a finishing composition free of abrasive particles. A finishing composition substantially free of abrasive particles is preferred and a finishing composition free of abrasive particles is more preferred. Finishing compositions have their pH adjusted carefully, and generally comprise other chemical additives are used to effect chemical reactions and/other surface changes to the workpiece. A finishing composition having dissolved chemical additives is particularly preferred. Illustrative examples preferred dissolved chemical additives include dissolved acids, bases, buffers, oxidizing agents, reducing agents, stabilizers, and chemical reagents. A finishing composition having a chemical which substantially reacts with material from the workpiece surface being finished is particularly preferred. A finishing composition having a chemical which selectively chemically reacts with only a portion of the workpiece surface is particularly preferred. A finishing composition having a chemical which preferentially chemically reacts with only a portion of the workpiece surface is particularly preferred.

Some illustrative nonlimiting examples of polishing slurries which can be modified and/or modified by those skilled in the art are now discussed. An example slurry comprises water, a solid abrasive material and a third component selected from the group consisting of $HNO_3$, $H_2SO_4$, and $AgNO_3$ or mixtures thereof. Another polishing slurry comprises water, aluminum oxide, and hydrogen peroxide mixed into a slurry. Other chemicals such as KOH (potassium hydroxide) can also be added to the above polishing slurry. Still another illustrative polishing slurry comprises $H_3PO_4$ at from about 0.1% to about 20% by volume, $H_2O_2$ at from 1% to about 30% by volume, water, and solid abrasive material. Still another polishing slurry comprises an oxidizing agent such as potassium ferricyanide, an abrasive such as silica, and has a pH of between 2 and 4. Still another polishing slurry comprises high purity fine metal oxides particles uniformly dispersed in a stable aqueous medium. Still another polishing slurry comprises a colloidal suspension of $SiO_2$ particles having an average particle size of between 20 and 50 nanometers in alkali solution, demineralized water, and a chemical activator. U.S. Pat. Nos. 5,209,816 to Yu et al. issued in 1993, 5,354,490 to Yu et al. issued in 1994, 5,540,810 to Sandhu et al. issued in 1996, 5,516,346 to Cadien et al. issued in 1996, 5,527,423 to Neville et al. issued in 1996, 5,622,525 to Haisma et al. issued in 1997, and 5,645,736 to Allman issued in 1997 comprise illustrative nonlimiting examples of slurries contained herein by reference in their entirety for further general guidance and modification by those skilled in the arts. Commercial CMP polishing slurries are also available from Rodel Manufacturing Company in Newark, Del. Application WO 98/18159 to Hudson gives general guidance for those skilled in the art for modifying current slurries to produce an abrasive free finishing composition.

In a preferred mode, the finishing composition is free of abrasive particles. However as the fixed abrasive finishing element wears down during finishing, some naturally worn fixed abrasive particles can be liberated from the fixed abrasive finishing element can thus temporarily be present in the finishing composition until drainage or removal.

A reactive gas can be a preferred refining fluid. A reactive gas having a refining aid comprising a halogenated material is preferred. A reactive gas which has been activated with in an activating system is preferred. A gaseous oxidizing agent comprises a preferred reactive gas. Ozone is a preferred gaseous oxidizing agent. A refining chamber free of a supplied liquid (such as water) is preferred for some refining applications. A reactive gas can improve the refining rate by chemically reacting with the workpiece surface facilitate the action of the refining element. A reactive gas can also help remove some types of wear particles from the surface of the workpiece during refining. Ozone is particularly preferred because it can be generated safely at the local site of consumption. Ozone can be generated by subjecting air or oxygen to an effective amount of ultraviolet radiation. Ozone can also be generated electronic irradiation of air or oxygen. Additional guidance can be found on gaseous oxidizing agents in U.S. Pat. Nos. 4,812,325 to Ishihara et al., 5,613,983 to Terry et al., and 5,827,560 to Fu and these patents are included in their entirety for general guidance and modification by those skilled in the arts. Use of a reactive lubricant for planarizing is generally known to those in the semiconductor wafer arts. U.S. Pat. Nos. 6,267,723 to Molnar, 6,283,829 to Molnar, 6,291,349 to Molnar, 6,293,851 to Molnar, 6,346,202 to Molnar, and 6,428,388 are included in their entirety for further general guidance and modification by those skilled in the art. A refining fluid comprising a reactive gas can be preferred for some refining applications such as when refining certain low k dielectric layers. Generating the reactive species an effective distance from the sealed chamber and/or workpiece surface to facilitate control of the refining rate is preferred. Refining with a reactive gas is generally performed with a relatively low pressure in the interface between the workpiece surface and the refining element surface. In situ control of the refining process is preferred. In situ control of the generation of the reactive gas such as a gaseous oxidizing agent is also generally preferred.

Operative Finishing Motion

Magnetic chemical mechanical finishing during operation has the finishing element in operative finishing motion with the surface of the workpiece being finished. A relative lateral parallel motion of the finishing element to the surface of the workpiece being finished is an operative finishing motion. Lateral parallel motion can be over very short distances or macro-distances. A parallel circular motion of the finishing element finishing surface relative to the workpiece surface being finished can be effective.

Some illustrative nonlimiting examples of preferred operative finishing motions for use in the invention are also discussed. Some embodiments have some particularly preferred operative finishing motions of the workpiece surface being finished and the finishing element finishing surface. Moving the finishing element finishing surface in an operative finishing motion to the workpiece surface being finished is a preferred example of an operative finishing motion. Moving the workpiece surface being finished in an operative finishing motion to the finishing element finishing surface is a preferred example of an operative finishing motion. Moving the finishing element finishing surface in a parallel circular motion to the workpiece surface being finished is a preferred example of an operative finishing motion. Moving the workpiece surface being finished in a parallel circular motion to the finishing element finishing surface is a preferred example of an operative parallel motion. Moving the finishing element finishing surface in a parallel linear motion to the workpiece surface being finished is a preferred example of an operative finishing motion. Moving the workpiece surface being finished in a parallel linear motion to the finishing element finishing surface is a preferred example of an operative parallel. The operative finishing motion performs a significant amount of the polishing and planarizing. An operative finishing motion which causes tribochemical finishing reactions is preferred. Operative finishing uses operative finishing motion to effect polishing and planarizing.

The relative operative speed is measured between the finishing element finishing surface and the workpiece surface being finished. Supplying a lubricating aid between the interface of the finishing element finishing surface and the workpiece surface being finished when high speed finishing is preferred to reduce the level of surface defects. Supplying a lubricating aid between the interface of a fixed abrasive cylindrical finishing element and a workpiece surface being finished is a preferred example of high speed finishing. An operative finishing motion which maintains substantially constant instantaneous relative velocity between the finishing element and all points on the semiconductor wafer is preferred for some finishing equipment. An operative finishing motion which maintains substantially different instantaneous relative velocity between the finishing element and some points on the semiconductor wafer is preferred for some finishing equipment.

U.S. Pat. Nos. 5,177,908 to Tuttle, 5,234,867 to Schultz et al, 5,522,965 to Chisholm et al., U.S. Pat. No. 5,759,918 to Hoshizaki et al., U.S. Pat. Nos. 5,762,536 to Pant, 5,735,731 to Lee, 5,851,136 to Lee et al, 5,908,530 to Hoshizaki et al., 5,938,884 to Hoshizaki et al., and 5,962,947 to Talieh, and 5,993,298 to Duescher comprise illustrative nonlimiting examples of types of operative finishing motions, operative finishing drive subsystems, operative movement mechanisms, adjustable retainer rings, and other useful information and each is contained by reference in their entirety for teaching and guidance herein and can be adapted for new magnetically applied finishing motions and are thus given for general guidance for those skilled in the arts.

A magnetic operative motion inducing chemical refining is a preferred refining motion. A magnetic operative motion inducing tribochemical refining is a preferred refining motion. A magnetic operative motion inducing mechanical refining is a preferred refining motion. A magnetic operative motion inducing frictional refining is a preferred refining motion. A magnetic operative motion inducing tribochemical finishing is a preferred finishing. Applying a magnetically induced operative finishing motion to an operative finishing interface is preferred. Applying a magnetically induced operative finishing motion to an operative finishing interface causing tribochemical reactions and finishing is preferred. A refining system having a workpiece holder, a magnetic refining element, and capable of applying an induced magnetic operative finishing motion to an operative refining interface is more preferred. A chemical mechanical finishing system having a workpiece holder, a magnetic finishing element, and capable of applying an induced magnetic operative finishing motion to an operative finishing interface is more preferred.

Workpiece Finishing Sensor

A workpiece finishing sensor is a sensor which senses the finishing progress to the workpiece in real time so that an in situ signal can be generated. A workpiece finishing sensor is preferred. A non-contact workpiece sensor is a preferred workpiece sensor which is free of physical contact with the workpiece. A workpiece finishing sensor which facilitates measurement and control of finishing is preferred.

The change in friction during finishing can be measured using technology generally familiar to those skilled in the art. A thermistor is a non-limiting example of preferred non-optical thermal sensor. A thermal couple is another preferred non-optical thermal sensor. An optical thermal sensor is a preferred thermal sensor. An infrared thermal sensor is a preferred thermal sensor. Sensors to measure friction in workpieces being finished are generally known to those skilled in the art. Non limiting examples of methods to measure friction in friction sensor probes are described in the following U.S. Pat. Nos. 5,069,002 to Sandhu et al., 5,196,353 to Sandhu, 5,308,438 to Cote et. al., 5,595,562 to Yau et al., 5,597,442 to Chen, 5,643,050 to Chen, and 5,738,562 to Doan et al. and are included by reference herein in their entirety for guidance and can be advantageously modified by those skilled in the art for use in this invention. Thermal sensors are available commercially from Terra Universal, Inc. in Anaheim, Calif. and Hart Scientific in American Fork, Utah.

A workpiece finishing sensor for the workpiece being finished is preferred. A sensor for the workpiece being finished selected from the group consisting of friction sensors, thermal sensors, optical sensors, acoustical sensors, and electrical sensors are preferred sensors for the workpiece being finished. Workpiece thermal sensors and workpiece friction sensors are non-limiting examples of preferred workpiece friction sensors. As used herein, a workpiece friction sensor can sense the friction between the interface of the workpiece being finished and the finishing element finishing surface during operative finishing motion.

Additional non-limiting preferred examples of workpiece finishing sensors will now be discussed. Preferred optical workpiece finishing sensors are discussed. Preferred non-optical workpiece finishing sensors are also discussed. The endpoint can detected by impinging a laser light onto the workpiece being polished and measuring the reflected light versus the expected reflected light as an measure of the planarization process. A system which includes a device for measuring the electrochemical potential of the slurry during processing which is electrically connected to the slurry, and a device for detecting the endpoint of the process, based on upon the electrochemical potential of the slurry, which is responsive to the electrochemical potential measuring device. Endpoint detection can be determined by an apparatus using an interferometer measuring device to direct at an unpatterned die on the exposed surface of the wafer to detect oxide thickness at that point. A semiconductor substrate and a block of optical quartz are simultaneously polished and an interferometer, in conjunction with a data processing system is then used to monitor the thickness and the polishing rate of the optical block to develop an endpoint detection method. A layer over a patterned semiconductor is polished and analyzed using optical methods to determine the end point. An energy supplying means for supplying prescribed energy to the semiconductor wafer is used to develop a detecting means for detecting a polishing end point to the polishing of film by detecting a variation of the energy supplied to the semiconductor wafer. The use of sound waves can be used during chemical mechanical polishing by measuring sound waves emanating from the chemical mechanical polishing action of the substrate against the finishing element. A control subsystem can maintain a wafer count, corresponding to how many wafers are finished and the control subsystem can regulate the backside pressure applied to each wafer in accordance with a predetermined function such that the backside pressure increases monotonically as the wafer count increases. The above methods are generally known to those skilled in the art. U.S. Pat. Nos. 5,081,796 to Schultz, 5,22,329 to Yu, 5,658,183 to Sandhu et al., 5,433,651 to Lustig et al., 5,439,551 to Meikle et al., 5,499,733 to Litvak, 5,461,007 to Kobayashi, 5,413,941 to Koos et al., 5,503,707 to Maung et al., 5,637,185 Murarka et al., 5,643,046 Katakabe et al., 5,643,060 to Sandhu et al., 5,653,622 to Drill et al., 5,658,622 to Drill et al., 5,700,180 to Sandhu et al., 5,705,435 to Chen, 5,730,642 to Sandhu et al., 5,851,135 to Sandhu et al., and 6,120,347 to Sandhu et al. are included by reference in their entirety and included herein for general guidance and modification by those skilled in the art.

Magnetic Finishing Sensor

Operative finishing element sensors are preferred for helping to control magnetic finishing. Non-contact magnetic finishing element sensors are preferred. Optical magnetic finishing element sensors are preferred. Radiation magnetic finishing element sensors are preferred. Reflectance of a light beam on a marked line or spot on the can be used to aid a magnetic finishing element sensor. Fluorescence can also be used. A modulated radiation source such as a laser with a tuned detector is an illustrative example of a non-contact magnetic finishing element sensor. Those skilled in the art can generally use the guidance and teachings contained herein to magnetically finish a workpiece with an operative magnetic finishing sensor.

Magnetic Driver Sensor and Magnetic Driver Sensor Assembly

Sensors and controllers for electric motors, and positioning/moving assemblies are generally known in the art of chemical mechanical polishing and are used in many commercial chemical mechanical polishers. Using the teaching and guidance contained herein, those skilled in the art can generally apply sensor and controllers to electromagnet drivers. Measurement and control of such variables as electric current and voltage are generally well known.

Illustrative Refining Applications

Figure 12A:
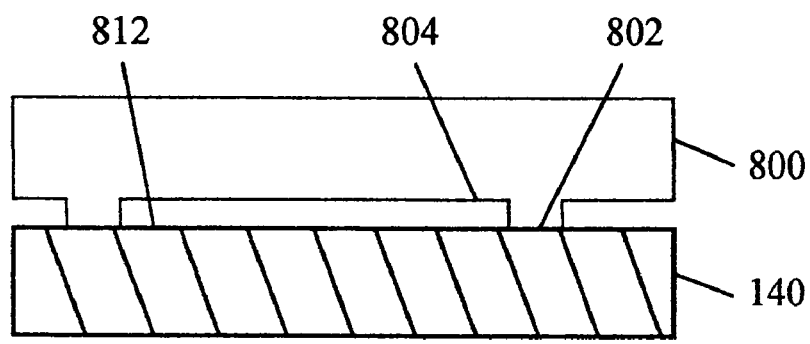
Figure 12B:
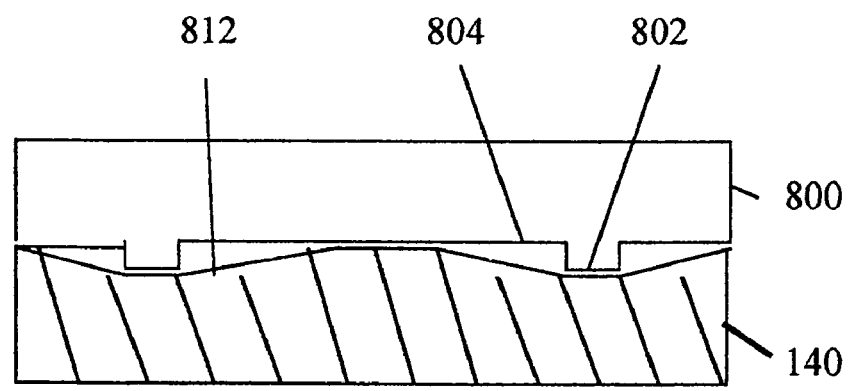

FIGS. 12a and 12b is an artist's representation of some local high finishing rate regions and some local low finishing rate regions. Reference Numeral 800 represents a portion of a semiconductor surface having two high local regions. Reference Numeral 802 represent high local regions (unwanted raised regions) on the semiconductor surface being finished. Reference Numeral 804 represent low local regions on the semiconductor surface being finished proximate to the high local regions. The discrete finishing member finishing surface is shown in local contact with the high local regions (Reference Numeral 802). Reference Numeral 812 represents the discrete finishing member surface displaced from but proximate to the high local regions (unwanted raised regions). As shown the discrete finishing member can reduce pressure and/or lose actual contact with the low local regions on the semiconductor proximate to the high local regions (unwanted raised regions). This leads to high local regions (unwanted raised regions) having high finishing rates and improved planarity on the semiconductor wafer surface. As shown in FIGS. 12a and 12b, the area of contact with the high local region is small which in turn raises the finishing pressure applied by the stiff discrete finishing member finishing surface and this increased pressure increases the finishing rate measured in angstroms per minute at the high local region. This higher pressure on the high local region also increases frictional heat which can further increase finishing rate measured in angstroms per minute in the local high region. When using a boundary layer lubrication, lubrication on the high local region can be reduced due to the higher temperature and/or pressure which further increases friction and finishing rate measured in angstroms per minute. Higher stiffness discrete finishing member finishing surfaces (higher flexural modulus discrete finishing members) apply higher pressures to the high local regions which can further improve planarization, finishing rates, and within die nonuniformity. Finishing using finishing elements of this in invention wherein the high local regions have a finishing rate measured in angstroms per minute of at least 1.6 times faster than in the proximate low local region measured in angstroms per minute is preferred and wherein the high local regions have a finishing rate of at least 2 times faster than in the proximate low local region is preferred and wherein the high local regions have a finishing rate of at least 3 times faster than in the proximate low local region is preferred. Where there is no contact with the proximate low local region, the finishing rate in the low local region can be very small and thus the ratio between the finishing rate in the high local region to finishing rate in the low local region can be large. Finishing using finishing elements of this in invention wherein the high local regions have a finishing rate measured in angstroms per minute of from 1.6 to 500 times faster than in the proximate low local region measured in angstroms per minute is preferred and wherein the high local regions have a finishing rate of from 2 to 300 times faster than in the proximate low local region is preferred and wherein the high local regions have a finishing rate of from 3 to 200 times faster than in the proximate low local region is preferred. By having the each discrete finishing member in contact with at least 3 increased finishing rate local high regions, the semiconductor wafer surface is more effectively planarized. During finishing, preferably the unitary resilient body compresses and urges discrete finishing member against semiconductor wafer surface being finished. By adjusting the flexural modulus of the discrete finishing member finishing surface, resilience of the unitary resilient body, and the other control parameters discussed herein, finishing and planarization of semiconductor wafer surfaces can be accomplished. This invention allows unique control of finishing.

Figure 12C:
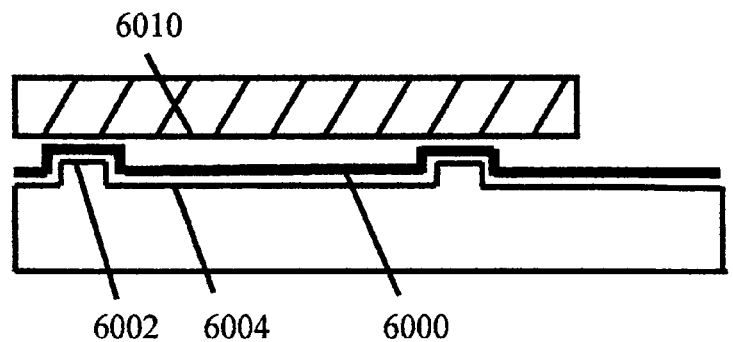
Figure 12D:
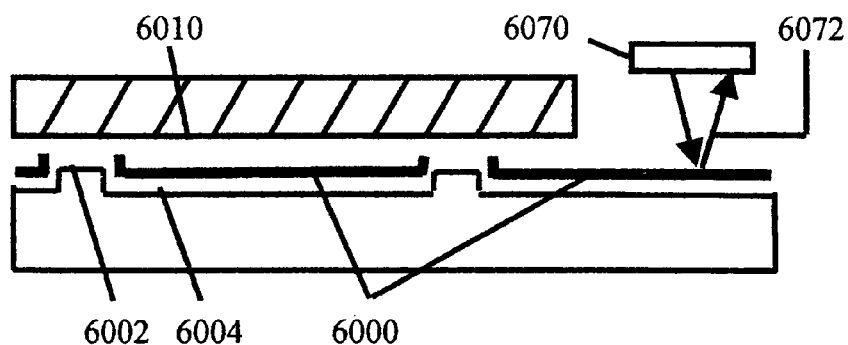
Figure 12E:
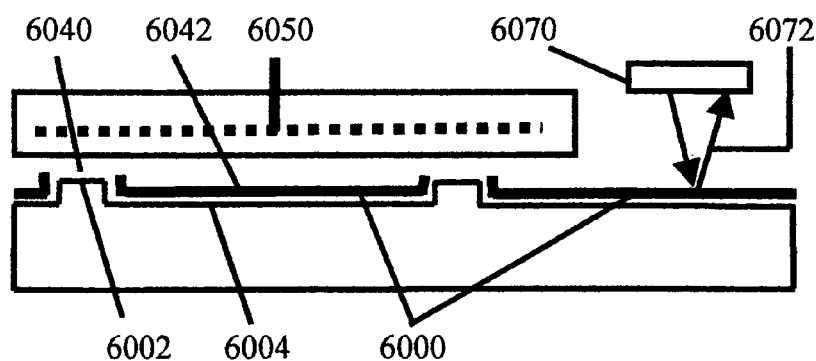

FIGS. 12c, 12d, and 12e is an artist's representation of method for refining using the versatility of the disclosed technology. FIG. 12c depicts workpiece having an electric current barrier film 6000 covering its surface in both unwanted high regions 6002 and regions lower than the unwanted high regions 6004. Preferably the barrier film adheres to the workpiece surface. A nonlimiting illustrative example is a polymer film formed using a spin on processing. Other nonlimiting examples include polyamide polymers, polymethylacrylonitrile polymers, and polyvinyl chloride polymers. The surface of a refining element before significant operative finishing motion 6010. FIG. 12d depicts the workpiece with the barrier film removed from the high areas 6002 and remaining in the regions lower than the unwanted high regions 6004. Operative finishing motion with a refining element can remove the barrier film from the tops of the unwanted raised regions 6002 while allowing the lower regions 6004 to retain the electric current barrier film 6000. In FIG. 12e, a electro-refining element having an electrode 6050 which has applied electric field to remove material from surface of the workpiece such a metal, more preferably copper. A higher current density is experienced in the regions of 6002 because of the reduced and/or eliminated electric current barrier film 6000 while removing less material from lower regions 6004 because the higher thickness of the barrier. In other words, the electric current barrier film is thicker in region 6042 and thinner or removed in region 6040 facilitating the differential electro-refining rates. An operative optical sensor 6070 for sensing with optical beams 6072 and measuring the thickness of the electric current barrier film during an refining process (preferably abrasive or friction induced refining) depicted in FIG. 12d and the electro-refining process of depicted in FIG. 12e. Using generally known optical sensors and techniques to monitor the change in electric current barrier film thickness is a preferred operative sensor and system. Single wavelength or multiple wavelength sensors can be used. An interferometer for instance can be used. The thickness of the electric current barrier film can aid in control by forming a basis for regional current leakage across the electric current barrier film as it becomes thinner. Thus, sensing electric current barrier film thickness facilitates control during regional electro-polishing. Further, using refining elements having independent control of their refining as disclosed herein dramatically enhances the versatility, use, and control of barrier films for refining. Further preferred embodiments are disclosed elsewhere herein. By measuring and controlling to changes in thickness of the barrier film, improved process control can be effected. By having independently controlled electro-refining element, a frictional refining element, and an operative sensor for sensing the electric current barrier film thickness in real time, the processing can be optimized in real time by adjusting the electric barrier film thickness in real time with the frictional refining element control parameters discussed herein elsewhere. The use of barriers and/or masking layers is generally known from the disclosures in U.S. Pat. No. 6,315,883 and is included herein by reference in its entirety for further general guidance on useful barriers and masks and for modification by those skilled in the art using the previously confidential disclosures contained herein.

Generally a die has at least one unwanted raised region created prior to finishing which is related to the location high pattern density. Each semiconductor wafer generally has many die with the same repeating topography relating to the unwanted raised region which in turn is generally related to a location of high pattern density. Finishing wherein the unwanted raised regions have a temperature of at least 3 degrees centigrade higher than in the proximate low local region is preferred and finishing wherein the unwanted raised regions have a temperature of at least 7 degrees centigrade higher than in the proximate low local region is preferred and finishing wherein the unwanted raised regions have a temperature of at least 10 degrees centigrade higher than in the proximate low local region is preferred. Finishing with stiff discrete finishing members, preferably having a flexural modulus of at least 20,000 psi., can increase the difference in temperature of the unwanted raised regions as compared to the proximate low local regions. Finishing with preferred organic boundary lubricating layers can increase the difference in temperature of the unwanted raised regions as compared to the proximate low local regions. Higher localized temperature gradients can aid planarization.

Cost of Manufacture Information

Figure 13:
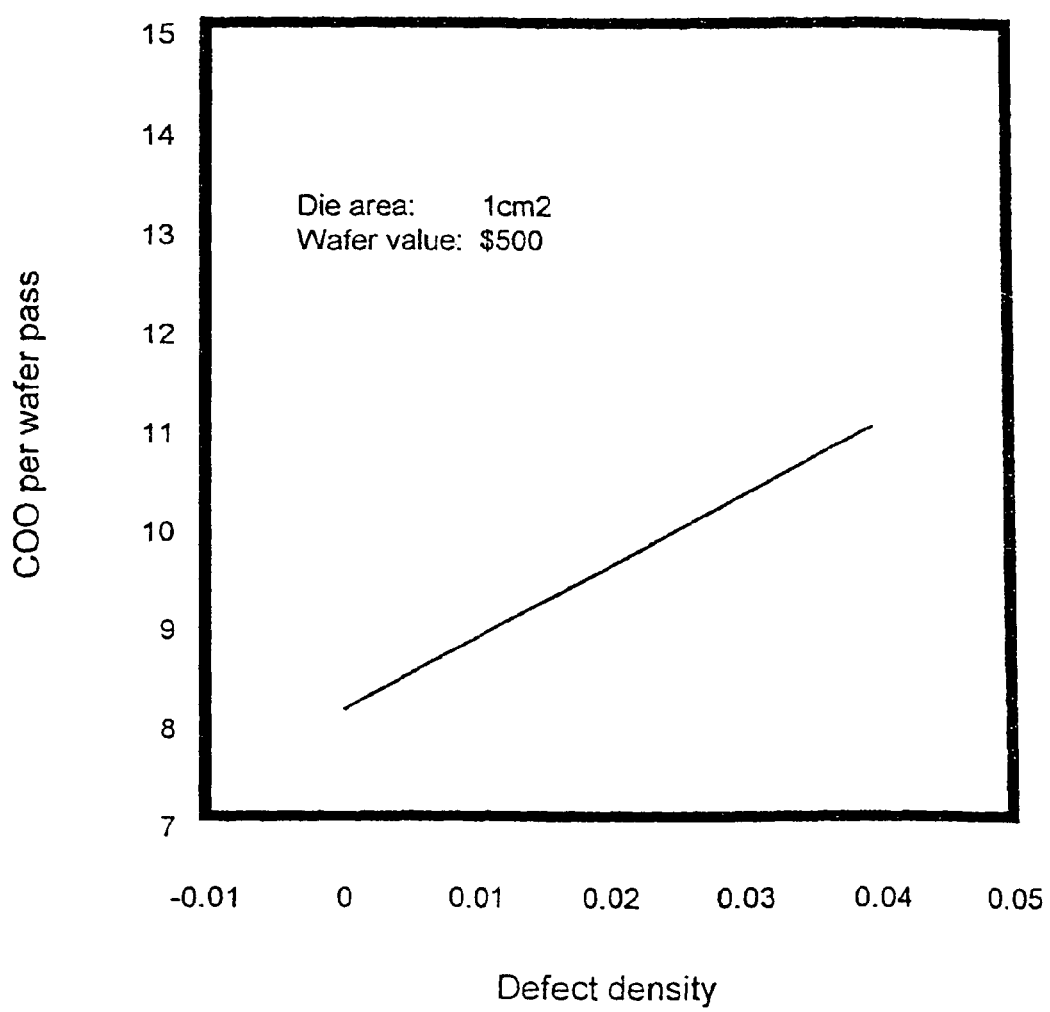
FIG. 13 is a plot of cost of ownership vs defect density
Figure 14:
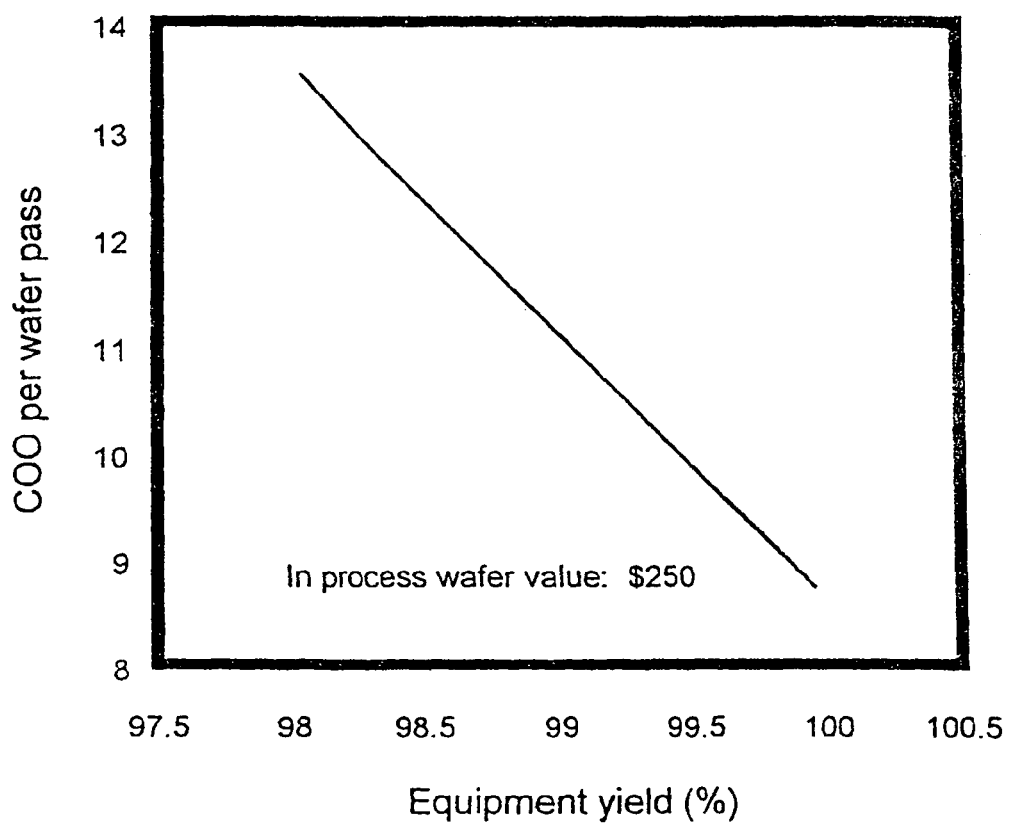
FIG. 14 is a plot of cost of ownership vs equipment yield
Figure 15:
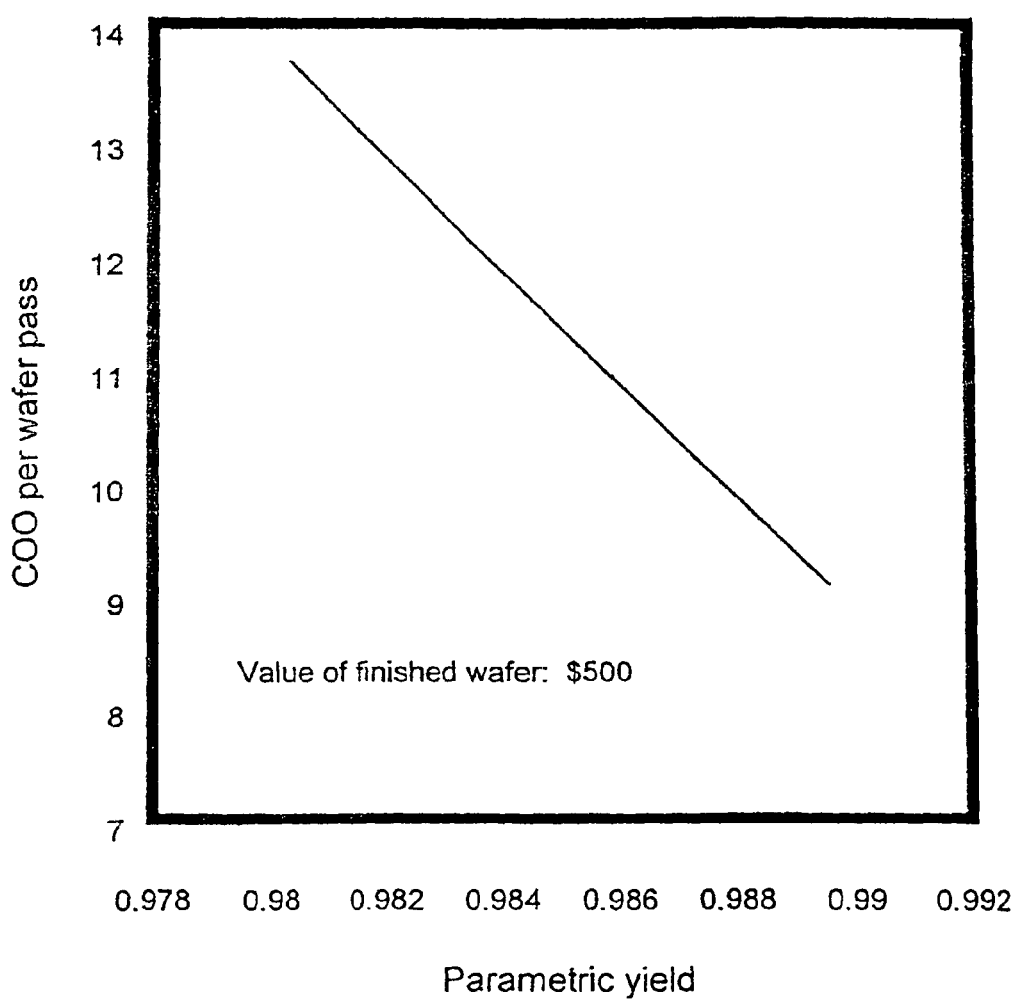
FIG. 15 is a plot of cost of ownership vs parametric yield loss
Figure 16:
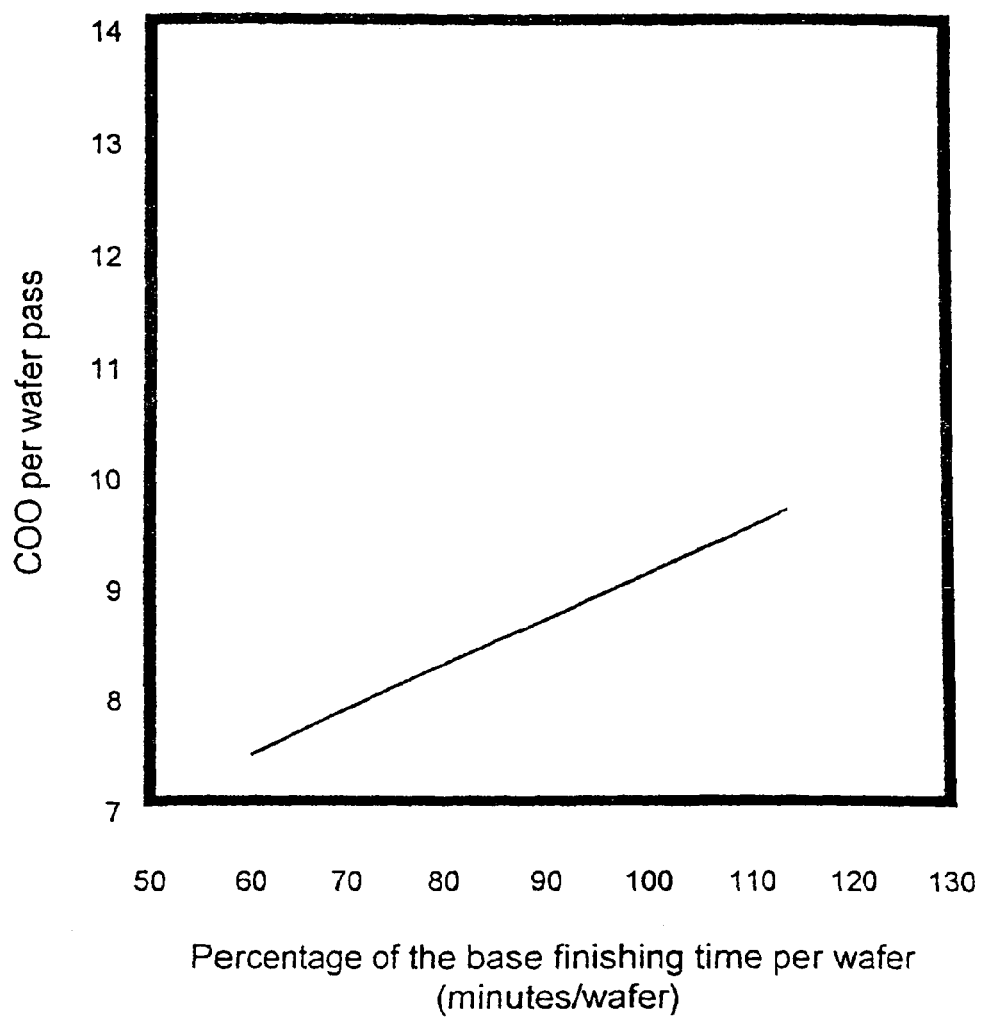
FIG. 16 is a plot of finishing rate effect on cost of ownership

Cost of manufacture parameters for chemical mechanical finishing are very complex. Cost of manufacture parameters and Cost of Ownership (COO) metrics are generally known by those skilled in the semiconductor arts. To applicant's knowledge, because of their complexity they have not been used for in situ process improvement. Applicant has now found unexpectedly that cost of manufacture parameters can be used to advantage to improve both finishing control and cost of manufacture during real-time finishing. Particular cost of manufacture parameters are preferred because they have a large impact on efficiency and effectiveness of chemical mechanical finishing as well as the proper selection of improved process control parameters and their selected values. A preferred cost of manufacture parameter is the defect density. FIG. 13 illustrates the effect of defect density on the cost of manufacture for a particular semiconductor wafer (finished wafer valued of $500). Note that an increase of defect density from 0.01 to 0.03 can increase the cost of manufacture for finishing by about $1.50. Another preferred cost of manufacture parameter is equipment yield. FIG. 14 illustrates the effect of a decrease of 1% in equipment yield can increase the cost of manufacture by $2.50 (in process wafer valued of $250). Another preferred cost of manufacture parameter for in situ process control is the parametric yield. FIG. 15 illustrates the effect of a decrease of 1% in parametric yield which can increase the cost of manufacture by $5.00 (finished wafer valued of $500). Another preferred cost of manufacture parameter for in situ process control is the finishing rate. FIG. 16 illustrates the effect of a finishing rate improvement on the cost of manufacture. FIGS. 13-16 represent illustrative graphs and equations which can be used to improve finishing with tracked information such as cost of manufacture parameters. Tracked information for specific workpieces and/workpiece batches can generally improve in situ finishing control by, for example, improving cost information. Depending on the particular finishing conditions, an increase in finishing rate can have a lowering effect on cost of manufacture due to an increase in throughput and can simultaneously increase the cost of manufacture by increasing the yield loss due to increased defect density. By using a processor, appropriate calculations can be made in situ to improve cost of manufacture in real-time. Without the processor and the ready access to preferred cost of manufacture parameters, it is difficult to properly improve the process control parameters during real-time finishing. Cost of manufacture parameters and Cost of Ownership metrics are generally known by those skilled in the semiconductor arts. Some preferred examples of cost of manufacture parameters comprise at least one parameter(s) selected from the group consisting of equipment cost ($), spares cost ($), consumables costs (such as abrasives, slurry, and/or finishing elements in $), MTBF (mean time between failure in hours), MTTR (mean time to repair in hours), scheduled preventive maintenance, raw product throughput (workpieces per hour), production tests (hours), mean time to test (hours), systems/operator, equipment yield, incoming wafer value ($), density defect, faulty probability, device area, and completed workpiece value ($). Another set of preferred examples of cost of manufacture parameters comprise at least one parameter(s) selected from the group consisting of fixed costs, recurring costs, yield costs, tool life, throughput, composite yield, and utilization. SEMATECH has published generally widely accepted cost of manufacture parameters and Cost of Ownership metrics which are included herein by reference in their entirety for guidance and use of those skilled in the semiconductor art. Further, Wright Williams and Kelly of Dublin, Calif. have published a manual entitled "Understanding and Using Cost of Ownership" (rev. 0595-1) containing cost of manufacture parameters and equations for cost of manufacture calculation which is also included herein by reference in its entirety for guidance and use of those skilled in the semiconductor arts. Where specific reference is made herein to a specific definition of a particular cost of manufacture metric, applicant will use for instance the Wright Williams and Kelly parametric yield or the SEMATECH equipment yield naming for additional specificity. Where further specificity is desirable, the Wright Williams and Kelly definition shall be used for that term for claim interpretation for that term (unless the term is expressly defined in the claim).

A nonlimiting example of methods to make available preferred cost of manufacture information include use of various mathematical equations, calculating specific parameters, memory look-up tables, look-up tables, heuristics, algorithms, or databases for generating certain parameters such as historical performance or preferred parameters or constants, neural networks, fuzzy logic techniques for systematically computing or obtaining preferred parameter values. A memory device is preferred for memory look-tables and/or databases and the like. Memory devices are generally known to those skilled in the art such as volatile and nonvolatile memory devices. It is also to be understood that often a single semiconductor wafer can undergo multiple wafer finishing steps. Each time the semiconductor wafer is finished in a wafer pass, the value of the semiconductor wafer increases due to multiple processing steps and thus the value of the equipment yield changes. A method which updates the cost of manufacture parameters consistent with the current manufacturing step is preferred. Current cost of manufacture parameters can be stored in memory look-up tables or databases. Those skilled in the arts of activity based accounting can generally setup appropriate look-up tables containing appropriate cost of manufacture parameters to use for in situ process control given the teachings and guidance herein. The semiconductor wafer can be tracked during processing with a tracking code. Tracked process and/or tracked cost of manufacture information stored by semiconductor wafer (or workpiece) with this technology in a memory device such as a memory look-up table when used with the new disclosures herein.

A method of finishing of a semiconductor wafer surface being finished wherein a mathematical formula is used to calculate in situ at least one improved process control parameter value based at least in part upon at least one cost of manufacture parameter selected from the group consisting of parametric yield, equipment yield, defect density, and finishing rate and then adjusting in situ at least one improved process control parameter is preferred. A method of finishing wherein at least one cost of manufacture parameter is evaluated in situ for improvement and used at least in part to improve control is preferred and a method of finishing wherein at least two cost of manufacture parameters are evaluated in situ for improvement and used at least in part to improve control is more preferred and a method of finishing wherein at least three cost of manufacture parameters are evaluated in situ for improvement and used at least in part to improve control is even more preferred. A method of finishing of a semiconductor wafer surface being finished wherein a mathematical formula is used to calculate in situ at least one improved process control parameter value based at least in part upon at least two cost of manufacture parameters selected from the group consisting of parametric yield, equipment yield, defect density, and finishing rate and then adjusting in situ at least one improved process control parameter is more preferred. A method of finishing of a semiconductor wafer surface being finished wherein a mathematical formula is used to calculate in situ at least one improved process control parameter value based at least in part upon at least three cost of manufacture parameters selected from the group consisting of parametric yield, equipment yield, defect density, and finishing rate and then adjusting in situ at least one improved process control parameter is even more preferred. A method of finishing of a semiconductor wafer surface being finished wherein a mathematical formula is used to calculate in situ at least two improved process control parameter values based at least in part upon at least two cost of manufacture parameters selected from the group consisting of parametric yield, equipment yield, defect density, and finishing rate and then adjusting in situ at least those two improved process control parameters is even more particularly preferred. These preferred cost of manufacture parameters are relatively difficult to improve during in situ processing because of their complexity and because they can have opposite effects on the cost of manufacture and thus a processor is generally quite effective for these calculations.

Preferably, the calculation to improve cost of manufacture using the cost of manufacture parameters can be completed at least 4 times during the finishing cycle time and more preferably the calculations can be completed at least 6 times during the finishing cycle time and even more preferably the calculations can be completed at least 10 times during the finishing cycle time and even more particularly preferably the calculations can be completed at least 20 times during the finishing cycle time. Preferably, the calculation to improve finishing using the in situ process information and the tracked information can be completed at least 4 times during the finishing cycle time and more preferably the calculations can be completed at least 6 times during the finishing cycle time and even more preferably the calculations can be completed at least 10 times during the finishing cycle time and even more particularly preferably the calculations can be completed at least 20 times during the finishing cycle time. Preferably, the in situ process control parameter value can be adjusted at least 4 times during the finishing cycle time and more preferably at least 6 times during the finishing cycle time and even more preferably at least 10 times during the finishing cycle time and even more particularly preferably at least 20 times during the finishing cycle time. Preferably, the in situ process control parameter value is controlled at least 4 times during the finishing cycle time and more preferably at least 6 times during the finishing cycle time and even more preferably at least 10 times during the finishing cycle time and even more particularly preferably at least 20 times during the finishing cycle time. Currently, a finishing cycle time of at most 6 minutes is preferred and of at most 4 minutes is more preferred and of at most 3 minutes is even more preferred and of at most 2 minutes is even more particularly preferred. Generally shorter cycle times are preferred because this generally increases throughput and reduces costs. Currently, a finishing cycle time of at least one half minute is preferred. Finishing cycle time is a preferred cost of manufacture parameter for optimization. By repeatedly calculating and adjusting the process control parameter(s) value(s), better process control and improved cost of manufacture can be effected. By repeatedly calculating and adjusting the process control parameter(s) value(s) using in situ process information and tracked information, better process control, improved finishing, and improved cost of manufacture can generally be effected. Generally, a maximum of one hundred calculations and process control parameter adjustments during a finishing cycle time are preferred although more can be used for particularly critical semiconductor wafer finishing. A process control parameter which changes the friction during finishing is a preferred process control parameter and a process control parameter which changes the coefficient of friction is a more preferred process control parameter.

Preferably, the calculation to improve cost of manufacture using the cost of manufacture parameters can be completed at least 4 times during the refining cycle time and more preferably the calculations can be completed at least 6 times during the refining cycle time and even more preferably the calculations can be completed at least 10 times during the refining cycle time and even more particularly preferably the calculations can be completed at least 20 times during the refining cycle time. Preferably, the calculation to improve refining using the in situ process information and the tracked information can be completed at least 4 times during the refining cycle time and more preferably the calculations can be completed at least 6 times during the refining cycle time and even more preferably the calculations can be completed at least 10 times during the refining cycle time and even more particularly preferably the calculations can be completed at least 20 times during the refining cycle time. Preferably, the in situ process control parameter value can be adjusted at least 4 times during the refining cycle time and more preferably at least 6 times during the refining cycle time and even more preferably at least 10 times during the refining cycle time and even more particularly preferably at least 20 times during the refining cycle time. Preferably, the in situ process control parameter value is controlled at least 4 times during the refining cycle time and more preferably at least 6 times during the refining cycle time and even more preferably at least 10 times during the refining cycle time and even more particularly preferably at least 20 times during the refining cycle time. Currently, a refining cycle time of at most 6 minutes is preferred and of at most 4 minutes is more preferred and of at most 3 minutes is even more preferred and of at most 2 minutes is even more particularly preferred. Generally shorter cycle times are preferred because this generally increases throughput and reduces costs. Currently, a refining cycle time of at least one half minute is preferred. Refining cycle time is a preferred cost of manufacture parameter for optimization. By repeatedly calculating and adjusting the process control parameter(s) value(s), better process control and improved cost of manufacture can be effected. By repeatedly calculating and adjusting the process control parameter(s) value(s) using in situ process information and tracked information, better process control, improved refining, and improved cost of manufacture can generally be effected. Generally, a maximum of one hundred calculations and process control parameter adjustments during a refining cycle time are preferred although more can be used for particularly critical semiconductor wafer refining. A process control parameter which changes the friction during refining is a preferred process control parameter and a process control parameter which changes the coefficient of friction is a more preferred process control parameter.

A processor can evaluate input signals rapidly with the cost of manufacture parameters with algorithms, look-up tables, fuzzy logic, iterative calculation methods, and/or solving multiple simultaneous equations to develop an improved output control signal from the controller and/or subsystem controller.

The semiconductor industry is in a relentless journey to increase computing power and decrease costs. Finishing of a semiconductor wafer using in situ calculations of cost of manufacture parameters to improve finishing control parameters can help simultaneously to decrease cost and reduce unwanted defects. Using current cost of manufacture parameters along with a friction sensing method to evaluate and adjust the boundary layer lubrication in a manner that adjustably controls the coefficient of friction in the operative finishing interface can be particularly effective at reducing unwanted surface defects such as microscratches and microchatter. This system is particularly preferred for finishing with fixed abrasive finishing elements. In addition generally helping to improve such parameters as equipment yield, parametric yield, and defect density, the "cuttability" or cut rate of the fixed abrasive finishing element can generally be extended which improves uptime or equipment utilization. The coefficient of friction in the operative finishing interface can change any number of times during a relatively short finishing cycle time making manual calculations ineffective. Further, the semiconductor wafer cost of manufacture parameters are relatively complex to calculate and the finishing process is relatively short thus manual calculations for equipment adjustment and control are even more difficult and ineffective. Rapid, multiple adjustments of process control parameters using process sensors operatively connected to a processor with access to cost of manufacture parameters are particularly preferred for the rapid in situ process control which helps to increase computing power in the finished semiconductor wafer and decrease manufacturing costs. Thus one can more effectively control, preferably in situ, finishing during changes in lubricating aid changes (like composition, concentration, or operating condition changes) and as applied pressure or operative finishing motion changes by using the systems taught herein. Optimizing the cost of manufacture during real time with preferred operative friction sensor(s) information and useful cost of manufacture information such as current cost of manufacture information, preferably derived from individual and/or semiconductor wafer cost tracking information during manufacture, can aid in reducing costs on this relentless journey. Control of the coefficient of friction in the operative finishing interface is particularly useful and effective to help reduce unwanted surface defects, preferably when combined with real time cost of manufacture information, information processing capability, and real time finishing control capability. Tracked information such as cost of manufacture information can aid in improved effectiveness of in situ control of lubrication in the operative finishing interface.

Cost of manufacture parameters can be helpful in improving yields and reducing costs during planarizing of a semiconductor wafer(s). A recurring cost is a preferred cost of manufacture parameter. A material cost is a preferred recurring cost. A consumable cost is a preferred recurring cost. A maintenance cost is a preferred recurring cost. A labor cost is a preferred recurring cost. A utility or utilities are a preferred recurring cost. Supplies are a preferred recurring cost. A support cost is a preferred recurring cost. A personnel cost is a preferred recurring cost. A support services cost is a preferred recurring cost. Test wafers are a preferred cost of manufacture parameter. Fill wafers are a preferred cost of manufacture parameter. A fixed cost is a preferred cost of manufacture parameter. Depreciation is a preferred fixed cost parameter. Qualification cost is a preferred fixed cost parameter. Depreciation is a preferred fixed cost parameter. Installation is a preferred fixed cost parameter. Training is a preferred fixed cost parameter. Floor space is a preferred fixed cost parameter. Utilization is a preferred cost of manufacture parameter. Scheduled maintenance is a preferred utilization cost. Unscheduled maintenance is a preferred utilization cost. Assist time is a preferred utilization cost. Standby time is a preferred utilization cost. Production qualification time is a preferred utilization cost. Scheduled maintenance is a preferred utilization cost. Process engineering time is a preferred utilization cost. Mean time between failure is a preferred cost of manufacture parameter. Mean time to repair is a preferred cost of manufacture parameter. Mean time to test is a preferred cost of manufacture parameter. Change-out cost is a preferred cost of manufacture parameter. The change-out costs for changing from one polishing pad to another is a non-limiting example of a change-out cost. First pass first quality yield is a preferred cost of manufacture parameter. First pass first quality yield of semiconductor wafer batch is a preferred example of a preferred first pass first quality yield. First pass first quality yield die within a semiconductor wafer is a preferred example of a preferred first pass first quality yield. As discussed elsewhere herein, improving the cost of manufacture and yield for planarizing a semiconductor wafer and/or semiconductor die is generally useful and complex. As another instance, changing selected a control parameter(s) can shorten the life of a consumable such as a polishing pad (which raises costs) but can also enhances throughput, reduce needed floor space over time, and improve utilization. Commercial wafer fabs can produce in a general range of 20,000 to 35,000 semiconductor wafers a month, thus developing with tracked information, generally useful memory-lookup tables, databases, and improving algorithms to improve real time process control to improve yields and lower costs. Solving of simultaneous equations in situ using selected cost of manufacture parameters along with finishing progress information can also be used to improve yields and/or lower costs. Solving of simultaneous equations ex situ using selected cost of manufacture parameters along with finishing progress information can also be used develop memory look-up tables, databases, and/or to improve equations for use in situ (real time) to improve yields and/or lower costs.

Algorithms, memory look-up tables, databases, and methods to solve equations simultaneously are generally known. Statistical methods to monitor manufacturing yields are generally known. FIGS. 13-16 represent some general costs, graphs, and equations for some cost of manufacture parameters for a given set of input data and can generally be modified by those skilled in the art for new, specific manufacturing conditions for specific semiconductor wafers having die. Methods for predictive control are known. Methods for adaptive control are known. Modeling process methods to aid control are also known. Each of these can be preferred for specific applications. U.S. Pat. Nos. 5,661,669 to Mozumder, 5,740,033 to Wassick et al., 6,167,360 to Erickson et al., 6,249,712 to Boiquaye, and 6,289,508 to Erickson et al. give general examples for predictive control, adaptive control, and dynamic process optimization and are included in their entirety for general guidance and appropriate modification by those skilled in the art using the teaching and guidance herein.

In process costs tracked with activity based cost model can be preferred. Activity based cost can measure a cost (or costs) by following activities along with their associated costs (resources used) during manufacture. Activity costs comprise resource related costs including labor, material, consumable, and equipment related activities which consume the costs. As a nonlimiting example, a resource can be refining equipment useful for planarizing, polishing, and buffing activities. The refining equipment cost can be related to the cost drivers of planarizing, polishing, and buffing activities by an output quantity (for example hours) consumed in each of planarizing, polishing, and buffing by cost driver per unit cost rate (for instance, $/hour of refining equipment used). In a similar manner, labor costs, material costs, and consumable costs can be assigned to activities using an appropriate cost driver(s) and output quantities. The activity costs can then be further related to the style, type, or intermediate stage of manufacture of a workpiece. Different types and/or different stages of manufacture of a semiconductor wafer use different amounts of different cost drivers (such as differences in planarizing, polishing, and buffing drivers). An activity based cost model having a multiple of different level of activity costs and a multiple of different cost drivers in each of the multiple of different levels of activity costs is preferred for semiconductor wafer refining process control. An activity cost is a preferred cost of manufacture parameter for process control. An activity cost and/or cost driver which is a mathematical composite derived from refining a multiplicity of workpieces are preferred. A mode, median or mean value of an activity cost and/or cost driver is a preferred example of a mathematical composite derived from refining a multiplicity of workpieces (or more preferably, workpiece batches). A multi-point moving mathematical composite (for instance a five point or ten point moving average) is a preferred example mathematical composite derived from refining a multiplicity of workpieces (or more preferably, workpiece batches). A preferred mathematical composite is derived, at least in part, mathematical expressions. Using a mathematical composite can facilitate process control using statistical methods to reduce short term noise which can adversely affect process control. An activity cost of the incremental costs associated with the specific step for instance, an interlayer dielectric (ILD) planarizing is a preferred activity cost for process control. An activity cost of the cumulative costs associated up to and/or up to and including the specific step for instance, ILD planarizing is a preferred activity cost for process control. An activity cost of the cumulative costs associated up to and including the specific step for instance, ILD planarizing is a preferred activity cost for process control. Each can give useful information for controlling the process control parameters. A multistage activity cost model is preferred for refining control during semiconductor wafer manufacture. An activity cost model based at least in part on the manufacturing sequential process activities is very preferred because this can aid in further evaluating the change(s) to a process control parameter when evaluating an activity based cost of manufacture parameter. Historical information including activity cost information is preferred to be stored in a look-up table, more preferably in a multiplicity of look-up tables. Historical performance including activity cost information can be stored in a memory device, more preferably a multiplicity of memory devices. Historical performance including activity cost information is preferred to be stored in a look-up table, more preferably in a multiplicity of look-up tables. Historical information including activity cost information can be stored in a memory device, more preferably a multiplicity of memory devices. Cost drivers, activity functions, activity costs, and different activity cost models represent nonlimiting preferred historical information relating to activity costs for storing in a look-up table or a memory device. An activity cost model based at least in part on the manufacturing process activities occurring chronologically in time is very preferred because this facilitates time sensitive process control with chronological activity costs. An activity cost model based at least in part on the manufacturing process activities occurring chronologically in time and further having a yield model is very preferred because this facilitates time sensitive process control with chronological activity costs including considerations of product yields.

Storing historical information including at least at least one cost of manufacture parameter in at least one lookup-table is preferred and storing historical information including at least at least two cost of manufacture parameters in at least one lookup-table is more preferred and storing historical information including at least at least five cost of manufacture parameters in at least one lookup-table is even more preferred and storing historical information including at least a majority of cost of manufacture parameters in at least one lookup-table is even more particularly preferred. Storing historical information including at least one process control parameter in at least one lookup-table is preferred and storing historical information including at least one process control parameters in at least one lookup-table is more preferred and storing historical information including at least five process control parameters in at least one lookup-table is even more preferred and storing historical information including a majority of the process control parameters in at least one lookup-table is even more particularly preferred. Historical information stored with tracking information related to individual workpieces is preferred and historical information stored with tracking information related to semiconductor wafer batches can also be preferred. Data mining can be accomplished on information used previously for process control. This reduces the cost of creating a new table or database for data mining. Further, the data mining results can be more readily applied to new, advanced process control algorithms. A cost of manufacture forecasting model can be accomplished on information used previously for process control. By having the cost of manufacture parameters stored in this manner, an improved cost of manufacture forecasting model can be developed and implemented. The new cost of manufacture models can be used when transitioning from a ramp-up phase of development to a commercial phase of development. New process control algorithms can be developed by evaluating ramp-up historical information including process control parameters and cost of manufacture parameters and then applying the new process control algorithm for commercial manufacture. New process control algorithms can be developed by evaluating previous historical information including process control parameters and cost of manufacture parameters and then applying the new process control algorithm for future commercial manufacture. Thus the historical information which is stored in a look-table is preferably used for a plurality of purposes to reduce the cost of manufacture and/or improved the enterprise profitability. By using the historical information used for initial process control multiple times, additional costs to collect information for data mining, cost of manufacture modeling, and process control algorithm improvement is accomplished in a new, more effective manner to give a new lower cost result.

Process Control Parameters

Preferred process control parameters include those control parameters which can be changed during processing and affect workpiece finishing. Control of the operative finishing motion is a preferred process control parameter. Examples of preferred operative finishing motions include relative velocity, pressure, and type of motion. Examples of preferred types of operative finishing motion include planar finishing motion, linear motion, vibrating motion, oscillating motion, and orbital motion. Finishing temperature is a preferred process control parameter. Finishing temperature can be controlled by changing the heat supplied to the workpiece holder (for instance with heating or cooling fluids in the optional passage ways. Heat or cooling can also be supplied to the finishing composition. Alternately, friction can also change the finishing temperature and can be controlled by changes in lubrication, applied pressure during finishing, and relative operative finishing motion velocity. Friction can be changed locally by changing the stiffness of the finishing element and/or the organic boundary layer lubrication. Changes in lubricant can be effected by changing finishing composition(s) and/or feed rate(s). If the lubricant is dispersed in the finishing element, lubrication can be changed, for instance, by adjusting the finishing pressure or changing finishing elements during the finishing cycle time. A preferred group of process control parameters consists of parameters selected from the group consisting of wafer velocity relative to the finishing element finishing surface, relative operative finishing velocity, finishing pattern, finishing temperature, force exerted on the operative finishing interface, finishing composition, finishing composition feed rate, and finishing pad conditioning.

A preferred group of magnetic process control parameters consist of parameters selected from the group consisting of the amount of magnetic coupling, magnetically induced operative finishing motions, and magnetically induced operative finishing pressure. A preferred group of magnetic process control parameters consist of parameters selected from the group consisting of the amount of magnetic coupling, magnetically induced operative finishing motions, and magnetically induced operative finishing down force. Changing at least one magnetic process control parameter during finishing is preferred and changing a plurality of magnetic process control parameters during finishing is more preferred. Changing at least one magnetically induced operative finishing motion during finishing is preferred and changing a plurality of magnetically induced operative finishing motions during finishing is more preferred. Changing at least one magnetically induced operative finishing pressure during finishing is preferred and changing a plurality of magnetically induced operative finishing pressures during finishing is more preferred. Controlling at least one magnetic process control parameter during finishing is preferred and controlling a plurality of magnetic process control parameters during finishing is more preferred. Controlling at least one magnetically induced operative finishing motion during finishing is preferred and controlling a plurality of magnetically induced operative finishing motions during finishing is more preferred. Controlling at least one magnetically induced operative finishing pressure during finishing is preferred and controlling a plurality of magnetically induced operative finishing pressures during finishing is more preferred. Making these changes in real time with a subsystem controller is particularly preferred.

Process control parameters for electro-refining can be selected from the group consisting of applied voltage(s), applied current(s), ionic strength, temperature, operative refining motion, secondary operative refining motion(s) or applied energies (such abrasive motion(s) or energy), ionic strength of the refining composition, pH of the refining composition, selected elemental ionic strength in the refining composition, and separation distance of the operating electrodes is preferred. Control of the applied electric field is a preferred process control parameter. Control of the current density is a preferred process control parameter. Control of the applied voltage is a preferred process control parameter. Control of the applied voltage at a working electrode is a preferred nonlimiting example of a controlled applied voltage. Control of the pH of the refining composition is a preferred process control parameter. Control of particular ions (e.g. copper ions) in the refining composition is a preferred process control parameter. Control of the pH of the refining composition is a preferred process control parameter. Control of the operative refining motion is a preferred process control parameter. Down force is a preferred example of a part of the operative refining motion. Relative velocity is a preferred example of a part of the operative refining motion. Continuous motion and non-continuous motion is a preferred example of a part of the operative refining motion. Control of a plurality of operative refining motions is a preferred process control parameter. Control of an applied abrasive energy during electro-refining (or an electro-refining step) is a preferred process control parameter. Control of a tribochemical reaction(s) during electro-refining (or an electro-refining step) is a preferred process control parameter. Control of a reaction(s) during electro-refining (or an electro-refining step) is a preferred process control parameter. Combinations of these can also be used. With a plurality of electro-refining element, a plurality of different applied currents can be used. With a plurality of electro-refining element, a plurality of independently controlled applied currents can be used. With a plurality of currents, generally a plurality of power supplies are used. A process model for electro-refining such as using the number of Coulumbs or Faraday's law are generally know to those skilled in the art. Historical performance and information can also be used to develop or refine a process model. A process model is preferred for control. A control subsystem having an operative sensor, a processor, and a controller is preferred and discussed in more detail elsewhere herein. Control of electro-refining can increase manufacturing yields, enhance versatility, and reduce costs.

Determining a change for a process control parameter at least 4 times during the refining cycle time is preferred and at least 6 times during the refining cycle time is more preferred and at least 10 times during the refining cycle time is even more preferred and at least 20 times during the refining cycle time is even more particularly preferred. Determining a change for a process control parameter in situ process information and the tracked information at least 4 times during the refining cycle time is preferred and at least 6 times during the refining cycle time is more preferred and at least 10 times during the refining cycle time is even more preferred and at least 20 times during the refining cycle time is even more particularly preferred. Changing process control parameter value at least 4 times during the refining cycle time is preferred and at least 6 times during the refining cycle time is more preferred and at least 10 times during the refining cycle time is even more preferred and at least 20 times during the refining cycle time is even more particularly preferred. Controlling the process control parameter value at least 4 times during the refining cycle time is preferred and at least 6 times during the refining cycle time is more preferred and at least 10 times during the refining cycle time is even more preferred and at least 20 times during the refining cycle time is even more particularly preferred. Currently, a refining cycle time of at most 6 minutes is preferred and of at most 4 minutes is more preferred and of at most 3 minutes is even more preferred and of at most 2 minutes is even more particularly preferred. By repeatedly determining, changing and controlling through adjusting the process control parameter(s) value(s), better process control and improved cost of manufacture can be effected. By repeatedly calculating and adjusting the process control parameter(s) value(s) using in situ process information and tracked information, better process control, improved refining, and improved cost of manufacture can generally be effected. Generally, a maximum of one hundred calculations and process control parameter adjustments during a refining cycle time are preferred although more can be used for particularly critical semiconductor wafer refining (and as processor speeds and controllers improve). A process control parameter which changes the friction, refining rate, cut rate, or tribochemical reaction rate during refining are preferred non-limiting examples of a refining cycle time which can benefit a process control parameter.

Determining a change for a process control parameter at least 4 times during the non-steady state process time is preferred and at least 6 times during the non-steady state process time is more preferred and at least 10 times during the non-steady state process time is even more preferred and at least 20 times during the non-steady state process time is even more particularly preferred. Determining a change for a process control parameter in situ process information and the tracked information at least 4 times during the non-steady state process time is preferred and at least 6 times during the non-steady state process time is more preferred and at least 10 times during the non-steady state process time is even more preferred and at least 20 times during the non-steady state process time is even more particularly preferred. Changing process control parameter value at least 4 times during the non-steady state process time is preferred and at least 6 times during the non-steady state process time is more preferred and at least 10 times during the non-steady state process time is even more preferred and at least 20 times during the non-steady state process time is even more particularly preferred. Controlling the process control parameter value at least 4 times during the non-steady state process time is preferred and at least 6 times during the non-steady state process time is more preferred and at least 10 times during the non-steady state process time is even more preferred and at least 20 times during the non-steady state process time is even more particularly preferred. Currently, a non-steady state process time of at most 3 minutes is preferred and of at most 2 minutes is more preferred and of at most 1.5 minutes is even more preferred and of at most 1 minute is even more particularly preferred. By repeatedly determining, changing and controlling through adjusting the process control parameter(s) value(s), better process control and improved cost of manufacture can be effected. By repeatedly calculating and adjusting the process control parameter(s) value(s) using in situ process information and tracked information, better process control, improved refining, and improved cost of manufacture can generally be effected. Generally, a maximum of one hundred calculations and process control parameter adjustments during a non-steady state process time are preferred although more can be used for particularly critical semiconductor wafer refining (and as processor speeds and controllers improve). A process undergoing differential frictional changes during refining can be a preferred non-limiting example of a non-steady state change which can benefit from the non-steady state a process control methods herein.

Determining a change for a process control parameter at least 4 times during the non-equilibrium process time is preferred and at least 6 times during the non-equilibrium process time is more preferred and at least 10 times during the non-equilibrium process time is even more preferred and at least 20 times during the non-equilibrium process time is even more particularly preferred. Determining a change for a process control parameter in situ process information and the tracked information at least 4 times during the non-equilibrium process time is preferred and at least 6 times during the non-equilibrium process time is more preferred and at least 10 times during the non-equilibrium process time is even more preferred and at least 20 times during the non-equilibrium process time is even more particularly preferred. Changing process control parameter value at least 4 times during the non-equilibrium process time is preferred and at least 6 times during the non-equilibrium process time is more preferred and at least 10 times during the non-equilibrium process time is even more preferred and at least 20 times during the non-equilibrium process time is even more particularly preferred. Controlling the process control parameter value at least 4 times during the non-equilibrium process time is preferred and at least 6 times during the non-equilibrium process time is more preferred and at least 10 times during the non-equilibrium process time is even more preferred and at least 20 times during the non-equilibrium process time is even more particularly preferred. Currently, a non-equilibrium process time of at most 3 minutes is preferred and of at most 2 minutes is more preferred and of at most 1.5 minutes is even more preferred and of at most 1 minute is even more particularly preferred. By repeatedly determining, changing and controlling through adjusting the process control parameter(s) value(s), better process control and improved cost of manufacture can be effected. By repeatedly calculating and adjusting the process control parameter(s) value(s) using in situ process information and tracked information, better process control, improved refining, and improved cost of manufacture can generally be effected. Generally, a maximum of one hundred calculations and process control parameter adjustments during a non-equilibrium process time are preferred although more can be used for particularly critical semiconductor wafer refining (and as processor speeds and controllers improve). A process undergoing differential frictional changes during refining can be a preferred non-limiting example of a non-equilibrium change which can benefit from the non-equilibrium a process control methods herein.

An advantage of a preferred embodiment is the additional degree of control it gives to the operator and/or a computer performing planarization and/or polishing. To better utilize this control, the use of feedback information to control the finishing control parameters is preferred and in situ control is more preferred. Controlling the finishing control parameters selected from the group consisting of alternate finishing composition feed rates, alternate finishing composition concentration, operative finishing motion, and operative finishing pressure is preferred to improve control of the finishing of the workpiece surface being finished and in situ control is more particularly preferred. Another preferred example of a finishing control parameter is to use a different finishing element for a different portion of the finishing cycle time such as one finishing element for the planarizing cycle time and a different finishing element for the polishing cycle time. Workpiece film thickness, measuring apparatus, and control methods are preferred methods of control. Mathematical equations including those developed based on process results can be used. Mathematical algorithms for control based on process performance results can be preferred. An empirically-based process model can be preferred. An empirically based process model developed at least in part on historical performance is preferred. A first principles-based process model can also be used for control. Using at least in part a first principles process model and at least in part an empirically based process model can be preferred for process control. A yield model can also be preferred for process control. A yield model based at least in part on historical performance is currently preferred. A recipe for finishing a semiconductor wafer can also be used. A recipes can be developed and/or modified based on historical performance. Multiple recipes stored in the look-up tables are preferred. A process model, more preferably multiple process models can be stored in the look-up tables. A processor having access to the look-up tables is preferred. Yield models are generally known to those skilled in the semiconductor wafer manufacturing arts. Process models are generally known to those skilled in the semiconductor wafer manufacturing arts. Finishing uniformity parameters selected from the group consisting of Total Thickness Variation (TTV), Focal plane deviation (FPD), Within-Wafer Non-Uniformity (WIW NU), and surface quality are preferred. Average cut rate is a preferred finishing rate control parameter. Average finishing rate is a preferred finishing rate control parameter. A preferred average cut rate can be the average cut rate across the surface of a semiconductor wafer at a particular time. A preferred average cut rate can be the average cut rate across the uniform region of the surface of a semiconductor wafer at a particular time (for example a uniform compositional region). Controlling finishing for at least a portion of the finishing cycle time with a finishing sensor subsystem to adjust in situ at least one finishing control parameter that affects finishing results is a preferred method of control finishing. Information feedback subsystems are generally known to those skilled in the art. Illustrative non limiting examples of wafer process control methods include U.S. Pat. No. 5,483,129 to Sandhu issued in 1996, U.S. Pat. No. 5,483,568 to Yano issued in 1996, U.S. Pat. No. 5,627,123 to Mogi issued in 1997, U.S. Pat. No. 5,653,622 to Drill issued in 1997, U.S. Pat. No. 5,657,123 to Mogi issued in 1997, U.S. Pat. No. 5,667,629 to Pan issued in 1997, and U.S. Pat. No. 5,695,601 to Kodera issued in 1997 and are included herein by reference in their entirety for guidance and modification by those skilled in the art and are included herein by reference in their entirety.

Processor controlled finishing can improve the control and versatility of magnetic finishing and can help reduce unwanted surface defects and/or help reduce the finishing time.

Processor

A processor is preferred to help evaluate the workpiece finishing sensor information. A processor can be a microprocessor, an ASIC, or some other processing means such as a computer. The processor preferably has computational and digital capabilities. Non limiting examples of processing information include use of various mathematical equations, calculating specific parameters, memory look-up tables or databases for generating certain parameters such as historical performance or preferred parameters or constants, neural networks, fuzzy logic techniques for systematically computing or obtaining preferred parameter values. Input parameter(s) can include information on current wafers being polished such as uniformity, expected polish rates, preferred lubricants(s), preferred lubricant concentrations, entering film thickness and uniformity, workpiece pattern. Further preferred non-limiting processor capabilities including adding, subtracting, multiplying, dividing, use functions, look-up tables, noise subtraction techniques, noise minimization techniques, comparing signals, and adjusting signals in real time from various inputs and combinations thereof.

Further general computing techniques such neural networks and statistical process control are generally known to those skilled in the semiconductor wafer processing arts. General computing techniques such as neural networks (including examples learning neural networks), fuzzy logic, data mining, model control, and statistical process control (including examples of nonconstant mean of response variables) are generally known to those skilled in the various arts. Non-limiting illustrative examples of neural networks, fuzzy logic, data mining, use of cost of manufacture information, and statistical process control are found in U.S. Pat. Nos. 5,774,833 to Baba et. al., 5,809,699 to Wong et al., 5,813,002 to Agrawal et al., 5,813,002 to Agrawal et al., 5,818,714 to Zou et al., 5,822,220 to Baines, 5,828,812 to Khan et al., 5,830,955 to Takeda et al., 5,832,468 to Miller et al., 5,832,466 to Feldgajer, 5,841,671 to Furumoto, 5,841,651 to Fu, 5,978,398 to Halverson and 6,568,989 to Molnar and are included herein by reference in their entirety for all purposes and for general guidance and modification by those skilled in the arts using the teachings herein.

Further, the processor can be used to evaluate and control the magnetic drivers, magnetic coupling, magnetically induced operative finishing pressure, magnetically induced operative finishing motion. Further, the processor can be used select preferred times to change the magnetic finishing elements (either or both between and within workpiece finishing cycles).

Memory look-up tables and databases are generally made accessible through memory devices. The memory devices can be integral with the process or operatively connected to the processor.

Use of Information for Feedback and Controller

Controllers to control the finishing of workpieces are generally known in the art. Controllers generally use information at least partially derived from the processor to make changes to the process control parameters. A processor is preferably operatively connected to a sensor to gain current information about the process and the processor is also operatively connected to a controller which preferably controls the finishing control parameters. As used herein, a control subsystem is a combination of an operative sensor operatively connected to a processor which is operatively connected to a controller which in turn can change refining and/or finishing control parameters, and preferably magnetic finishing control parameters. A control subsystem having a plurality of operative sensors is more preferred. A workpiece sensor is a preferred operative sensor. A magnetic driver sensor is a preferred operative sensor. A magnetic finishing element sensor is a preferred operative sensor. A refining composition sensor is a preferred operative sensor. A control subsystem having a workpiece sensor, a magnetic driver sensor, and a magnetic refining element sensor is a preferred control subsystem. A control subsystem having a plurality of operative workpiece sensors, a plurality of operative magnetic driver sensors, and a plurality of operative magnetic refining element sensors is a more preferred control subsystem. A control subsystem having at least three of operative workpiece sensors, at least three of operative magnetic driver sensors, and a plurality of operative magnetic refining element sensors is an even more preferred control subsystem. A control subsystem having a workpiece sensor, a magnetic driver sensor, and a magnetic finishing element sensor is a preferred control subsystem. A control subsystem having a plurality of operative workpiece sensors, a plurality of operative magnetic driver sensors, and a plurality of operative magnetic finishing element sensors is a more preferred control subsystem. A control subsystem having at least three of operative workpiece sensors, at least three of operative magnetic driver sensors, and a plurality of operative magnetic finishing element sensors is an even more preferred control subsystem. An optical sensor is a preferred operative sensor. A friction sensor is a preferred operative sensor. An optical sensor which detects reflected light and/or changes in light is a preferred operative sensor. Changes in light due to reflection, absorption, fluorescence, and/or phosphorescence are preferred changes in light to measure with an operative sensor. Changes in emission due to reflection, absorption, fluorescence, temperature (and/or temperature changes), and/or phosphorescence are preferred changes in light to measure with an operative sensor. An optical sensor which measure film thickness is a preferred operative sensor. Operative sensors are generally known to those skilled in the semiconductor wafer finishing arts.

An advantage of this invention in generally preferred embodiments is the additional degree of control it gives to the operator performing planarization and/or polishing. To better utilize this control, the use of feedback information to control the finishing control parameters is preferred and in situ control is more preferred. Controlling the finishing control parameters selected from the group consisting of finishing composition feed rates, finishing composition concentration, operative finishing motion, and operative finishing pressure is preferred to improve control of the finishing of the workpiece surface being finished and in situ control is more particularly preferred. Another preferred example of a finishing control parameter is to use a different finishing element for a different portion of the finishing cycle time such as one finishing element for the planarizing cycle time and a different finishing element for the polishing cycle time. Another preferred example of an finishing control parameter is to use a different finishing elements simultaneously during a portion of the finishing cycle time such as finishing elements with different finishing surfaces and/or different magnetic susceptabilities and/or different finishing surface sizes. Workpiece film thickness, measuring apparatus, and control methods are preferred methods of control. Mathematical equations including those developed based on process results can be used. Finishing uniformity parameters selected from the group consisting of Total Thickness Variation (TTV), Focal plane deviation (FPD), Within-Wafer Non-Uniformity (WIW NU), and surface quality are preferred. Average cut rate is a preferred finishing rate control parameter. Average finishing rate is a preferred finishing rate control parameter. Controlling finishing for at least a portion of the finishing cycle time with a finishing sensor subsystem to adjust in situ at least one finishing control parameter that affects finishing results is a preferred method of control finishing. Information feedback subsystems are generally known to those skilled in the art. Illustrative non limiting examples of wafer process control methods include U.S. Pat. No. 5,483,129 to Sandhu issued in 1996, U.S. Pat. No. 5,483,568 to Yano issued in 1996, U.S. Pat. No. 5,627,123 to Mogi issued in 1997, U.S. Pat. No. 5,653,622 to Drill issued in 1997, U.S. Pat. No. 5,657,123 to Mogi issued in 1997, U.S. Pat. No. 5,667,629 to Pan issued in 1997, and U.S. Pat. No. 5,695,601 to Kodera issued in 1997 are included herein for guidance and modification by those skilled in the art and are included herein by reference in their entirety.

Controlling at least one of the finishing control parameters using workpiece sensor information combined with workpiece finishing sensor information is preferred and controlling at least two of the finishing control parameters using secondary friction sensor information combined with workpiece finishing sensor information is more preferred. Using a electronic finishing sensor subsystem to control the finishing control parameters is preferred. Feedback information selected from the group consisting of finishing rate information and product quality information such as surface quality information is preferred. Non-limiting preferred examples of process rate information include polishing rate, planarizing rate, and workpieces finished per unit of time. Non-limiting preferred examples of quality information include first pass first quality yields, focal plane deviation, total thickness variation, measures of non uniformity. Non-limiting examples particularly preferred for electronics parts include Total Thickness Variation (TTV), Focal plane deviation (FPD), Within-Wafer Non-Uniformity (WIW NU), and surface quality.

In situ process control systems relying on workpiece finishing sensors are generally known to those skilled in the CMP industry. Commercial CMP equipment advertised by Applied Materials and IPEC reference some of this equipment.

A preferred finishing control subsystem (and/or control subsystem) has real time access to tracked information on the workpiece being finished to improve control of finishing control parameters in real time (in situ) during the finishing cycle time (or a portion of the finishing cycle time). A finishing control subsystem (and/or control subsystem) having at least three operative process sensors for sensing in situ process information, access to the tracked information; and a processor to evaluate the in situ process information and tracked information is preferred.

Cost of manufacture information is also preferred information for control. Cost of manufacture information comprises preferred information for tracking. Finishing uniformity parameters selected from the group consisting of Total Thickness Variation (TTV), Focal plane deviation (FPD), Within-Wafer Non-Uniformity (WIW NU), and surface quality can be information for tracking. Total Thickness Variation (TTV), Focal plane deviation (FPD), Within-Wafer Non-Uniformity (WIW NU), and surface quality are illustrative preferred data types for tracking, particularly for multi-level semiconductor wafers where one levels data can be helpful for in situ control while finishing a different level. Types of cost of manufacture information can be preferred data types. Semiconductor wafer film or layer thickness is another illustrative example of data type of tracked information for in situ control since this can also help optimizing the in situ adjustment of finishing control parameters which change the local and/or macro coefficient of friction can generally aid finishing control.

The use of aqueous lubricating compositions in finishing, particularly those having boundary lubricants, in a preferred embodiment including operative friction sensor(s), friction sensor controllers, and friction sensor subsystems can be used to improve finishing. Supplying a marginal lubricant, preferably a lubricating film, and more preferably an organic lubricating boundary layer, with in situ process control to control the fraction of semiconductor wafer surface area free of organic boundary layer lubrication is preferred.

A mathematical equation developed from laboratory experience, semiworks experience, test wafer experience, and/or actual production can be preferred. Curve fitting to determine mathematical equations based on laboratory experience, semiworks experience, test wafer experience, and/or actual production are generally known to those skilled in the semiconductor arts. Curve fitting to determine mathematical formulas using historical performance can be preferred. Mathematical equations can be used also generally for interpolation and extrapolation. Multiple mathematical equations with multiple unknowns can be solved or resolved in real time for improved process control with a processor. Differential information from multiple workpiece sensors and/or friction sensors can generally be used to improve real time (in situ) control with a processor. A lubrication control subsystem, a friction sensor subsystem, a finishing control subsystem, and a control subsystem can generally use mathematical equations to aid control. A friction sensor subsystem having at least one friction sensors is preferred and having at least two friction sensors is more preferred. A friction sensor subsystem having at least one friction sensor probe is preferred and having at least two friction sensor probes is more preferred.

The in situ process control methods having features and benefits of the preferred methods of this invention are new and useful in the magnetic finishing elements industry.

Refining and Finishing Element Conditioning

A finishing element can be conditioned before use or between the finishing of workpieces. Conditioning a finishing element is generally known in the CMP field and generally comprises changing the finishing element finishing surface in a way to improve the finishing of the workpiece. As an example of conditioning, a finishing element having no basic ability or inadequate ability to absorb or transport an alternate finishing composition can be modified with an abrasive finishing element conditioner to have a new texture and/or surface topography to absorb and transport the alternate finishing composition. As a non-limiting preferred example, an abrasive finishing element conditioner having a mechanical mechanism to create a finishing element finishing surface which more effectively transports the alternate finishing composition is preferred. The abrasive finishing element conditioner having a mechanical mechanism to create a finishing element finishing surface which more effectively absorbs the alternate finishing composition is also preferred. An abrasive finishing element conditioner having a mechanical mechanism comprising a plurality of abrasive points which through controlled abrasion can modify the texture or surface topography of a finishing element finishing surface to improve alternate finishing composition absorption and/or transport is preferred. An abrasive finishing element conditioner having a mechanical mechanism comprising a plurality of abrasive points comprising a plurality of hard abrasives such as diamonds which through controlled abrasion can modify the texture and/or surface topography of a finishing element finishing surface to improve alternate finishing composition absorption and/or transport is preferred.

Modifying a virgin finishing element finishing surface with a finishing element conditioner before use is generally preferred. Modifying a finishing element finishing surface with a finishing element conditioner a plurality of times is also preferred. Conditioning a virgin finishing element finishing surface can improve early finishing performance of the finishing element by exposing any lubricants in the finishing element and can expose new fixed abrasive particles which can also change finishing. Nonlimiting examples of textures and topographies useful for improving transport and absorption of the alternate finishing composition and/or finishing element conditioners and general use are given in U.S. Pat. Nos. 5,216,843 to Breivogel, 5,209,760 to Wiand, 5,489,233 to Cook et. al., 5,664,987 to Renteln, 5,655,951 to Meikle et. al., 5,665,201 to Sahota, and 5,782,675 to Southwick and are included herein by reference in their entirety for general background and guidance and modification by those skilled in the art.

Further Comments

Some particularly preferred embodiments are now discussed in additional detail. The interface between the finishing element finishing surface and the workpiece being finished is referred to herein as the operative finishing interface.

Control with a finishing process subsystem having at least three process sensors can be used to improve finishing by sensing multiple changes in the operative finishing interface during real time and then calculating and adjusting for these changes in real time (in situ). By combining the information from at least three in situ process sensors with tracked information in real time, the semiconductor wafer tracked information such as micro and macro topography can be used to further enhance finishing control. Different data types can be preferred in the tracked information such as data types relating to prior process conditions and/or micro or macro topography information. This process information when coupled with tracked information can help improve in situ control when finishing a workpiece such as semiconductor wafer with lubricant. By controlling the change in the coefficient of friction in the operative interface multiple times during the finishing cycle time, finishing can generally be improved.

Polymeric abrasive asperities can be preferred for some finishing operations. Inorganic abrasive asperities can be preferred also for some finishing operations. Polymeric abrasive asperities, such as abrasive polymeric particles and/or abrasive polymeric material, are generally preferred for finishing softer workpieces and inorganic abrasive asperities are generally preferred for finishing harder workpiece surfaces. An abrasive finishing surface capable of inducing frictional wear to the workpiece surface being finished is preferred and an abrasive finishing surface capable of inducing tribochemical reactions on the workpiece surface during finishing is also preferred. A wear inducing finishing surface capable of inducing frictional wear to the workpiece surface being finished is even more preferred and a wear inducing finishing surface capable of inducing tribochemical reactions on the workpiece surface during finishing is also even more preferred. A wear inducing finishing surface capable of inducing plastic deformation of a workpiece surface comprised of a polymer is preferred and a wear inducing finishing surface capable of inducing plastic deformation of a workpiece surface comprised at least in part of an organic synthetic polymer is more preferred.

A preferred finishing element has a finishing surface comprising a multiphase polymeric finishing surface. A more preferred finishing element has a finishing surface comprising a multiphase polymeric finishing surface having at least two synthetic polymers (e.g. separate polymeric components). An even more preferred finishing element has a finishing comprising a multiphase polymeric finishing surface having at least three synthetic polymers (e.g. separate polymeric components).

By increasing the stiffness of the finishing element finishing surface, the pressure applied to the unwanted raised region can be increased. Flexural modulus as measured by ASTM 790 B at 73 degrees Fahrenheit is a useful guide to help raise the stiffness of a polymer finishing element. By adjusting the flexural modulus as measured by ASTM 790 B at 73 degrees Fahrenheit the pressure can be increased on the unwanted raised regions to increase finishing rates measured in Angstroms per minute. Applying at least two times higher pressure to the unwanted raised region when compared to the applied pressure in a lower region proximate unwanted raised region is preferred and applying at least three times higher pressure to the unwanted raised region when compared to the applied pressure in a lower region proximate unwanted raised region is more preferred and applying five times higher pressure to the unwanted raised region when compared to the applied pressure in a lower region proximate unwanted raised region is even more preferred. Because the lower region proximate the unwanted raised region can have a very low pressure, at most 100 times higher pressure in the unwanted raised regions compared to the pressure in a lower region proximate the unwanted raised region is preferred and at most 50 times higher pressure in the unwanted raised regions compared to the pressure in a lower region proximate the unwanted raised region is more preferred. Applying 2 to 100 times higher pressure to the unwanted raised region when compared to the applied pressure in a lower region proximate unwanted raised region is preferred and applying at least 3 to 100 times higher pressure to the unwanted raised region when compared to the applied pressure in a lower region proximate unwanted raised region is more preferred and applying 5 to 50 times higher pressure to the unwanted raised region when compared to the applied pressure in a lower region proximate unwanted raised region is even more preferred.

Applying an operative finishing motion wherein the unwanted raised regions have a temperature of at least 3 degrees centigrade higher than in the proximate low local region is preferred and finishing wherein the unwanted raised regions have a temperature of at least 7 degrees centigrade higher than in the proximate low local region is more preferred and finishing wherein the unwanted raised regions have a temperature of at least 10 degrees centigrade higher than in the proximate low local region is even preferred. Finishing wherein the unwanted raised regions have a temperature from 3 to 50 degrees centigrade higher than in the proximate low local region is preferred and finishing wherein the unwanted raised regions have a temperature from 7 to 45 degrees centigrade higher than in the proximate low local region is more preferred and finishing wherein the unwanted raised regions have a temperature of from 10 to 40 degrees centigrade higher than in the proximate low local region is even more preferred. By adjusting the flexural modulus of the finishing element finishing surface, lubricating film layer and preferably lubricating boundary layer, and the other control parameters discussed herein, finishing and planarization of semiconductor wafer surfaces can be accomplished. By adjusting the flexural modulus of the finishing element finishing surface, lubricating boundary layer, and the other control parameters discussed herein, finishing and planarization of semiconductor wafer surfaces can be accomplished.

An organic lubricating film which interacts with the semiconductor wafer surface is preferred. An organic lubricating film which adheres to the semiconductor wafer surface is preferred. An organic lubricating film which interacts with and adheres to the semiconductor wafer surface is more preferred. An organic lubricating film which interacts with the uniform region of the semiconductor wafer surface is preferred. An organic lubricating film which adheres to the uniform region of the semiconductor wafer surface is preferred. An organic lubricating film which interacts with and adheres to the uniform region of the semiconductor wafer surface is more preferred. A uniform functional region is a preferred uniform region. A conductive region is a preferred uniform functional region. A nonconductive region is a preferred uniform functional region. By having the organic lubricating film interact with and adhere to a uniform region of the semiconductor wafer surface, localized finishing control can be improved and unwanted surface defects can generally be reduced using the teaching and guidance herein.

Controlling the thickness of a lubricating film by changing at least one lubrication control parameter in a manner that changes the coefficient of friction in at least two different regions in the operative finishing interface in response to an in situ control signal is preferred. Controlling the thickness of the lubricating film by changing at least two process control parameters in situ based on feed back information from a lubrication control subsystem having a friction sensor is also preferred. Controlling at least once the thickness of the lubricating film which changes the coefficient of friction in the operative finishing interface by changing at least one process control parameter in situ based on feed back information from a control subsystem during the finishing cycle time is preferred. A semiconductor wafer surface having at least a first region wherein the lubricating film is at most one half the molecular layer thickness compared to the lubricating film thickness on a second, different region is preferred and a semiconductor wafer surface having at least a first region wherein the lubricating film thickness is at most one third the molecular layer thickness compared to the lubricating film on a second, different region is more preferred when controlling the coefficient of friction, particularly when controlling the changes in the coefficient of friction. Controlling the thickness of the lubricating film by changing at least one process control parameter in situ based on feed back information from a control subsystem during the finishing cycle time and wherein the control subsystem tracks and updates the feed back information for finishing a plurality of the metal layers is even more preferred for semiconductor wafers having multiple functional levels. An organic lubricating film is preferred. Lubricating films, preferably lubricating boundary layers, because of the small amount of preferred lubricant, are particularly effective lubricants for inclusion in finishing elements and/or the operative finishing interface.

A preferred control subsystem has access to cost of manufacture parameters, preferably useful cost of manufacture parameters, and even more preferably trackable and useful cost of manufacture parameters. A preferred example of generally useful cost of manufacture information is current cost of manufacture information which has been tracked and more preferably updated using generally known activity based accounting techniques. Another preferred example of useful cost of manufacture parameters is the cost of manufacture of manufacturing steps which preceded the current finishing step such as prior finishing steps, metallization steps, or interlayer dielectric steps. Another preferred example of useful cost of manufacture parameters is the cost of manufacturing steps which occur after the current finishing step such as later finishing steps, metallization steps, or interlayer dielectric steps. The current finishing step can affect the cost of manufacture of a later step because some defects such generally poor planarity can adversely impact latter manufacturing step costs such as by negativity impacting latter step yields. A finishing control subsystem (and/or a friction sensor subsystem and/or control subsystem) having access to cost of manufacture parameters is preferred and having access to current cost of manufacture parameters is more preferred and having trackable information is even more preferred.

Evaluating finishing control parameters in situ for improved adjustment using finishing control is preferred and using the finishing control parameters in situ at least in part for this improved adjustment of finishing control is more preferred. Evaluating finishing control parameters in situ with tracked information for improved adjustment of finishing control is preferred and using the finishing control parameters in situ at least in part for this improved adjustment of finishing control is more preferred. Cost of manufacture information is an example of preferred tracked information. Prior steps such as metallizing steps, annealing steps, insulating layers steps include nonlimiting examples of preferred tracked information. Prior steps can impact the preferred in situ control of finishing control parameters such as, but not limited to, lubricating changes to the operative finishing interface, preferred pressures, and preferred coefficient of friction (either regional or across the operative finishing interface. For instance, if the metal layer has larger crystals due to the type of annealing which are subject to "pickout defects", lower a lower coefficient of friction in the conductive region (such as copper or copper alloy) can be preferred. In another application, the semiconductor can have multiple layers of porous low-k insulating layers which have lower tensile strengths and can form unwanted defects if subjected to high forces of friction during finishing. Changing the lubricating of the operative finishing interface can reduce unwanted damage to the porous low-k layers. In another application, the interface between a conductive layer and a nonconductive layer can be of lower strength and thus again high forces of friction in the operative finishing interface can form unwanted defects which can cause unwanted yield losses during manufacture. Changing the finishing control parameters to reduce the coefficient of friction can aid in reducing unwanted yield losses. Thus tracked information can be used in situ to improve process control during finishing with a finishing control subsystem (and/or control subsystem). Providing a lubricant to the operative finishing interface comprising the interface formed between the abrasive finishing element finishing surface and the semiconductor wafer surface being finished is preferred. Providing a finishing control subsystem having at least two operative process sensors for sensing in situ process information and having access to the tracking information is preferred and providing a finishing control subsystem having at least three operative process sensors for sensing in situ process information and having access to the tracking information is more preferred and providing a finishing control subsystem having at least five operative process sensors for sensing in situ process information and having access to the tracking information is even more preferred. A finishing control subsystem can be a preferred control subsystem. Changing a control parameter in response to the in situ process information and tracking information which changes the coefficient of friction and/or tangential force of friction during at least a portion of the finishing cycle time is preferred and which changes the coefficient of friction and/tangential force of friction in a uniform region of the workpiece surface is more preferred and which changes the coefficient of friction and/tangential force of friction in a plurality uniform regions of the workpiece surface is even more preferred.

A method which updates the cost of manufacture control parameters, look-up tables, algorithms, or control logic consistent with the current manufacturing step is preferred. A method which updates the tracked information such as the cost of manufacture control parameters, look-up tables, algorithms, or control logic consistent with the current manufacturing step while evaluating prior manufacturing steps (such as completed manufacturing steps) is more preferred. A method which updates with tracked information such as the cost of manufacture control parameters, look-up tables, algorithms, or control logic consistent with the current manufacturing step while evaluating future manufacturing steps is even preferred. A method which updates with tracked and/or trackable information (such as projectable information) such as the cost of manufacture control parameters, look-up tables, algorithms, or control logic consistent with the current manufacturing step while evaluating both prior and future manufacturing steps is even more preferred. Memory look-up tables and databases can have preferred data types. A tracking code is a preferred method to aid evaluation of prior, current, and future manufacture steps. The tracking code can be by individual semiconductor wafer and/or by semiconductor wafer batch. This can facilitate low cost manufacture and improved in situ control of lubrication (such as lubricating films and/or active lubrication). This is preferred for multi-level semiconductor wafer processing because one level finishing can affect the next level finishing. This is because a defect formed on one layer can generally affect (usually adversely) the next level(s). Further, the type and composition of each layer can impact the improved real time control of finishing such as where a particular layer has a reduced strength due to porosity.

A process control parameter which changes the friction during finishing is a preferred process control parameter and a process control parameter which changes the coefficient of friction is a more preferred process control parameter. Supplying and controlling a finishing aid to the workpiece surface being finished having a property selected from the group consisting of changing the workpiece surface coefficient of friction, changing workpiece surface average cut rate, and changing the cut rate of a specific material of the workpiece surface being finished is particularly preferred. Changing the pressure at the operative finishing interface to detect potential changes in the coefficient of friction is preferred and changing the pressure at least four times at the operative finishing interface to detect potential changes in the coefficient of friction is more preferred and changing the pressure at least ten times at the operative finishing interface to detect potential changes in the coefficient of friction is more preferred and changing the pressure at least twenty times at the operative finishing interface to detect potential changes in the coefficient of friction is more preferred. Controlling at least one finishing control parameter changing the effective coefficient of friction in the operative finishing interface is preferred. Providing an effective amount of an aqueous lubricating composition between the finishing element surface and the workpiece being finished for at least a portion of the finishing time in order to reduce the coefficient of friction or a calculated effective coefficient of friction between the finishing element surface and the workpiece being finished and providing a separate alternate finishing composition between the finishing element finishing surface and the workpiece being finished for at least a portion of the finishing time is also preferred.

A lubrication control parameter is a parameter which affects the lubrication of the operative finishing interface. A lubrication control parameter is a preferred process control parameter. A lubricating control parameter is a parameter which affects the lubrication in the operative finishing interface—such as regional lubrication or average lubrication. A lubricating control parameter selected from the group consisting of the lubricant chemistry, lubricant concentration, lubricant transfer rate, operative finishing interface temperature, operative finishing interface pressure, and operative finishing interface motion is a preferred group of lubricating boundary layer control parameters. A parameter selected from the group consisting of the local lubricant chemistry, local lubricant concentration, local lubricant feed rate, local operative finishing interface temperature, local operative finishing interface pressure, and local operative finishing interface motion is also a preferred group of lubricating control parameters.

A method of finishing wherein the controlling and adjusting the process control parameters changes either one or both the tangential force of friction or the coefficient of friction in the operative finishing interface is preferred and wherein adjusting the process control parameters change one or both the tangential force of friction or the coefficient of friction two times in the operative finishing interface during the finishing cycle time is more preferred and wherein adjusting the process control parameters change one or both the tangential force of friction or the coefficient of friction four times in the operative finishing interface during the finishing cycle time is even more preferred. A plurality of friction sensors generally aids this advanced control. Use of a plurality of cost of manufacture parameters also generally aids this advanced control to reduce the finishing cost of the semiconductor wafer. A method of finishing wherein the semiconductor wafer surface has at least one uniform region and controlling and adjusting at least 4 times a minimum of three process control parameters changes a coefficient of friction in at least the uniform region of the semiconductor wafer surface at least two times during the finishing cycle time is preferred. A method of finishing wherein the semiconductor wafer surface has at least one uniform region wherein the controlling and adjusting at least 4 times a minimum of two process control parameters changes in a tangential force of friction in at least a region of the operative finishing interface at least two times during the finishing cycle time is preferred.

Controlling the thickness of a lubricating film by changing at least one lubrication control parameter in a manner that changes the coefficient of friction in at least two different regions in the operative finishing interface in response to an in situ control signal is preferred. Controlling the thickness of the lubricating film by changing at least two process control parameters in situ based on feed back information from a lubrication control subsystem having a friction sensor is also preferred. Controlling at least once during the refining cycle time the thickness of the lubricating film which changes the coefficient of friction in the operative finishing interface by changing at least one process control parameter in situ based on feed back information from a control subsystem during the finishing cycle time is preferred. A semiconductor wafer surface having at least a first region wherein the lubricating film is at most one half the molecular layer thickness compared to the lubricating film thickness on a second, different region is preferred and a semiconductor wafer surface having at least a first region wherein the lubricating film thickness is at most one third the molecular layer thickness compared to the lubricating film on a second, different region is more preferred when controlling the coefficient of friction, particularly when controlling the changes in the coefficient of friction. Controlling the thickness of the lubricating film by changing at least one process control parameter in situ based on feed back information from a control subsystem during the finishing cycle time and wherein the control subsystem tracks and updates the feed back information for finishing a plurality of the metal layers is even more preferred for semiconductor wafers having multiple functional levels. An organic lubricating film is preferred.

A multiplicity of operative process sensors which includes a plurality of operative friction sensors is preferred and which includes at least three operative friction sensors is more preferred and which includes at least four operative friction sensors is even more preferred and which includes at least five operative friction sensors is even more particularly preferred. Comparing the in situ process information obtained from a plurality of the operative friction sensors is a preferred and comparing the in situ process information obtained from at least three of the operative friction sensors is more preferred and comparing the in situ process information obtained from at least four of the operative friction sensors is even more preferred and comparing the in situ process information obtained from at least five of the operative friction sensors is even more particularly preferred. By having multiple operative friction sensor information compared, preferably with mathematical expressions, algorithms, memory look-up tables and/or with data bases, differential localized lubrication such as on uniform regions in the operative finishing interface can better be detected, quantified, and controlled by controlling the finishing control parameters in real time. Preferred control of the finishing control parameters can reduce unwanted surface defects and increase manufacturing yields.

Providing an abrasive magnetic finishing element finishing surface for finishing is preferred and providing a three dimensional abrasive magnetic finishing element finishing surface for finishing is more preferred and providing a fixed abrasive magnetic finishing surface for finishing is even more preferred and providing a three dimensional fixed abrasive magnetic finishing member finishing surface a finishing surface for finishing is even more particularly preferred. Fixed abrasive finishing generally produces less particulates to clean from the workpiece surface during finishing. Providing the workpiece surface being finished proximate to the finishing surface is preferred and positioning the workpiece surface being finished proximate to the finishing surface is more preferred. Using an abrasive magnetic finishing element along with a finishing composition free of abrasive particles improves the ability to optically measure the finishing progress in real time and provide feedback information for improved process control.

Applying a magnetically induced parallel operative finishing motion between the workpiece surface being finished and the magnetic finishing element finishing surface is preferred. The magnetically induced parallel operative finishing motion creates at least in part, the parallel movement and pressure which supplies the finishing action such as chemical reactions, tribochemical reactions and/or abrasive wear. Applying a magnetically induced operative finishing motion in a manner to maintain a substantially parallel relationship between the discrete finishing member finishing surface and the workpiece surface being finished is preferred. Applying a magnetically generated operative finishing motion for forming a lubricating boundary layer is preferred. Applying an operative finishing motion that transfers finishing aid to the interface between the finishing surface and the workpiece surface being finished is preferred and applying an operative finishing motion that transfers the finishing aid, forming a marginally effective lubricating layer between the finishing surface and the workpiece surface being finished is more preferred and applying an operative finishing motion that transfers the finishing aid, forming a effective marginally lubricating boundary layer between the finishing surface and the workpiece surface being finished is even more preferred. The lubrication at the interface reduces the occurrence of high friction and related workpiece surface damage. Applying an operative finishing motion that transfers the finishing aid, forming a lubricating boundary layer between at least a portion of the finishing surface and the semiconductor wafer surface being finished is preferred and applying an operative finishing motion that transfers the finishing aid, forming a marginally effective lubricating layer between at least a portion of the finishing surface and the semiconductor wafer surface being finished so that abrasive wear occurs to the semiconductor wafer surface being finished is more preferred and applying an operative finishing motion that transfers the finishing aid, forming a marginally effective lubricating boundary layer between at least a portion of the finishing surface and the semiconductor wafer surface being finished so that tribochemical wear occur to the semiconductor wafer surface being finished is even more preferred and applying an operative finishing motion that transfers the finishing aid, differentially lubricating different regions of the heterogeneous semiconductor wafer surface being finished even more particularly preferred. With heterogeneous workpiece surfaces, the potential to differentially lubricate and finish a workpiece surface has high value where the differential lubrication is understood and controlled.

A finishing aid selected from the group consisting of a lubricating aid and chemically reactive aid is preferred. Forming a hydrodynamic lubricating layer in the operative finishing interface is preferred. Forming a lubricating film layer in the operative finishing interface is preferred. Forming an organic lubricating boundary layer in the operative finishing interface is more preferred. Both types of lubrication can help reduce unwanted surface defects. An organic lubricating boundary layer generally has a higher finishing rate. A finishing aid which reacts with the workpiece surface being finished is preferred and which reacts with a portion of the workpiece surface being finished is more preferred and which differentially reacts with heterogeneous portions of a workpiece surface being finished is even more preferred. An organic lubricating boundary layer which adheres to the semiconductor wafer being finished (and/or regions being finished) is preferred. By reacting with the workpiece surface, control of finishing rates can be improved and some surface defects minimized or eliminated. A finishing aid which reduces friction during finishing is also preferred because surface defects can be minimized.

Supplying a finishing aid to the workpiece surface being finished which changes the rate of a chemical reaction is preferred. Supplying a finishing aid to the workpiece surface being finished having a property selected from the group consisting of workpiece surface coefficient of friction change, workpiece finish rate change, a heterogeneous workpiece surface having differential coefficient of friction, and a heterogeneous workpiece surface having differential finishing rate change which reduces unwanted damage to the workpiece surface is particularly preferred. By supplying a finishing aid, preferably an organic lubricant, to operative finishing interface to change the coefficient of friction, the finishing aid cooperates in a new, unexpected manner with the finishing element and its discrete finishing members. The shear forces during finishing are reduced on the discrete finishing member thereby changing the shear induced motion of the discrete finishing member during finishing of the workpiece surface. This can reduce unwanted surface damage to the workpiece surface being finished.

Using the method of this invention to finish a workpiece, especially a semiconductor wafer, by controlling finishing for a period of time with an electronic control subsystem connected electrically to the finishing equipment control mechanism to adjust in situ at least one finishing control parameter that affect finishing selected from the group consisting of the finishing rate and the finishing uniformity is preferred. Finishing control parameters are selected from the group consisting of the finishing composition, finishing composition feed rate, finishing temperature, finishing pressure, operative finishing motion velocity and type, and finishing element type and condition change are preferred. The electronic control subsystem is operatively connected electrically to the lubrication control mechanism. The measurement and control subsystem can be separate units and/or integrated into one unit. A preferred method to measure finishing rate is to measure the change in the amount of material removed in angstroms per unit time in minutes (.ANG./min). Guidance on the measurement and calculation for polishing rate for semiconductor part is found in U.S. Pat. No. 5,695,601 to Kodera et. al. issued in 1997 and is included herein in its entirety for illustrative guidance.

An average finishing rate range is preferred, particularly for workpieces requiring very high precision finishing such as in processing electronic wafers. Average cut rate is used as a preferred metric to describe preferred finishing rates. Average cut rate is metric generally known to those skilled in the art. For electronic workpieces, and particularly for semiconductor wafers, a cut rate of from 100 to 25,000 Angstroms per minute on at least a portion of the workpiece is preferred and a cut rate of from 200 to 15,000 Angstroms per minute on at least a portion of the workpiece is more preferred and a cut rate of from 500 to 10,000 Angstroms per minute on at least a portion of the workpiece is even more preferred and a cut rate of from 500 to 7,000 Angstroms per minute on at least a portion of the workpiece is even more particularly preferred and a cut rate of from 1,000 to 5,000 Angstroms per minute on at least a portion of the workpiece is most preferred. A finishing rate of at least 100 Angstroms per minute for at least one of the regions on the surface of the workpiece being finished is preferred and a finishing rate of at least 200 Angstroms per minute for at least one of the materials on the surface of the workpiece being finished is preferred and a finishing rate of at least 500 Angstroms per minute for at least one of the regions on the surface of the workpiece being finished is more preferred and a finishing rate of at least 1000 Angstroms per minute for at least one of the regions on the surface of the workpiece being finished is even more preferred where significant removal of a surface region is desired. During finishing there are often regions where the operator desires that the finishing stop when reached such as when removing a conductive region (such as a metallic region) over a non conductive region (such as a silicon dioxide region). For regions where it is desirable to stop finishing (such as the silicon dioxide region example above), a finishing rate of at most 1500 Angstroms per minute for at least one of the regions on the surface of the workpiece being finished is preferred and a finishing rate of at most 500 Angstroms per minute for at least one of the materials on the surface of the workpiece being finished is preferred and a finishing rate of at most 200 Angstroms per minute for at least one of the regions on the surface of the workpiece being finished is more preferred and a finishing rate of at most 100 Angstroms per minute for at least one of the regions on the surface of the workpiece being finished is even more preferred where significant removal of a surface region is desired. The finishing rate can be controlled lubricants and with the process control parameters discussed herein.

The average cut rate can be measured for different materials on the surface of the semiconductor wafer being finished. For instance, a semiconductor wafer having a region of tungsten can have a cut rate of 6,000 Angstroms per minute and region of silica cut rate of 500 Angstroms per minute. As used herein, selectivity is the ratio of the cut rate of one region divided by another region. As an example the selectivity of the tungsten region to the silica region is calculated as 6,000 Angstroms per minute divided by 500 Angstroms per minute or selectivity of tungsten cut rate to silica cut rate of 12. An lubricating properties of the finishing element can change the selectivity. It is currently believed that this is due to differential lubrication in the localized regions. Changing the lubricating properties of the finishing element to advantageously adjust the selectivity during the processing of a group of semiconductor wafer surfaces or a single semiconductor wafer surface is preferred. Changing lubricating properties of the finishing element to advantageously adjust the cut rate during the processing of a group of semiconductor wafer surfaces or a single semiconductor wafer surface is preferred. Adjusting the lubricating properties of the finishing element by changing finishing elements proximate a heterogeneous surface to be finished is preferred. A finishing element with high initial cut rates can be used initially to improve semiconductor wafer cycle times. Changing to a finishing element having dispersed lubricants and a different selectivity ratio proximate a heterogeneous surface to be finished is preferred. Changing to a finishing element having dispersed lubricants and a high selectivity ratio proximate a heterogeneous surface to be finished is more preferred. In this manner customized adjustments to cut rates and selectivity ratios can be made proximate to critical heterogeneous surface regions. Commercial CMP equipment is generally known to those skilled in the art which can change finishing elements during the finishing cycle time of a semiconductor wafer surface. As discussed above, finishing a semiconductor wafer surface only a portion of the finishing cycle time with a particular finishing element having dispersed lubricants proximate a heterogeneous surface is particularly preferred.

Finishing a semiconductor wafer in with the discrete finishing members in contact with at least 3 high finishing rate local regions measured in angstroms per minute is preferred and in contact with at least 4 high finishing rate local regions measured in angstroms per minute is more preferred and in contact 5 high finishing rate local regions measured in angstroms per minute is even more preferred. Finishing a semiconductor wafer in with the discrete finishing members in abrasive contact with at least 3 high finishing rate local regions measured in angstroms per minute is preferred and in abrasive contact with at least 4 high finishing rate local regions measured in angstroms per minute is more preferred and in abrasive contact 5 high finishing rate local regions measured in angstroms per minute is even more preferred. This leads to high local regions having high finishing rates (in the areas of higher pressure and/or lower lubrication) and improved planarity on the semiconductor wafer surface.

Using finishing technology of this invention to remove raised surface perturbations and/or surface imperfections on the workpiece surface being finished is preferred. Using the method of this invention to finish a workpiece, especially a semiconductor wafer, at a planarizing rate and/or planarizing uniformity according to a controllable set of operational parameters that upon variation change the planarizing rate and/or planarizing uniformity and wherein at least two operational parameters are selected from the group consisting of the type of lubricant, quantity of lubricant, and time period lubrication is preferred. Using the method of this invention to polish a workpiece, especially a semiconductor wafer, wherein an electronic control subsystem connected electrically to an operative lubrication feed mechanism adjusts in situ the subset of operational parameters that affect the planarizing rate and/or the planarizing uniformity and wherein the operational parameters are selected from the group consisting of the type of lubricant, quantity of lubricant, and time period lubrication is preferred. The electronic control subsystem is operatively connected electronically to the operative lubrication feed mechanism.

Using the method of this invention to polish or planarize a workpiece, especially a semiconductor wafer, supplying lubrication moderated by a finishing element having at least a discrete finishing member and a magnetic composite member is preferred. Forming a lubricating boundary layer in the operative finishing interface with a finishing element having at least a discrete finishing member and a magnetic composite member is more preferred. Forming a lubricating boundary layer in the operative finishing interface with a finishing element having at least a discrete finishing member, the discrete finishing member comprising a multiphase polymeric composition, and a magnetic composite member is even more preferred. A finishing element having a magnetic composite member which is free of contact with the workpiece surface during finishing is preferred for finishing some workpieces. Applying a magnetically induced operative finishing motion forming a organic boundary lubricating layer separating at least a portion of the discrete finishing member finishing surface from the workpiece surface being finished while the unitary resilient body is separated by more than the thickness of the organic boundary lubricating thickness is even more preferred. In other words, applying a operative finishing motion wherein the unitary resilient body is free of contact with the workpiece surface is preferred for some finishing operations.

Applying a variable pressure to the backside surface of the discrete finishing member is preferred. Applying a magnetically variable pressure to the backside surface of the discrete finishing member is more preferred. Applying a magnetically controllable pressure to the backside surface of the discrete finishing member is more preferred. Applying a magnetically controllable pressure to the backside surface of the discrete finishing member wherein the magnetic pressure is controlled by varying electromagnets is even more preferred. Applying a pressure which varies across the backside surface of the discrete finishing member is preferred. Applying a pressure which varies across at least a portion of the backside surface of the magnetic finishing element finishing surface is preferred. Applying a pressure which varies across at least a portion of the backside surface of the discrete finishing member is more preferred. Particularly preferred is wherein the magnetically variable pressure is applied to a unitary resilient body.

A method for finishing having at least two of a plurality of magnetically responsive finishing elements having different parallel operative finishing motions is preferred. A method for finishing having at least two of the plurality of magnetically responsive finishing elements having different finishing surfaces is preferred. A method for finishing having at least two of the plurality of magnetically responsive finishing elements having different parallel operative finishing motions for at least a portion of the finishing cycle time is more preferred. A method for finishing having at least two of the plurality of magnetically responsive finishing elements having different finishing surfaces, one being more abrasive and one being less abrasive, for at least a portion of the finishing cycle time is more preferred. A magnetic driving element is capable of magnetically coupling with the magnetically responsive finishing element is preferred. A magnetic driving element that is capable of moving the magnetically responsive finishing surface in a parallel orientation relative to the semiconductor wafer surface being finished, forming an operative finishing motion is also preferred. A plurality of the magnetic driving elements magnetically coupling with a plurality of the magnetically responsive finishing elements is more preferred. A magnetic driving element that is capable of moving the magnetically responsive finishing surface in a parallel orientation relative to the semiconductor wafer surface being finished, forming an operative finishing motion is more preferred. By having these preferred embodiments, finishing versatility is generally enhanced.

Finishing the workpiece being finished with a plurality of magnetic finishing elements and wherein each finishing element has a plurality of discrete finishing members is preferred. Simultaneously finishing the workpiece being finished with a plurality of magnetic finishing elements and wherein each finishing element has a plurality of discrete finishing members is preferred. Preferred examples of different finishing elements consist of finishing elements selected from the group having different discrete finishing members, different abrasives (or one with abrasive and one abrasive free) and/or different unitary resilient bodies. Preferred examples of discrete finishing members comprise discrete finishing members having different shapes, different sizes, different abrasives, different types of abrasives, different finishing aids, different hardness, different resilience, different composition, different porosity, and different flexural modulus. Preferred examples of unitary resilient body comprise unitary resilient bodies having different shapes, different sizes, different finishing aids, different hardness, different resilience, different composition, different porosity, and different flexural modulus. By using different finishing elements, one can finish the workpiece surface in stages. By staging the finishing, unwanted damage to the workpiece surface can generally be reduced.

Finishing with an operative finishing interface being free of purposely introduced inorganic abrasives can be preferred for some finishing applications wherein the surface is particularly prone to damage easily. Finishing with an operative finishing interface being free of purposely introduced inorganic abrasives and having organic polymeric abrasives can be preferred for some finishing applications wherein the surface is a little more robust and/or where light polishing or buffing is desired. Said in other words, finishing in the interface between a magnetic element finishing surface and the workpiece surface being finished wherein the magnetic finishing element finishing surface is free of inorganic abrasives and any added finishing composition is free of inorganic abrasives is preferred. An example of a particularly delicate semiconductor wafer surface are some of the multi-level semiconductors which have used some of the current low-k dielectrics. For instance, a finishing surface having a preferred flexural modulus organic synthetic resin containing a higher modulus organic synthetic resin particles can be preferred.

Embodiments (and elements thereof), alone and/or in a combination with other guidance contained herein, can improve the refining by adding versatility to the manufacturing method of the workpiece, enhancing versatility of the refining apparatus, reducing equipment costs, reducing manufacturing costs of the workpiece, and/or improving manufacturing yields and are illustrative examples of preferred embodiments.

Figure 17A:
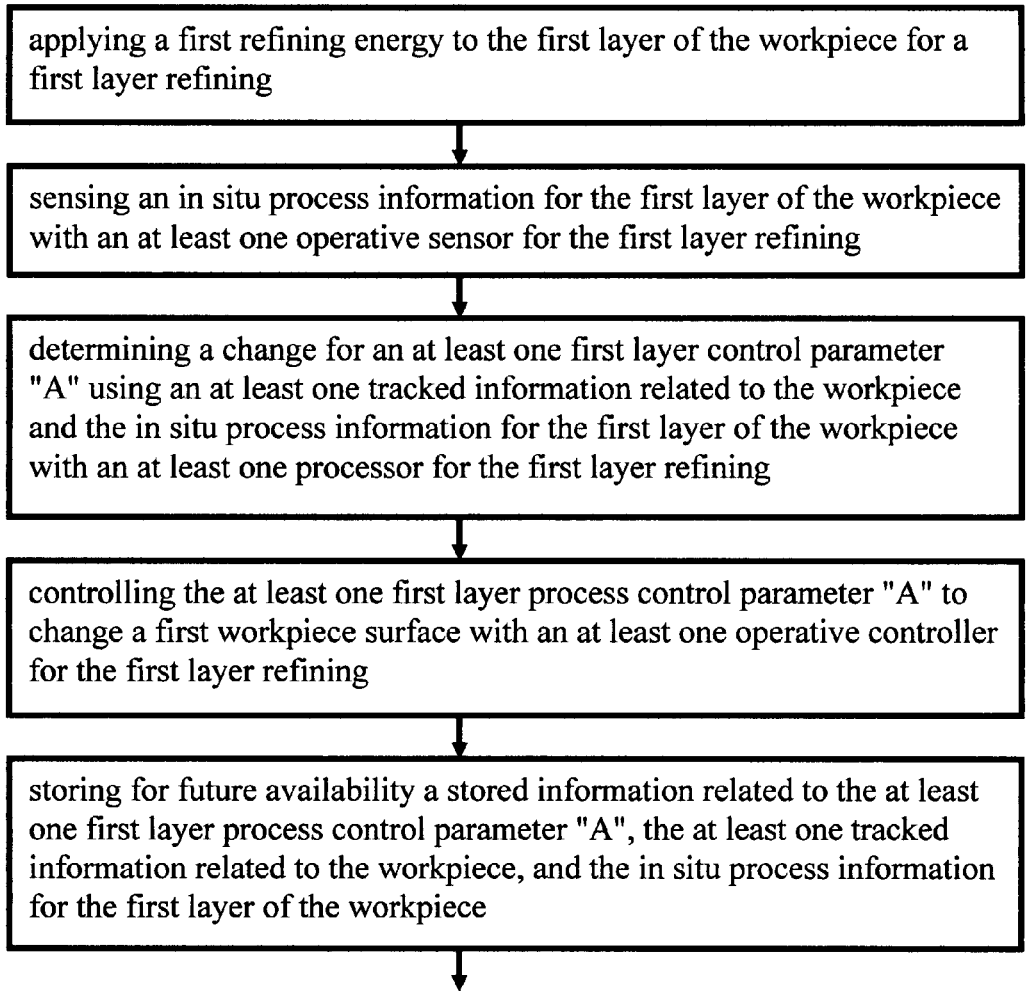
FIGS. 17a and 17b is preferred method
Figure 17B:
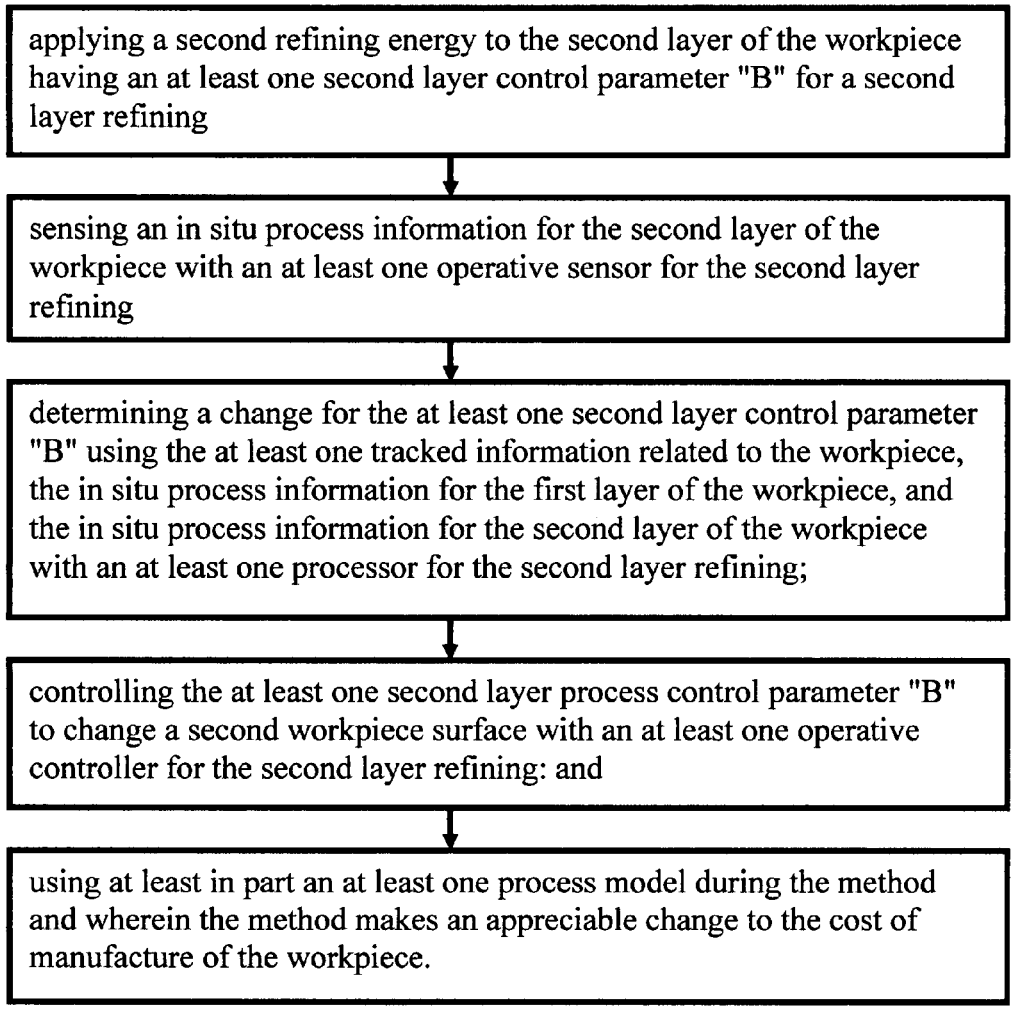
Figure 18A:
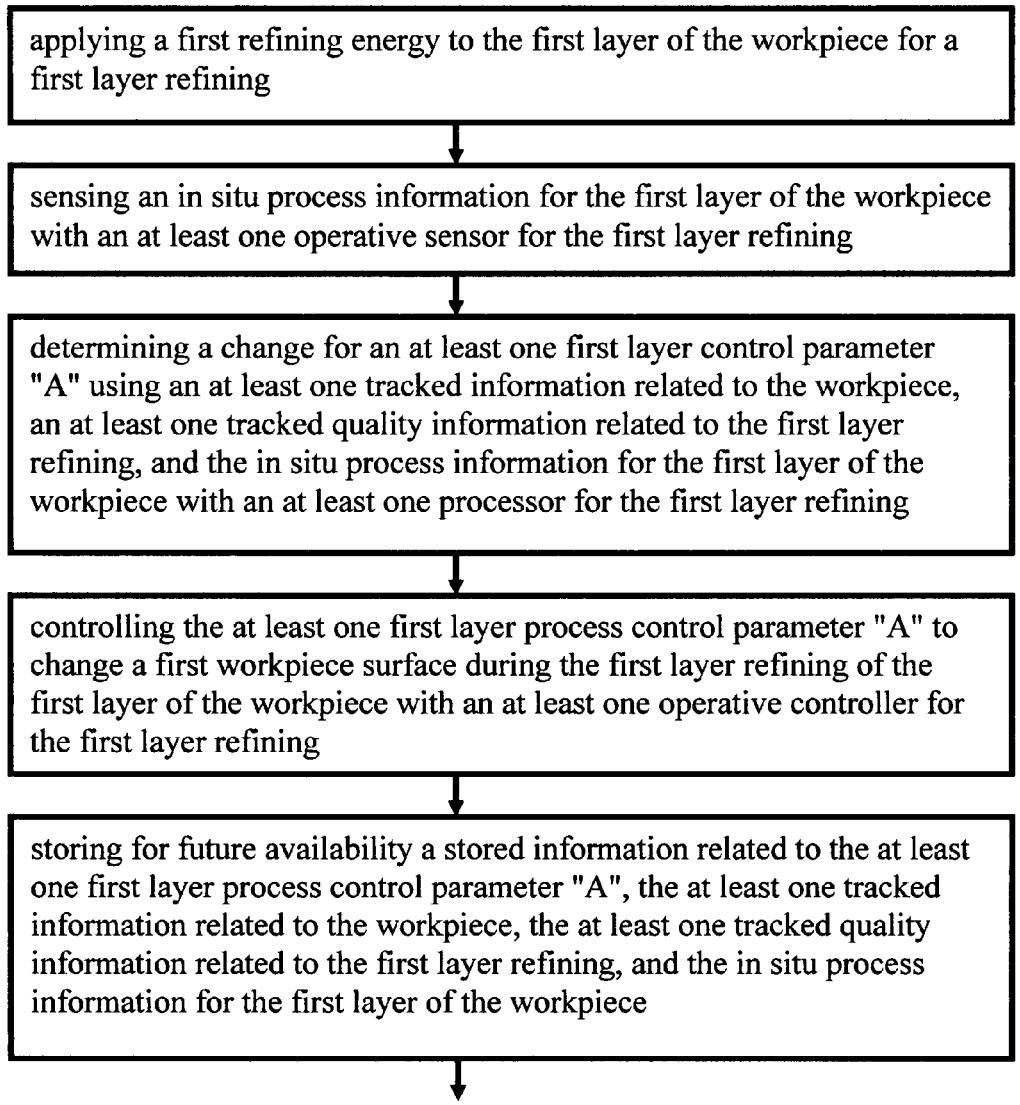
FIGS. 18a and 18b is preferred method
Figure 18B:
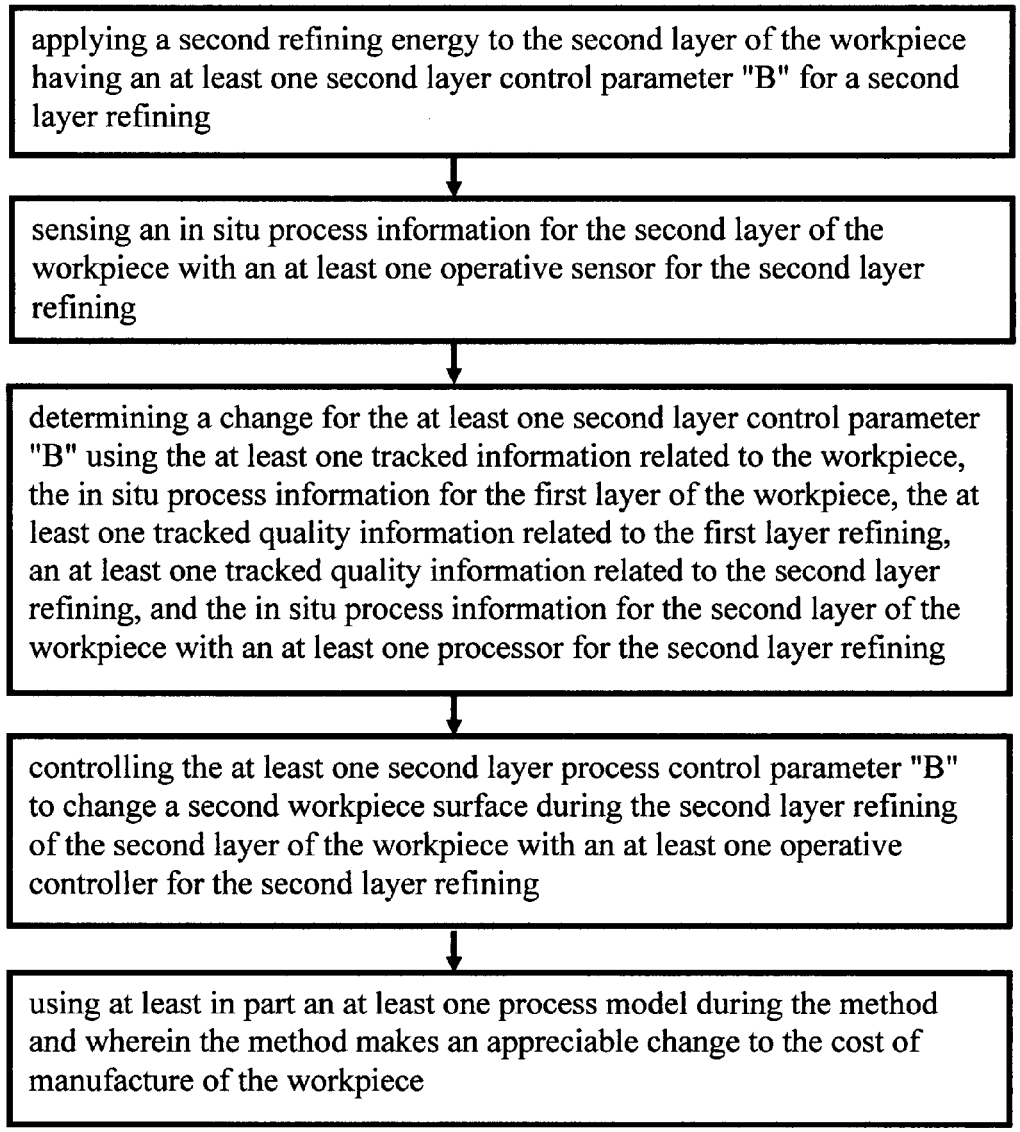
Figure 19A:
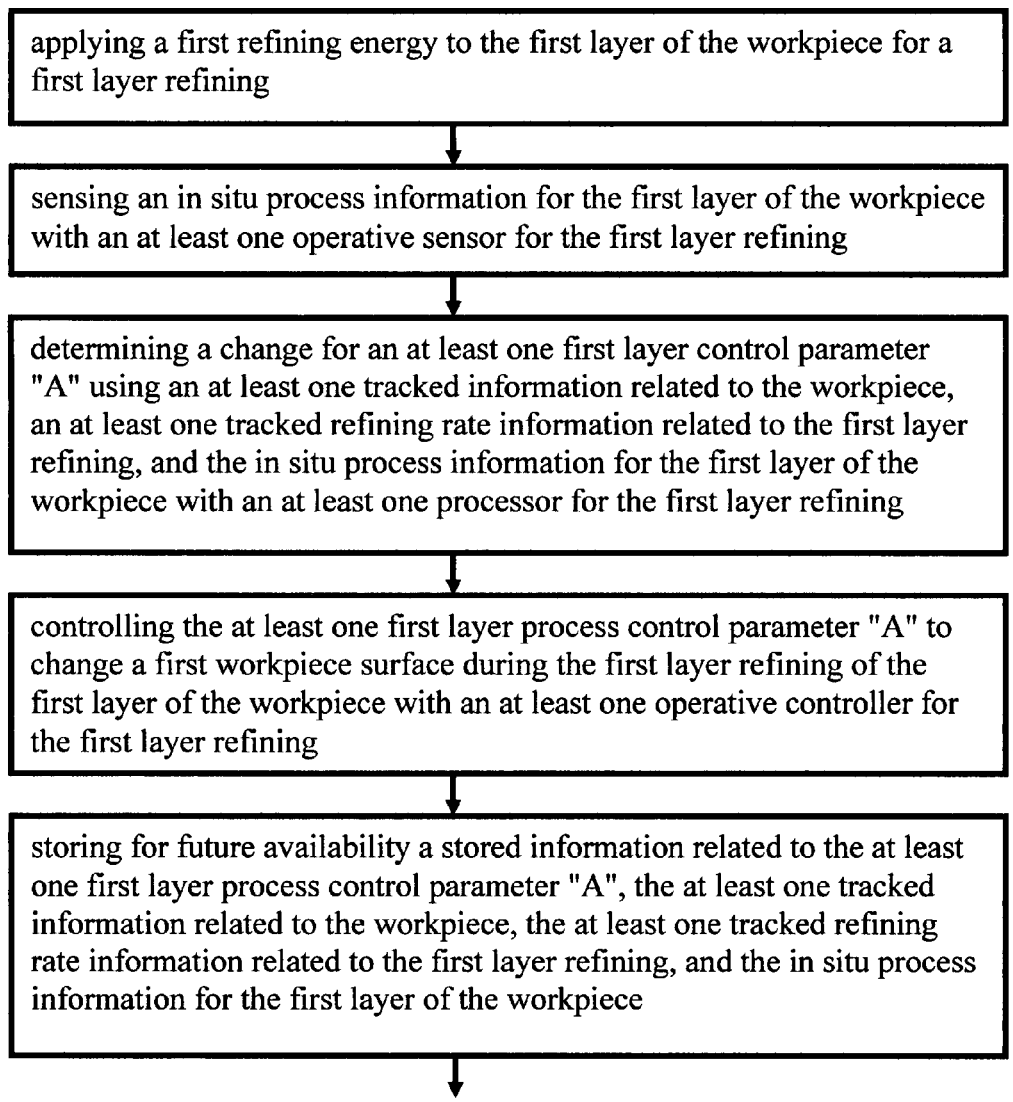
FIGS. 19a and 19b is preferred method
Figure 19B:
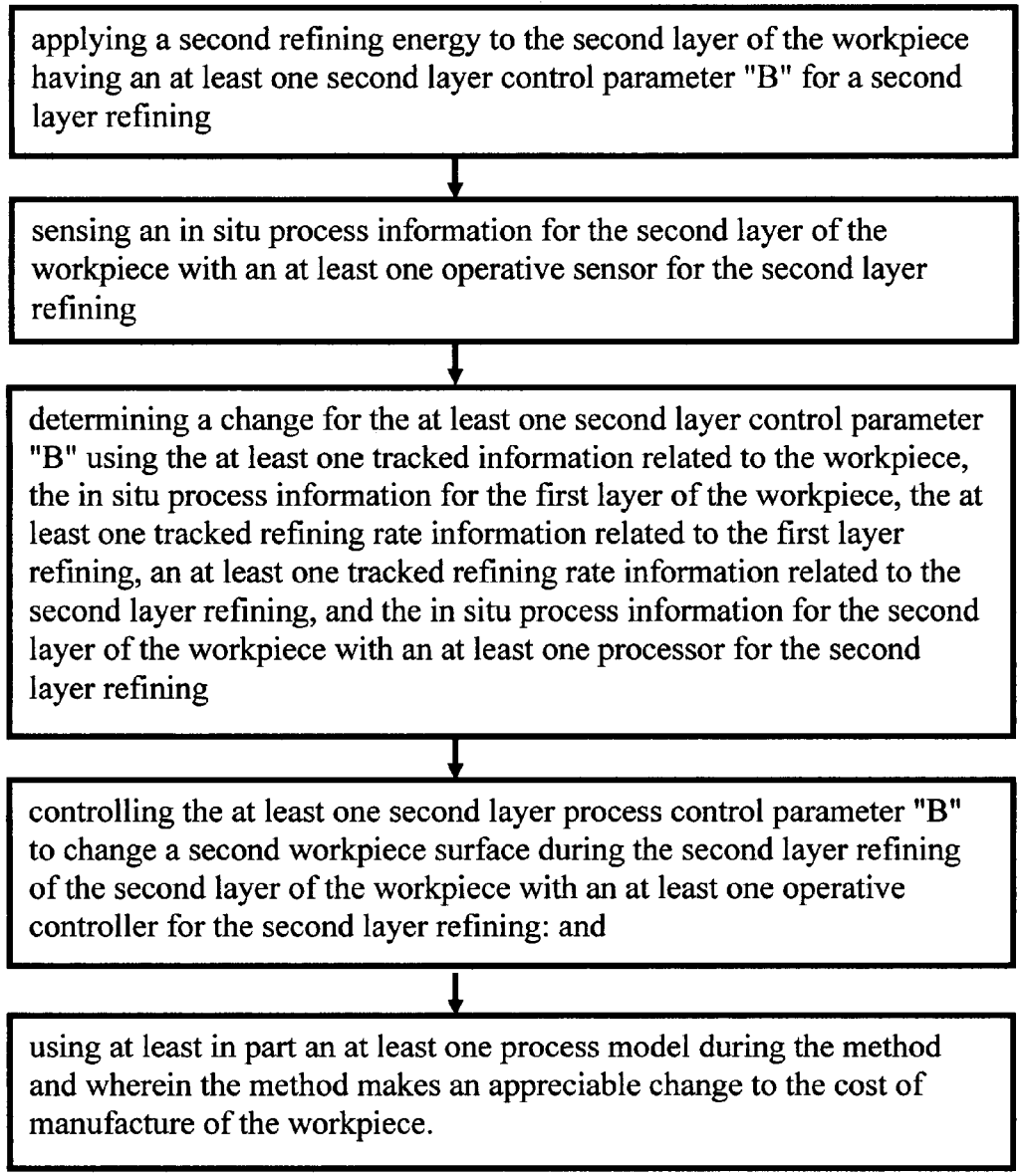
Figure 20A:
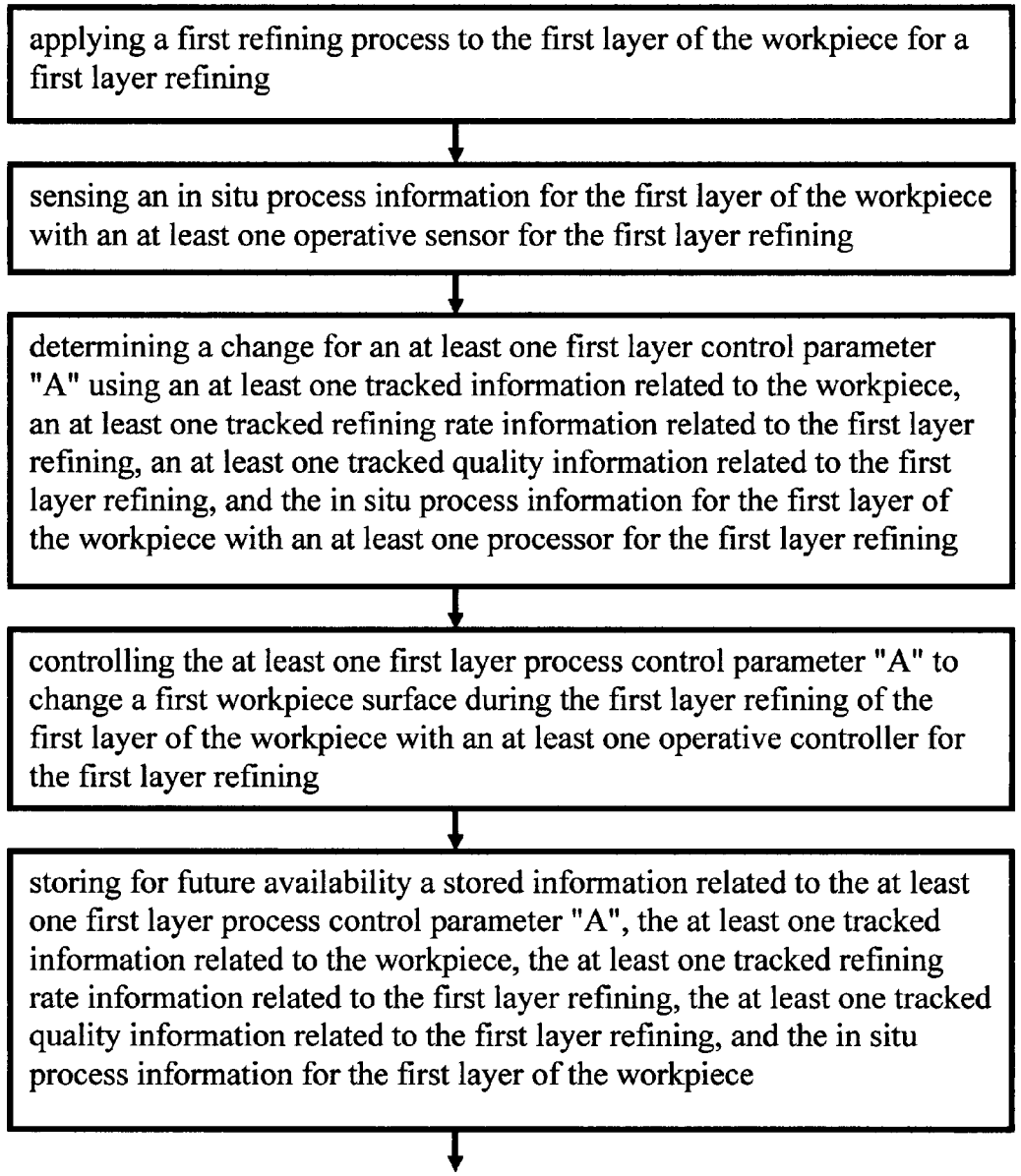
FIGS. 20a and 20b is preferred method
Figure 20B:
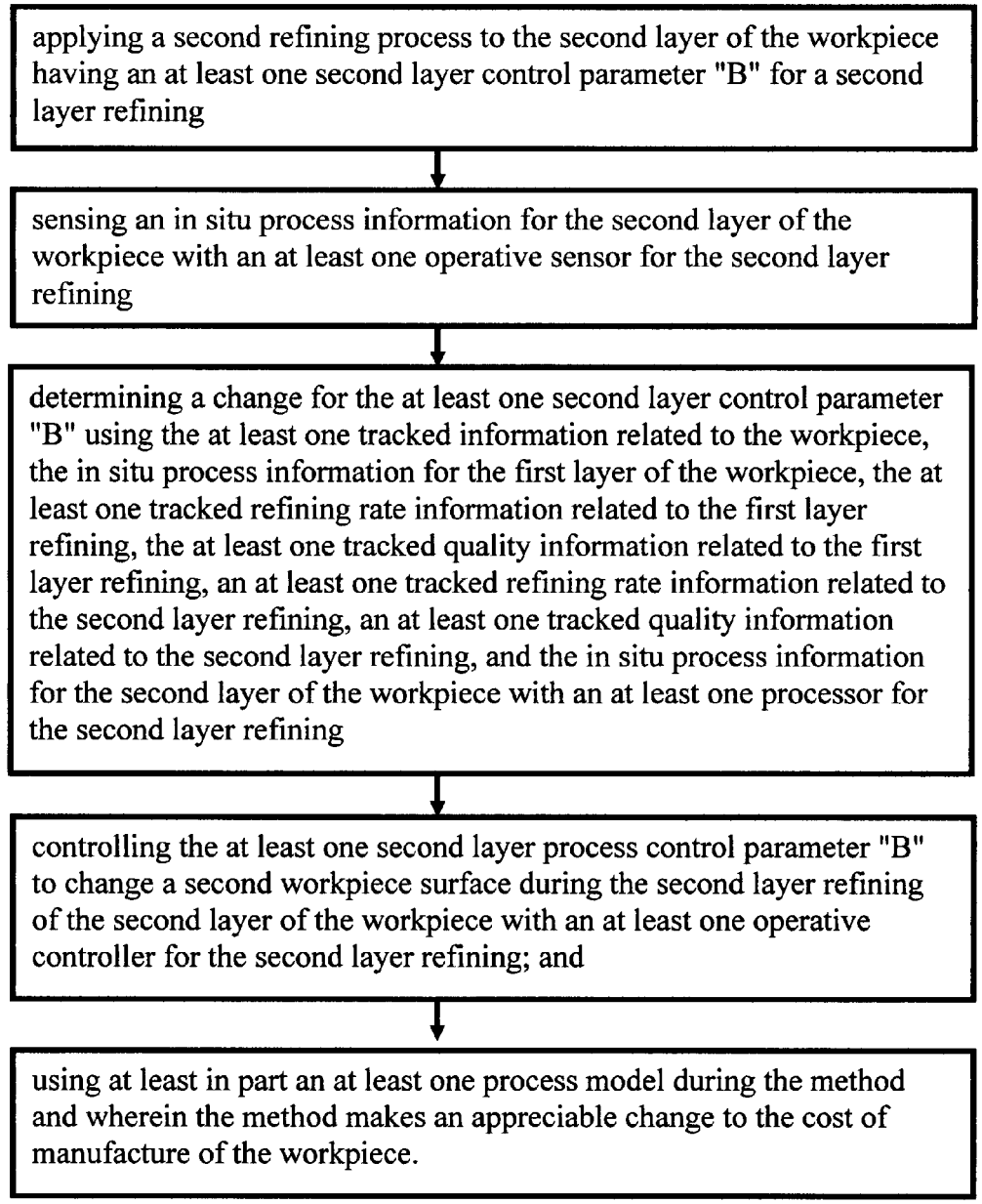

FIGS. 17a and 17b illustrate a preferred method. FIGS. 18a and 18b illustrate a preferred method. FIGS. 19a and 19b illustrate a preferred method. FIGS. 20a and 20b illustrate a preferred method. They illustrate some useful details of preferred methods of refining. Although these figures are somewhat simplified for clarity those of ordinary skill in the art will generally be able to understand them and use them given the teachings and guidance contained herein. As an illustrative example, storage of information can be performed at different times including simultaneously with some steps (such as using and storing at the same time or in a different time). As another illustrative example, storage of information can be done when sensing information and/or when using information or after using the information. As another illustrative example, storage of information can be done when determining information and/or when using information or after using the information. Various control and/or processing loops can be used are typical in the control industry and exemplified in some references incorporated by reference herein for illustration and modification by those skilled in the arts. Thus the steps, processes, and/or operations can be completed using generally known process control technology by using the teachings and guidance contained herein. As yet another example, a refining motion can be applied independent of electro-refining. As yet another example, electro-refining and refining motion can be linked by a mathematical algorithm. As yet another example, electro-refining can follow one mathematical expression and refining motion can follow a different mathematical expression. Changes can be related to the various layers or refining operations during processing of the workpiece.

A manufactured article having a processor readable medium with computer readable instructions for performing the preferred embodiments of the methods disclosed herein is preferred. A manufactured article having a computer readable medium with computer readable instructions for performing the preferred embodiments of the methods disclosed herein is preferred. A process controller having access to a manufactured article having a processor readable medium with processor readable instructions for performing the preferred embodiments of the methods disclosed herein is preferred. At least three process controllers wherein the at least three process controllers are in operative communication with each other; and the at least three process controllers have access to a manufactured article having a processor readable medium with processor readable instructions for performing the methods of embodiments of the methods disclosed herein is preferred. At least three process controllers wherein the at least three process controllers are in operative communication with each other and the at least three process controllers have access to a manufactured article having a computer readable medium with computer readable instructions for performing the methods of embodiments of the methods disclosed herein is preferred. An apparatus for refining a workpiece having a process controller, the process controller having access to a manufactured article having a computer readable medium with computer readable instructions for performing the methods of embodiments of the methods disclosed herein is preferred. A process controller having access to a manufactured article having a computer readable medium with computer readable instructions for performing the methods of embodiments of the methods disclosed herein is preferred.

A computer-readable, program storage device encoded with instructions that, when executed by a processor, performs preferred embodiment of methods of planarizing and/or finishing disclosed herein is preferred. A computer-readable, program storage device encoded with instructions that, when executed by a computer performs preferred embodiment of methods of refining, planarizing, and/or finishing disclosed herein is more preferred. A computer programmed to perform the preferred methods of manufacturing disclosed herein is preferred. A processor and/or computer readable memory devices are generally known to those skilled in the semiconductor manufacturing arts. Non-limiting illustrative examples include compact disks, hard disks, floppy disks, and other computer media generally useful in the computing arts.

Refining apparatus are generally illustrated with magnetic refining elements. Other general refining elements are known which can be generally adapted for preferred embodiments given the teachings and guidance contained herein. As non-limiting illustrative examples U.S. Pat. Nos. 6,159,080 to Talieh and 5,994,582 to Talieh can be generally be adapted to use with at least two independently controlled refining elements with independently controlled refining motions by those of ordinary skill in the semiconductor arts to give a new apparatus structure, new method of functioning, and new and useful results by using the teachings and guidance contained herein.

For electro-refining, some embodiments are preferred to improve versatility. A magnetic refining element having a plurality of operative electrodes and a multiplicity of electrodes is more preferred. A magnetic refining element having an inoperative electro-refining surface proximate the operative electro-refining surface is also preferred. A method for refining including applying an operative voltage across the first operative electrode and the second operative electrode during at least a portion of the refining cycle time removes material from the semiconductor wafer surface is preferred. A method for refining including applying an operative voltage across the first operative electrode and the second operative electrode during at least a portion of the refining cycle time adds material to the semiconductor wafer surface is preferred. A method for refining including controlling in situ a refining control parameter comprising at least in part controlling the current between each of the first operative electrodes and the second electrode is preferred and controlling the current between a plurality of first operative electrodes and the second electrode is more preferred. An apparatus and method for refining a semiconductor wafer surface including an operative refining motion which adds material with a current density of from 0.1 to 100 milliamperes per square centimeter between the first and second electrodes is preferred. An apparatus and method for refining for refining the semiconductor wafer surface including an electro-refining motion which removes material with a current density of from 0.1 to 100 milliamperes per square centimeter between the first and second electrodes is preferred. An apparatus and method for refining the semiconductor wafer surface including an operative refining motion with a pressure in at least a portion of the interface between the semiconductor wafer surface and the magnetically responsive electro-refining element of from 0.1 to 10 psi is also preferred. A plurality of refining elements can be preferred. These preferred embodiments can facilitate refining and finishing by improving control and reducing unwanted defects in refining.

SUMMARY

As is generally known in the semiconductor wafer art, development of actual preferred embodiments is generally accomplished in stages along with numerous process and design specific information. Given the teachings and guidance contained herein, preferred embodiments are generally implemented in stages while taking into account numerous business, process, and product specific information by those generally skilled in the semiconductor wafer arts. Although the implementation of a preferred embodiment may have generally numerous steps while taking into account the numerous business, process, and product specific information, implementation merely requires routine experimentation and effort given the teachings and guidance contained herein. Thus although the implementation may be somewhat time-consuming, it is nevertheless a generally routine undertaking for those of ordinary skill in the art having the benefit of the information and guidance contained herein. Further, it will be readily apparent to those skilled in the general semiconductor wafer art that preferred elements can generally be combined with each other to form other preferred embodiments using the confidential teachings and disclosures herein. In some discussion herein, generally known information, processes, procedures, and apparatus have not been belabored so as not to obscure preferred embodiments of the present invention.

Illustrative nonlimiting examples useful technology have referenced by their patents numbers and all of these patents are included herein by reference in their entirety for further general guidance and modification by those skilled in the arts.

Applicant currently prefers a magnetic responsive refining element having a unitary resilient body having a Shore Hardness A of about 60 with discrete finishing surfaces attached thereto and where the discrete finishing surfaces have a surface area of about 2 to 6 die. A magnetically responsive material composite comprising ferromagnetic material covered with a noncorroding protective cover is a preferred option. A magnetic refining apparatus having multiple magnetically responsive refining elements in parallel operative refining motion simultaneously is preferred. A control subsystem having multiple operative sensors for improving in situ control is also preferred. A currently preferred non-corroding cover is an epoxy coating. Illustrative preferred organic polymers and polymer systems are described herein above such as under the unitary resilient body and in the discrete finishing member sections. Similar polymers can be used to form ferromagnetic composite with incorporated ferromagnetic particles incorporated therein. A magnetically responsive refining element having a tracking code is preferred. A magnetically responsive refining element having an identification code is preferred.

Preferred methods of control have been disclosed using a preferred control subsystem. A processor having access to a process model is preferred. A processor having access to a cost of manufacture model is preferred. A processor having access to a activity based cost of manufacture model is also preferred. A process model having access to historical performance is preferred. A processor having access to a memory device(s) is preferred. Determining a change during process control parameter during a non-equilibrium process time period can be preferred for some applications. Determining a change during process control parameter during a non-equilibrium process time period and changing the process control parameter during non-equilibrium process time period can be more preferred for some applications. Determining a change during process control parameter during a non-equilibrium process time period and changing the process control parameter a multiplicity of times during non-equilibrium process during the non-equilibrium time period can be even more preferred for some applications. Determining a change during process control parameter that is in a non-steady state time period can be preferred for some applications. Determining a change for a process control parameter using progress of refining information in real time and changing the process control parameter during the non-steady state time period can be more preferred for some applications. Determining a multiplicity of changes for a process control parameter using progress of refining information in real time and changing the process control parameter a multiplicity of times during the non-steady state time period can be more preferred for some applications. The new magnetic finishing apparatus operates in a new and useful manner to produce a new and useful result.

For refining of semiconductor wafers having low-k dielectric layers, refining aids, more preferably reactive refining aids, are preferred. A refining composition comprising at least in part a gaseous reactive refining aid can be preferred for low-k dielectric layers comprising at in part a hydrocarbon material. For finishing of semiconductor wafers having low-k dielectric layers, finishing aids, more preferably lubricating aids, are preferred. Illustrative nonlimiting examples of low-k dielectrics are low-k polymeric materials, low-k porous materials, and low-k foam materials. A high flexural modulus organic synthetic resin comprising an engineering polymer is preferred for some refining applications. A magnetic refining element having a refining layer with a refining surface for refining a semiconductor wafer and a magnetic composite member wherein the magnetic composite member is attached to the refining surface layer and the magnetic composite member is protected with a polymeric corrosion protecting layer is a preferred refining element for some applications. A magnetic finishing element having a finishing layer with a finishing surface for finishing a semiconductor wafer and a magnetic composite member wherein the magnetic composite member is attached to the finishing surface layer and the magnetic composite member is protected with a polymeric corrosion protecting layer is a preferred finishing element for some applications. The corrosion protecting covering on the magnetically responsive member can help prevent unwanted corrosion products and unwanted surface damage to particularly sensitive semiconductor wafer such as those having low-k dielectrics.

Embodiments are summarized herein as for example in the brief summary of the invention. As is generally known in manufacturing and/or semiconductor wafer art, development of actual preferred embodiments is generally accomplished in stages along with numerous process and design specific information. For example, dielectric layer composition, conductor layer composition, and feature sizes can change the precise optimum refining control parameters and/or refining method. Information on or derived from dielectric layers such as low-k layers can be useful for and related to manufacturing control of a workpiece. Information on, from, related to, or derived from dielectric layers such as low-k layers can be useful for and related to refining control of a workpiece. Information on, from, related to, or derived from cleaning can be useful for and related to refining control of a workpiece. Information on, from, related to, or derived from refining and refining control can be used to change a model. Information on, from, related to, or derived from refining and refining control can be used to change a process model. Information on, from, related to, or derived from refining and refining control can be used to change a cost model. Information on, from, related to, or derived from refining and refining control can be used to change a manufacturing control. Information on, from, related to, or derived from refining and refining control can be used to change a predictive control. Information on, from, related to, or derived from refining and refining control can be used to change a real time control. Information on, from, related to, or derived from refining and refining control can be used for data mining and to change a data mining result. Information on, from, related to, or derived from refining and refining control can be used for cost of manufacture and to change a forecast cost of manufacture. Given the teachings and guidance contained herein, preferred embodiments are generally implemented in stages with various workpiece manufacturers while taking into account numerous business, process, and product specific information by those generally skilled in the semiconductor wafer arts. Although the implementation of a preferred embodiment may have generally numerous steps while taking into account the numerous business, process, and product specific information, implementation merely requires routine experimentation and effort given the teachings and guidance contained herein. Thus although the implementation may be somewhat time-consuming, it is nevertheless a generally routine undertaking for those of ordinary skill in the art having the benefit of the information and guidance contained herein. In some discussion herein, generally known information, processes, procedures, and apparatus have not been belabored so as not to obscure preferred embodiments of the present invention.

Artisans generally understand when manufacturing operations are related. As an illustrative example, when a manufacturing operation "A" (including information therefrom) can influence a manufacturing operation "B", then manufacturing operation "A" is related to and/or related in part to manufacturing operation "B". As an illustrative example, when a manufacturing operation "A" (including information therefrom) can affect a manufacturing operation "B", then manufacturing operation "A" is related to and/or related at least in part to manufacturing operation "B". As an illustrative example, when a manufacturing operation "A" (including information therefrom) can be used and influence a process model for a manufacturing operation "B", then manufacturing operation "A" is related to and/or related at least in part to manufacturing operation "B". As an illustrative example, when a manufacturing operation "A" (including information therefrom) is used for feedforward and/feedback control for a manufacturing operation "B", then manufacturing operation "A" is related to and/or related at least in part to manufacturing operation "B". Operation "A" and operation "B" can be carried out in any order such as operation "A" first, operation "B" first, or the operations performed simultaneously and/or at least in part simultaneously. Using the teachings and guidance herein artisans in the art can readily understand related manufacturing operations and/or manufacturing information useful in the instant methods and apparatus.

Some portions of the invention are presented in terms of electronic operations, procedures, steps, logic blocks, processor processing, controlling, determining and other symbolic representations of operations on information and/or data bits that can be performed on processor readable and/or computer readable memory. These descriptions and representations are the means used by those skilled in the data processing arts and/or process control arts to which effectively convey the substance of their work to others skilled in the art. A procedure, computer executed step, logic block, process, etc., is here, and generally, conceived to be a self-consistent sequence of steps or instructions or firmware leading to a targeted result. The operations and/or steps are those requiring physical manipulations of physical quantities. Usually, though not necessarily, these quantities take the form of electrical or magnetic signals capable of being stored, transferred, combined, compared, and otherwise manipulated in a processor and/or computer system. Generally information can be referred to as bits, values, elements, symbols, characters, terms, numbers, or the like.

It is generally recognized within the context in which they are used that all of these and similar terms can be associated with the appropriate physical quantities and are merely convenient labels applied to these quantities. Discussions utilizing terms in association such as "accessing" or "computing" or "calculating" or "determining" or "selecting" or "storing" or "selecting" or "moving" or "changing" or "determining" or "optimizing" or "evaluating" or "estimating" or "measuring" or "recording" or "associating" or the like, generally refer to the action and processes of a processor, controller, or computer system, or similar electronic processing or computing device, that manipulates, changes, and/or transforms data represented as physical (electronic) quantities within the processor, memory, and/or a computer system's registers and memories into other data similarly represented as physical quantities within the computer system memories or registers or other such information storage, transmission or display devices when discussing electronic processing.

Illustrative nonlimiting examples useful technology have been referenced by their patents numbers and all of these patents are included herein by reference in their entirety for further general guidance and modification by those skilled in the arts. The scope of the invention should be determined by the appended claims and their legal equivalents, rather than by the preferred embodiments and details as discussed herein.

I claim:

1. A method of refining a first and a second layer of a workpiece, each having an effect on a cost of manufacture of the workpiece, the method comprising:

applying a first refining energy to the first layer of the workpiece for a first layer refining;

sensing an in situ process information for the first layer of the workpiece with an at least one operative sensor for the first layer refining;

determining a change for an at least one first layer control parameter "A" using an at least one tracked information related to the workpiece and the in situ process information for the first layer of the workpiece with an at least one processor for the first layer refining;

controlling the at least one first layer process control parameter "A" to change a first workpiece surface with an at least one operative controller for the first layer refining;

storing for future availability a stored information related to the at least one first layer process control parameter "A", the at least one tracked information related to the workpiece, and the in situ process information for the first layer of the workpiece;

applying a second refining energy to the second layer of the workpiece having an at least one second layer control parameter "B" for a second layer refining;

sensing an in situ process information for the second layer of the workpiece with an at least one operative sensor for the second layer refining;

determining a change for the at least one second layer control parameter "B" using the at least one tracked information related to the workpiece, the in situ process information for the first layer of the workpiece, and the in situ process information for the second layer of the workpiece with an at least one processor for the second layer refining;

controlling the at least one second layer process control parameter "B" to change a second workpiece surface with an at least one operative controller for the second layer refining; and using at least in part an at least one process model during the method and wherein the method makes an appreciable change to the cost of manufacture of the workpiece.

2. The method according to claim 1 wherein at least one of applying a first refining energy and applying a second refining energy comprises applying at least one electrochemical energy for adding a material or applying at least one electrochemical energy for removing the material.

3. The method according to claim 2 wherein using an at least one process model comprises using at least in part an at least one process model for a feedforward and a feedback control during the method.

4. The method according to claim 1 wherein at least one of applying a first refining energy or applying a second refining energy comprises applying an at least one electrochemical energy for removing a material and wherein using an at least one process model comprises using at least in part a first principles process model for an at least one process control during the method.

5. The method according to claim 1 wherein using an at least one process model comprises using at least in part a first principles process model and at least in part an empirically based process model for an at least one process control during the method.

6. The method according to claim 1 wherein an at least one of applying a first refining energy or applying a second refining energy comprises applying at least two different independent refining energies.

7. A method of refining a first and a second layer of a workpiece, each having an effect on a cost of manufacture of the workpiece, the method comprising:

applying a first refining energy to the first layer of the workpiece for a first layer refining;

sensing an in situ process information for the first layer of the workpiece with an at least one operative sensor for the first layer refining;

determining a change for an at least one first layer control parameter "A" using an at least one tracked information related to the workpiece, an at least one tracked quality information related to the first layer refining, and the in situ process information for the first layer of the workpiece with an at least one processor for the first layer refining;

controlling the at least one first layer process control parameter "A" to change a first workpiece surface during the first layer refining of the first layer of the workpiece with an at least one operative controller for the first layer refining;

storing for future availability a stored information related to the at least one first layer process control parameter "A", the at least one tracked information related to the workpiece, the at least one tracked quality information related to the first layer refining, and the in situ process information for the first layer of the workpiece;

applying a second refining energy to the second layer of the workpiece having an at least one second layer control parameter "B" for a second layer refining;

sensing an in situ process information for the second layer of the workpiece with an at least one operative sensor for the second layer refining;

determining a change for the at least one second layer control parameter "B" using the at least one tracked information related to the workpiece, the in situ process information for the first layer of the workpiece, the at least one tracked quality information related to the first layer refining, an at least one tracked quality information related to the second layer refining, and the in situ process information for the second layer of the workpiece with an at least one processor for the second layer refining;

controlling the at least one second layer process control parameter "B" to change a second workpiece surface during the second layer refining of the second layer of the workpiece with an at least one operative controller for the second layer refining; and using at least in part an at least one process model during the method and wherein the method makes an appreciable change to the cost of manufacture of the workpiece.

8. The method according to claim 7 wherein at least one of applying a first refining energy and applying a second refining energy comprises applying at least one electrochemical energy for adding a material or applying at least one electrochemical energy for removing the material; and additionally comprising:

using a refining element having a refining element identification code during the method.

9. The method according to claim 7 wherein using an at least one process model comprises using at least in part an at least one process model for a feedforward and a feedback control during the method.

10. The method according to claim 7 wherein at least one of applying a first refining energy or applying a second refining energy comprises applying an at least one electrochemical energy for removing a material and wherein using an at least one process model comprises using at least in part a first principles process model for an at least one process control during the method.

11. The method according to claim 7 wherein using an at least one process model comprises using at least in part a first principles process model and at least in part an empirically based process model for an at least one process control during the method.

12. The method according to claim 7 wherein an at least one of applying a first refining energy or applying a second refining energy comprises applying at least two different independent refining energies.

13. A method of refining a first and a second layer of a workpiece, each having an effect on a cost of manufacture of the workpiece, the method comprising:

applying a first refining energy to the first layer of the workpiece for a first layer refining;

sensing an in situ process information for the first layer of the workpiece with an at least one operative sensor for the first layer refining;

determining a change for an at least one first layer control parameter "A" using an at least one tracked information related to the workpiece, an at least one tracked refining rate information related to the first layer refining, and the in situ process information for the first layer of the workpiece with an at least one processor for the first layer refining;

controlling the at least one first layer process control parameter "A" to change a first workpiece surface during the first layer refining of the first layer of the workpiece with an at least one operative controller for the first layer refining;

storing for future availability a stored information related to the at least one first layer process control parameter "A", the at least one tracked information related to the workpiece, the at least one tracked refining rate information related to the first layer refining, and the in situ process information for the first layer of the workpiece;

applying a second refining energy to the second layer of the workpiece having an at least one second layer control parameter "B" for a second layer refining;

sensing an in situ process information for the second layer of the workpiece with an at least one operative sensor for the second layer refining;

determining a change for the at least one second layer control parameter "B" using the at least one tracked information related to the workpiece, the in situ process information for the first layer of the workpiece, the at least one tracked refining rate information related to the first layer refining, an at least one tracked refining rate information related to the second layer refining, and the in situ process information for the second layer of the workpiece with an at least one processor for the second layer refining;

controlling the at least one second layer process control parameter "B" to change a second workpiece surface during the second layer refining of the second layer of the workpiece with an at least one operative controller for the second layer refining; and using at least in part an at least one process model during the method and wherein the method makes an appreciable change to the cost of manufacture of the workpiece.

14. The method according to claim 13 wherein at least one of applying a first refining energy and applying a second refining energy comprises applying at least one electrochemical energy for adding a material or applying at least one electrochemical energy for removing the material; and additionally comprising:

using a refining element having a refining element identification code during the method.

15. The method according to claim 13 wherein using an at least one process model comprises using at least in part an at least one process model for a feedforward and a feedback control during the method.

16. The method according to claim 13 wherein at least one of applying a first refining energy or applying a second refining energy comprises applying an at least one electrochemical energy for removing a material and wherein using an at least one process model comprises using at least in part a first principles process model for an at least one process control during the method.

17. The method according to claim 13 wherein using an at least one process model comprises using at least in part a first principles process model and at least in part an empirically based process model for an at least one process control during the method.

18. The method according to claim 13 wherein an at least one of applying a first refining energy or applying a second refining energy comprises applying at least two different independent refining energies.

19. A method of refining a first and a second layer of a workpiece, each having an effect on a cost of manufacture of the workpiece, the method comprising:

applying a first refining process to the first layer of the workpiece for a first layer refining;

sensing an in situ process information for the first layer of the workpiece with an at least one operative sensor for the first layer refining;

determining a change for an at least one first layer control parameter "A" using an at least one tracked information related to the workpiece, an at least one tracked refining rate information related to the first layer refining, an at least one tracked quality information related to the first layer refining, and the in situ process information for the first layer of the workpiece with an at least one processor for the first layer refining;

controlling the at least one first layer process control parameter "A" to change a first workpiece surface during the first layer refining of the first layer of the workpiece with an at least one operative controller for the first layer refining;

storing for future availability a stored information related to the at least one first layer process control parameter "A", the at least one tracked information related to the workpiece, the at least one tracked refining rate information related to the first layer refining, the at least one tracked quality information related to the first layer refining, and the in situ process information for the first layer of the workpiece;

applying a second refining process to the second layer of the workpiece having an at least one second layer control parameter "B" for a second layer refining;

sensing an in situ process information for the second layer of the workpiece with an at least one operative sensor for the second layer refining;

determining a change for the at least one second layer control parameter "B" using the at least one tracked information related to the workpiece, the in situ process information for the first layer of the workpiece, the at least one tracked refining rate information related to the first layer refining, the at least one tracked quality information related to the first layer refining, an at least one tracked refining rate information related to the second layer refining, an at least one tracked quality information related to the second layer refining, and the in situ process information for the second layer of the workpiece with an at least one processor for the second layer refining;

controlling the at least one second layer process control parameter "B" to change a second workpiece surface during the second layer refining of the second layer of the workpiece with an at least one operative controller for the second layer refining; and using at least in part an at least one process model during the method and wherein the method makes an appreciable change to the cost of manufacture of the workpiece.

20. The method according to claim 19 additionally comprising:

storing a tracked historical information related to individual workpieces;

evaluating the tracked historical information including process control parameters;

developing a new process control for a commercial manufacture; and using the new process control for the first layer refining or the second layer refining.

21. The method according to claim 19 wherein an at least one of applying a first refining process or applying a second refining process comprises applying at least two different independent refining energies.

22. The method according to claim 19 additionally comprising:

using a refining element having a refining element identification code during the method.

23. The method according to claim 19 wherein at least one of applying a first refining process or applying a second refining process comprises applying an at least one electrochemical energy for removing a material and wherein using an at least one process model comprises using at least in part a first principles process model for an at least one process control during the method.

24. The method according to claim 23 wherein the workpiece comprises a semiconductor wafer and wherein an at least one of applying a first refining process or applying a second refining process comprises applying at least two different independent refining energies; and additionally comprising:

using a refining element having a refining element identification code during the method.

25. The method according to claim 19 wherein the workpiece comprises a semiconductor wafer having a low-k layer having a k value of at most 3.0 and having a diameter of at least 300 millimeters; additionally comprising:

using a refining element having a refining element identification code during the method.

* * * * *